United States Patent
Ichikawa et al.

(10) Patent No.: US 12,389,758 B2
(45) Date of Patent: Aug. 12, 2025

(54) DISPLAY DEVICE, METHOD FOR MANUFACTURING DISPLAY DEVICE, AND ELECTRONIC APPARATUS WITH INTERLAYER INSULATION FILM

(71) Applicant: Sony Semiconductor Solutions Corporation, Kanagawa (JP)

(72) Inventors: Tomoyoshi Ichikawa, Kanagawa (JP); Kenichi Aoyagi, Kanagawa (JP); Takashi Sakairi, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 447 days.

(21) Appl. No.: 17/052,994

(22) PCT Filed: Apr. 23, 2019

(86) PCT No.: PCT/JP2019/017184
§ 371 (c)(1),
(2) Date: Nov. 4, 2020

(87) PCT Pub. No.: WO2019/216198
PCT Pub. Date: Nov. 14, 2019

(65) Prior Publication Data
US 2021/0111235 A1 Apr. 15, 2021

(30) Foreign Application Priority Data
May 11, 2018 (JP) .................. 2018-091993

(51) Int. Cl.
*H10K 59/124* (2023.01)
*H10K 50/13* (2023.01)
(Continued)

(52) U.S. Cl.
CPC ......... *H10K 59/124* (2023.02); *H10K 50/852* (2023.02); *H10K 59/30* (2023.02);
(Continued)

(58) Field of Classification Search
CPC .. H10K 59/124; H10K 59/30; H10K 59/1201; H10K 59/38; H10K 71/00;
(Continued)

(56) References Cited

U.S. PATENT DOCUMENTS

| | | | |
|---|---|---|---|
| 2005/0082532 A1* | 4/2005 | Murakami | H10K 59/124 438/151 |
| 2006/0286889 A1* | 12/2006 | Nishi | H10K 50/814 445/24 |

(Continued)

FOREIGN PATENT DOCUMENTS

| | | |
|---|---|---|
| CN | 101013745 A | 8/2007 |
| CN | 103227272 A | 7/2013 |

(Continued)

OTHER PUBLICATIONS

International Search Report, International Application No. PCT/JP2019/017184, dated Jul. 5, 2019.

*Primary Examiner* — Eric W Jones
(74) *Attorney, Agent, or Firm* — Michael Best & Friedrich LLP

(57) ABSTRACT

Provided is a display device in which more than one pixel is arranged in a two-dimensional matrix on a circuit board, the pixel including a light emission unit including a first electrode, an organic layer, and a second electrode that are stacked, in which the first electrode is disposed for each light emission unit, and a partition is formed between the first electrode and an adjacent first electrode, the organic layer and the second electrode are stacked on an entire surface including the first electrode and the partition, the first electrode is formed on an interlayer insulation film, and a reflection film is formed below the first electrode, the reflection film including a light reflecting surface disposed to be flush with a boundary plane on which different insulation (Continued)

materials are in contact with each other in the interlayer insulation film.

18 Claims, 38 Drawing Sheets

(51) Int. Cl.
  *H10K 50/852* (2023.01)
  *H10K 59/12* (2023.01)
  *H10K 59/30* (2023.01)
  *H10K 59/38* (2023.01)
  *H10K 59/80* (2023.01)
  *H10K 71/00* (2023.01)
  *H10K 102/00* (2023.01)

(52) U.S. Cl.
  CPC ..... *H10K 59/80518* (2023.02); *H10K 59/878* (2023.02); *H10K 71/00* (2023.02); *H10K 50/131* (2023.02); *H10K 59/1201* (2023.02); *H10K 59/38* (2023.02); *H10K 59/876* (2023.02); *H10K 2102/351* (2023.02)

(58) Field of Classification Search
  CPC ............. H10K 50/852; H10K 50/131; H10K 2102/351; H10K 59/878; H10K 59/80518; H10K 59/876
  USPC ...................................................... 257/40, 59
  See application file for complete search history.

(56) References Cited

U.S. PATENT DOCUMENTS

| | | | | |
|---|---|---|---|---|
| 2011/0042696 A1* | 2/2011 | Smith | ............... | H10K 50/826 257/88 |
| 2011/0317429 A1* | 12/2011 | Aiba | ............... | H10K 50/852 427/508 |
| 2012/0018749 A1* | 1/2012 | Lee | ............... | H10K 50/852 257/89 |
| 2013/0193416 A1* | 8/2013 | Shin | ............... | H10K 50/858 257/40 |
| 2014/0167604 A1* | 6/2014 | Iwata | ............... | H10K 59/38 313/504 |
| 2014/0231790 A1* | 8/2014 | Fujino | ............... | H10K 50/865 257/89 |
| 2014/0285542 A1* | 9/2014 | Izumi | ............... | G09G 3/3233 345/694 |
| 2015/0187858 A1* | 7/2015 | Wang | ............... | H10K 59/352 257/40 |
| 2015/0228930 A1 | 8/2015 | Murata | | |
| 2016/0064421 A1* | 3/2016 | Oh | ............... | H01L 27/1218 257/43 |
| 2016/0133681 A1* | 5/2016 | Nam | ............... | H10K 59/1216 257/40 |
| 2016/0266436 A1* | 9/2016 | Jiao | ............... | H10K 59/38 |
| 2017/0373280 A1* | 12/2017 | Lee | ............... | H10K 50/80 |
| 2018/0151628 A1* | 5/2018 | Park | ............... | H10K 50/818 |

FOREIGN PATENT DOCUMENTS

| | | |
|---|---|---|
| CN | 103928495 A | 7/2014 |
| CN | 105742512 A | 7/2016 |
| CN | 107852788 A | 3/2018 |
| JP | 2004-259607 A | 9/2004 |
| JP | 2006-278257 A | 10/2006 |
| JP | 2007004997 A | 1/2007 |
| JP | 2008-135373 A | 6/2008 |
| JP | 2015062194 A | 4/2015 |
| KR | 10-2009-0062194 A | 8/2009 |
| KR | 10-2009-0132356 A | 12/2009 |
| KR | 10-2016-0039105 A | 10/2016 |

* cited by examiner

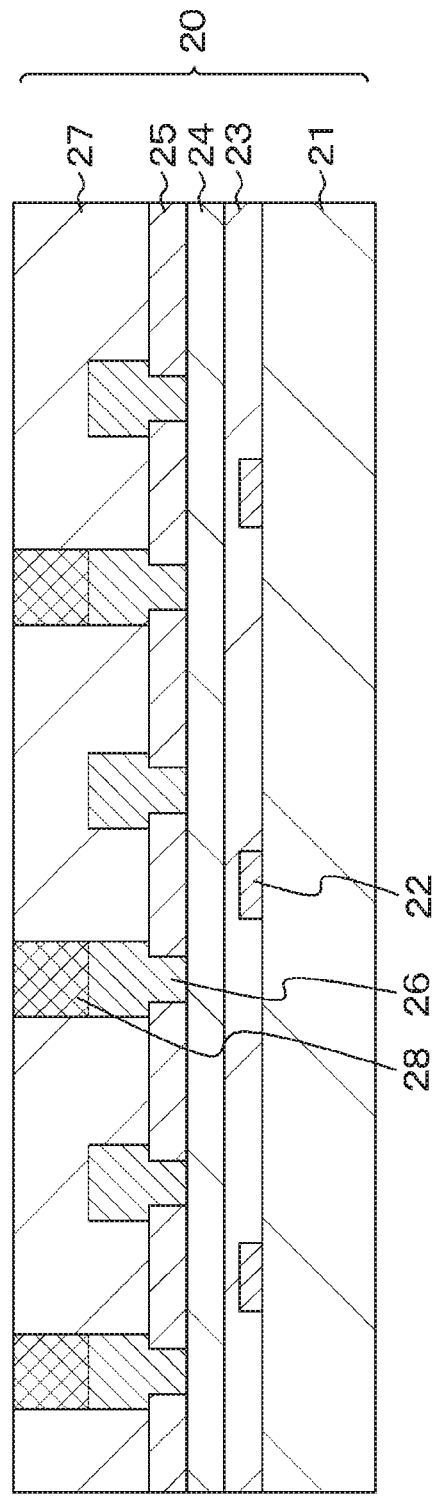
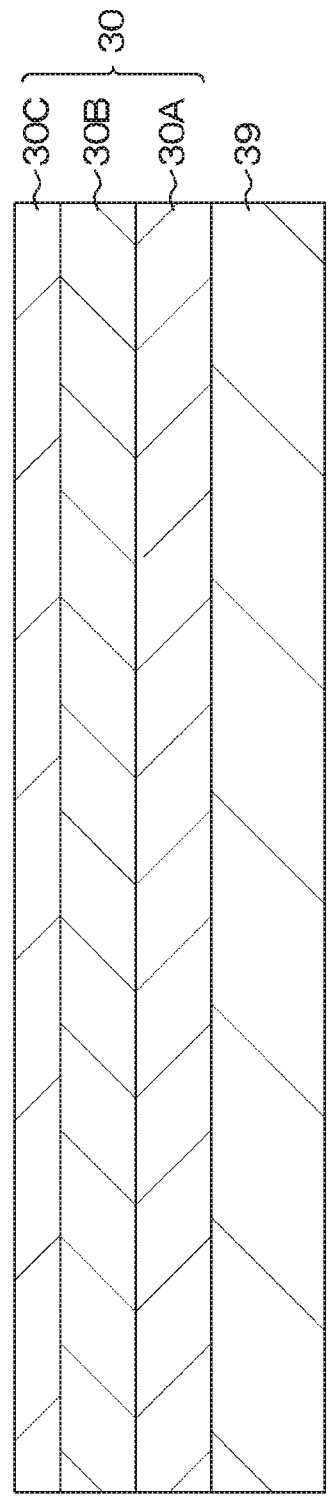
FIG. 3A
FIG. 3B

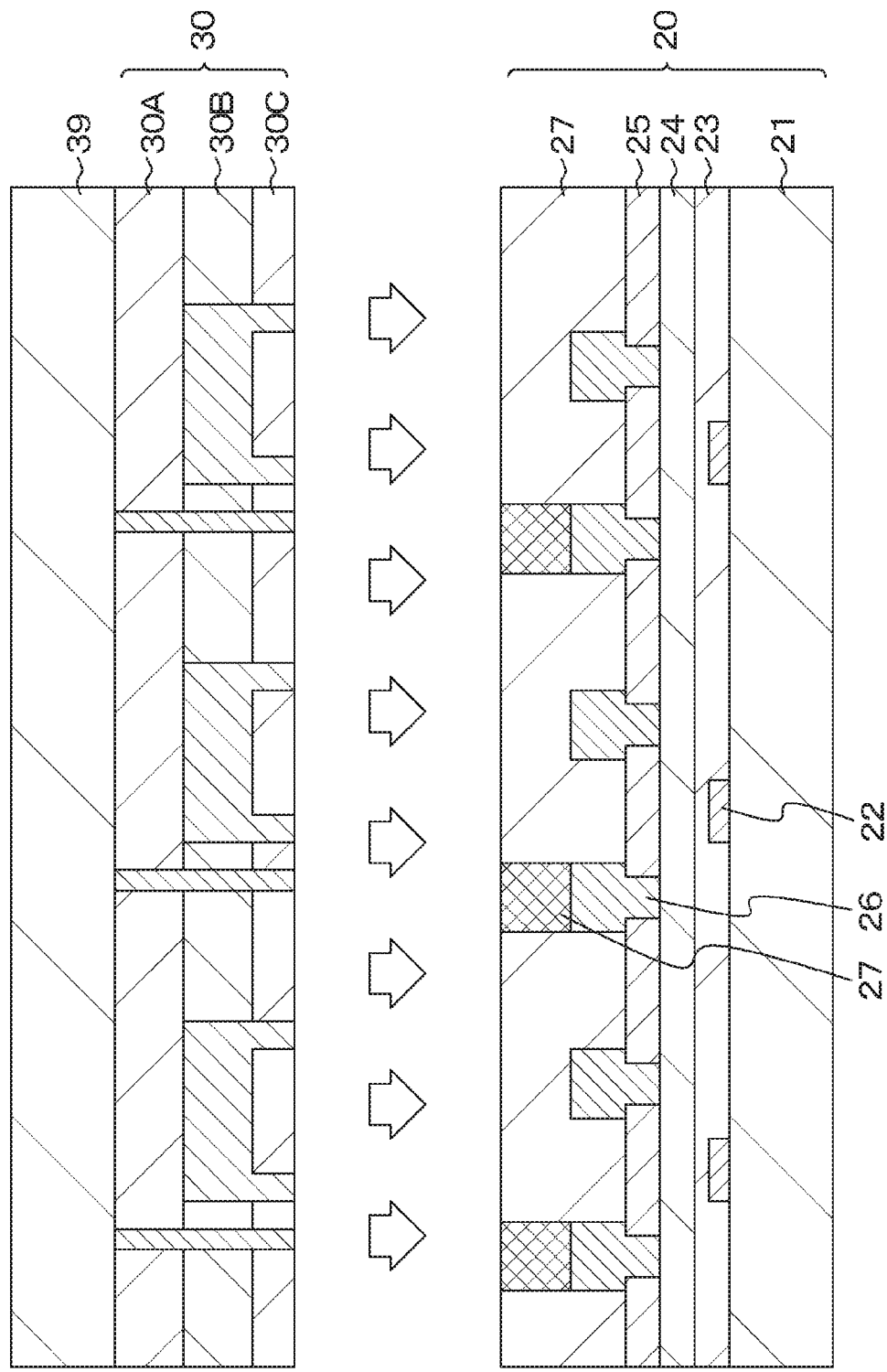

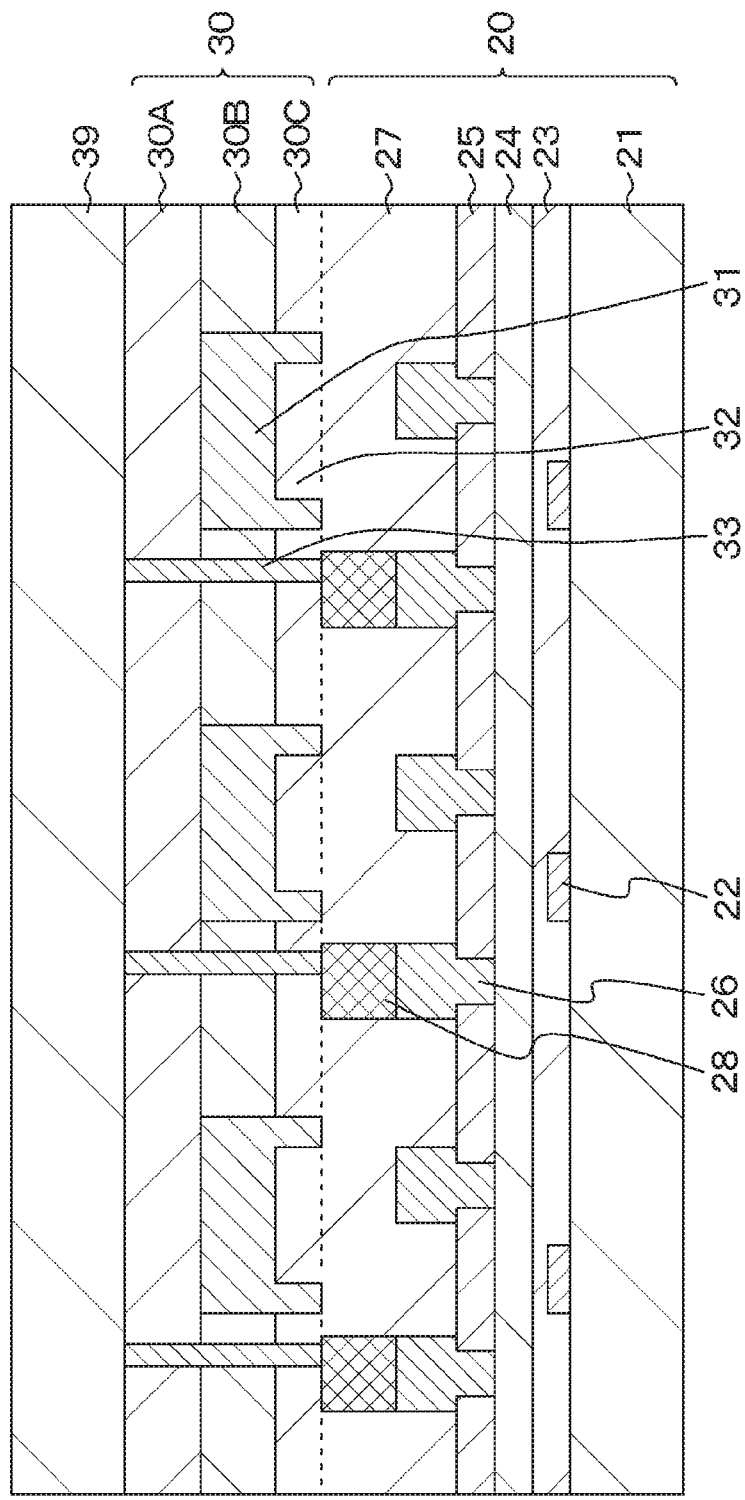

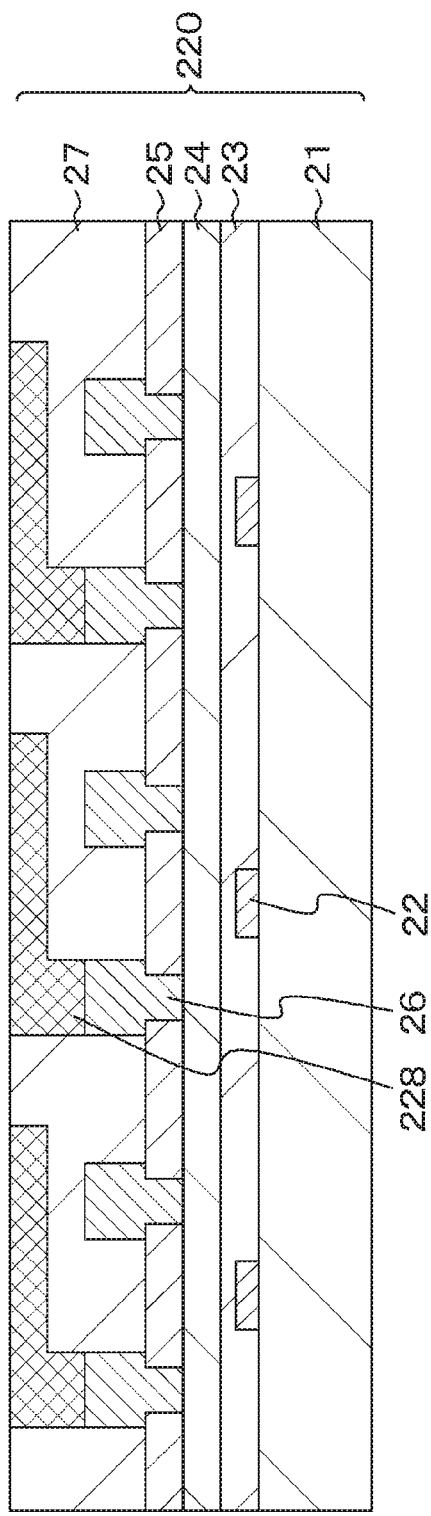 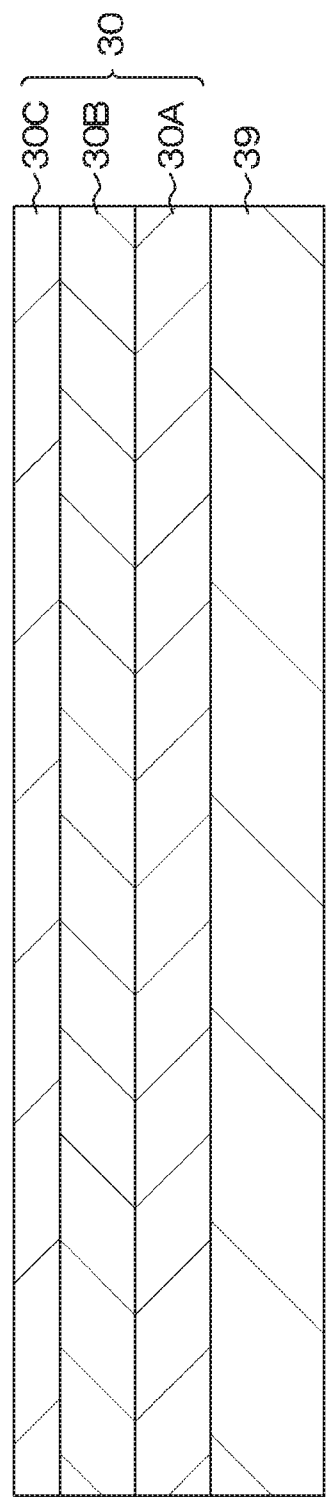

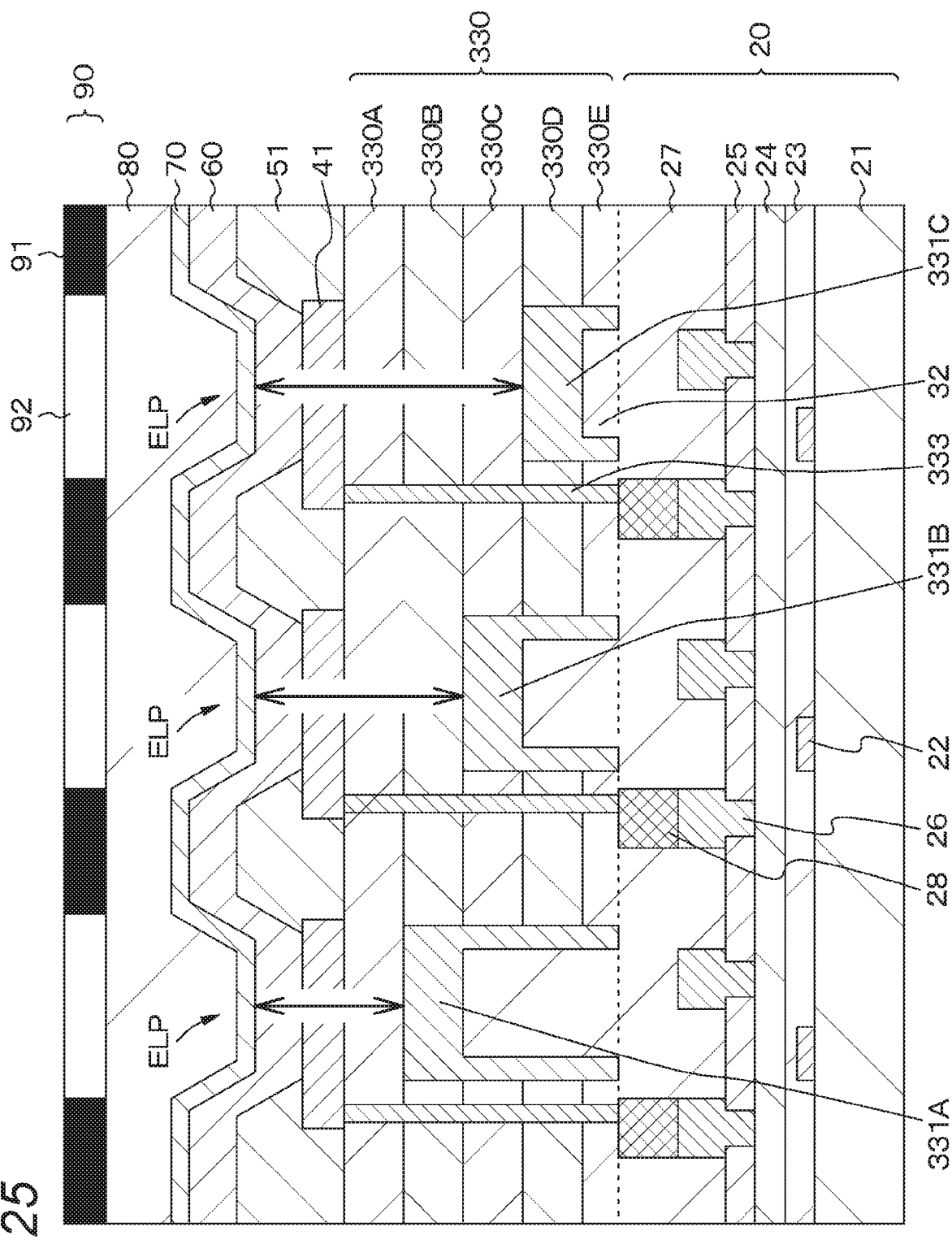

DISPLAY DEVICE, METHOD FOR MANUFACTURING DISPLAY DEVICE, AND ELECTRONIC APPARATUS WITH INTERLAYER INSULATION FILM

TECHNICAL FIELD

The present disclosure relates to a display device, a method for manufacturing a display device, and an electronic apparatus.

BACKGROUND ART

In recent years, an organic electroluminescence (EL) display device employing EL based on an organic material has been attracting attention as an alternative display device to liquid crystal display devices. In addition, organic EL display devices are being applied not only to direct-view displays such as monitors but also to micro-displays in which a pixel pitch as fine as several microns is required.

One method for achieving color display on an organic EL display device includes forming organic EL material layers, for each pixel, using a mask for light emission of a plurality of colors including, for example, red light emission, green light emission, and blue light emission. This method is often used for a direct-view organic EL display device. Furthermore, in addition to the aforementioned method, there is a method that includes forming an organic EL material layer for white light emission for all the pixels in common and disposing a color filter for each pixel. As the pixel pitch becomes finer, it is more difficult to form an organic EL material layer for each pixel using a mask, in terms of precision of alignment and the like. Therefore, for an organic EL display device having a pixel pitch as fine as several microns, a preferred method may be forming an organic EL material layer for white light emission for all the pixels in common, combined with using color filters.

However, the method involving combination of an organic EL material layer for white light emission with a color filter suffers from reduced luminous efficacy because the white light is color-separated by the color filter. For this reason, there is known a technology for achieving improvement in luminous efficacy and color reproducibility by employing a resonator structure for enhancing the light having a particular wavelength by a resonance effect (see Patent Document 1, for example).

CITATION LIST

Patent Document

Patent Document 1: Japanese Patent Application Laid-Open No. 2006-278257

SUMMARY OF THE INVENTION

Problems to be Solved by the Invention

In order to enhance the light having the target wavelength by the resonance effect, it is necessary to set the optical path length of the resonator structure with high precision. In addition, even in a case of taking light having a wide wavelength range, variations in color or the like will occur due to variations in a positional relationship between the organic layer and the reflection film. Therefore, there has been a need for a display device having a structure in which the positional relationship between the organic layer and the reflection film can be set with high precision and for a method for manufacturing such a display device.

Therefore, an object of the present disclosure is to provide a display device having a structure in which the positional relationship between the organic layer and the reflection film can be set with high precision, an electronic apparatus equipped with the display device, and a method for manufacturing the display device.

Solutions to Problems

For achieving the above-described object, a dis device according to the present disclosure is
a display device in which more than one pixel is arranged in a two-dimensional matrix on a circuit board, the pixel including a light emission unit including a first electrode, an organic layer, and a second electrode that are stacked, in which
the first electrode is disposed for each light emission unit, and a partition is formed between the first electrode and an adjacent first electrode,
the organic layer and the second electrode are stacked on an entire surface including the first electrode and the partition,
the first electrode is formed on an interlayer insulation film, and
a reflection film is formed below the first electrode, the reflection film including a light reflecting surface disposed to be flush with a boundary plane on which different insulation materials are in contact with each other in the interlayer insulation film.

For achieving the above-described object, a method for manufacturing a display device according to the present disclosure is
a method for manufacturing the display device in which more than one pixel is arranged in a two-dimensional matrix on a circuit board, the pixel including a light emission unit including a first electrode, an organic layer, and a second electrode that are stacked, the method including steps of:
forming, on a substrate, an interlayer insulation film in which layers of different types of insulation materials are stacked to be in contact with each other;
forming an opening in a region of the interlayer insulation film, the region corresponding to the first electrode, in such a way that a plane flush with a boundary plane on which different insulation materials are in contact with each other in the interlayer insulation film is exposed to a bottom;
embedding a reflection film in the opening;
joining a surface of the embedded reflection film with the circuit board, and then removing the substrate; and
forming, on the interlayer insulation film, a light emission unit including the first electrode, the organic layer, and the second electrode that are stacked.

For achieving the above-described object, an electronic apparatus according to the present disclosure is
an electronic apparatus including a display device in which more than one pixel is arranged in a two-dimensional matrix on a circuit board, the pixel including a light emission unit including a first electrode, as organic layer, and a second electrode that are stacked, in which
in the display device,
the first electrode is disposed for each light emission unit, and a partition is formed between the first electrode and an adjacent first electrode, the organic layer and the second electrode are stacked on an entire surface including the first electrode and the partition, the first electrode is formed on an interlayer insulation film, and a reflection film is formed below the first electrode, the reflection film including a light reflecting surface disposed to be flush with a boundary plane on which different insulation materials are in contact with each other in the interlayer insulation film.

BRIEF DESCRIPTION OF DRAWINGS

FIGS. 3A and 3B are schematic partial end views for explaining a method for manufacturing the display device according to the first embodiment.

FIG. 5 is a schematic partial end view for explaining the method for manufacturing the display device according to the first embodiment, as continued from FIG. 4B.

FIG. 6 is a schematic partial end view for explaining the method for manufacturing the display device according to the first embodiment, as continued from FIG. 5.

FIGS. 14A and 14B are schematic partial end views for explaining a method for manufacturing the display device according to the second embodiment.

FIG. 16 is a schematic partial end view for explaining the method for manufacturing the display device according to the second embodiment, as continued from. FIG. 15B.

FIG. 25 is a schematic partial cross-sectional view of a display device according to a third embodiment.

FIG. 36 is an external view of a lens-interchangeable single-lens reflex type digital still camera; FIG. 36A shows a front view thereof and FIG. 34B shows a rear view thereof.

MODE FOR CARRYING OUT THE INVENTION

Figure 1:
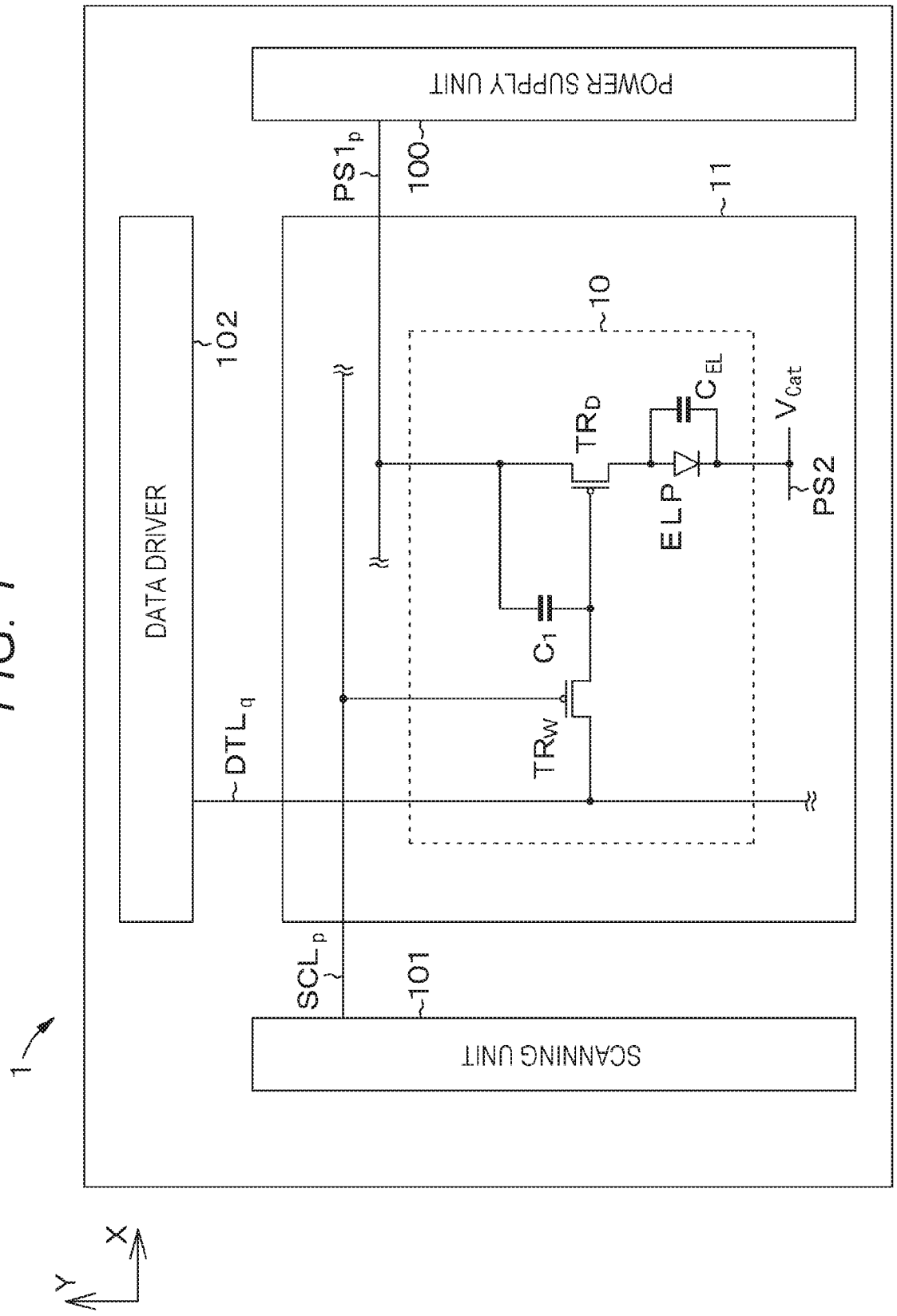
FIG. 1 is a schematic plan view of a display device according to a first embodiment of the present disclosure.

With reference to the drawings, the present disclosure will now be described on the basis of embodiments. The present disclosure is not limited to the embodiments, and various numerical values and materials in the embodiments are examples. In the following description, the same elements or elements having the same functions will be denoted by the same reference symbols, and redundant descriptions will be omitted. Note that descriptions will be provided in the order mentioned below.
1. General description of a display device, a method for manufacturing a display device, and an electronic apparatus of the present disclosure
2. First embodiment
3. Second embodiment
4. Third embodiment
5. Description of electronic apparatus and others General Description Of A Display Device, a Method for Manufacturing a Display Device, and an Electronic Apparatus of the Present Disclosure A display device according to the present disclosure, a display device used for an electronic apparatus according to the present disclosure, and a display device obtained by a method for manufacturing the display device according to the present disclosure (hereinafter may be simply referred to as a "display device of the present disclosure") may have a configuration in which an interlayer insulation film includes different types of two or more insulation materials stacked to be in contact with each other.

In this case, the interlayer insulation film may include inorganic insulation materials such as silicon oxide ($SiO_x$), silicon nitride ($SiN_x$), or silicon oxynitride ($SiO_xN_y$), for example. The interlayer insulation film may be formed to include at least two types of layers selected from a layer of silicon oxide, a layer of silicon nitride, and a layer of silicon oxynitride. Moreover, the interlayer insulation film may be formed with two types of layers stacked alternately.

In the display device of the present disclosure including various preferred configurations described above, the number of layers in the interlayer insulation film located between a reflection film and a first electrode may differ depending on the display color of the pixel.

In the display device of the present disclosure including various preferred configurations described above, the film thickness of the interlayer insulation film located between the reflection film and the first electrode may be set to an optical distance that differs depending on the display color of the pixel. Moreover, the optical distance I may be needed to satisfy the following condition:

$$2L/\lambda + \Phi/2\pi = m \text{ (m is an integer)}$$

where the symbol $\Phi$ represents the phase shift of reflected light generated in the first electrode and the reflection film, the symbol L represents the optical distance between the first electrode and the reflection film, and the symbol $\lambda$ represents the peak wavelength of a spectrum of light taken from a pixel.

In the display device of the present disclosure including preferred configurations described above, the reflection film may be embedded in an opening provided in the interlayer insulation film. This configuration has an advantage that the light reflecting surface is not exposed to the outside, thus creating no decrease in reflectance attributed to oxidation of a material included in the reflection film. The opening can be formed by, for example, performing an etching process such that a boundary plane where different insulation materials are in contact with each other in the interlayer insulation film serves as a stopper. Specifically, the process is only needed to be performer. by selecting an appropriate combination of a material included in the interlayer insulation film with an etchant so that a certain insulation material acts as a stopper.

In the display device of the present disclosure including preferred configurations described above, the reflection film may include a metal material such as silver (Ag), a silver alloy, aluminum (Al), an aluminum alloy, platinum (Pt), gold (Au), chromium (Cr), tungsten (W), and the like. In this case, from the viewpoint of obtaining a high reflectance, the reflection film preferably includes silver or a silver alloy. Assuming that the decrease in reflectance attributed to oxidation is sufficiently suppressed, the reflection film including silver exhibits a reflectance of approximately 90 percent or more in a visible light region. The thickness of the reflection film is preferably set to a range of 100 to 300 nanometers.

In an alternative configuration, the reflection film may have an upper layer portion and a lower layer portion, the upper layer portion including silver or a silver alloy, and the lower layer portion including copper or a copper alloy. In a case where an electrode or the like is formed in a portion of a circuit board facing the reflection film, the electrode often includes copper or a copper alloy. In this case, using copper or a copper alloy to form the lower layer portion of the reflection film can improve the bondability between the circuit board side and the reflection film side.

In the display device of the present disclosure including preferred configurations described above, the circuit board may include a drive circuit for driving a pixel, and the first electrode and the drive circuit may be electrically connected. The first electrode and the drive circuit may be directly connected through a conductive portion including, for example, a via or the like provided in the interlayer insulation film. Alternatively, the first electrode and the drive circuit may be electrically connected through the reflection film.

In the display device of the present disclosure, the light emission unit may be of a so-called top emission type. The light emission unit is formed by sandwiching an organic layer, which includes a hole transport layer, a light emission layer, an electron transport layer, and the like, between the first electrode and the second electrode. In a case where the cathode is shared, the second electrode is the cathode electrode and the first electrode is the anode electrode.

The display device of the present disclosure including preferred configurations described above may be configured to provide color display. In the case of color display, a color filter can be formed by using, for example, a resin material containing a pigment or a dye. Note that the display device may be configured to provide so-called monochrome display in some cases.

In the case of a color display configuration, a single pixel may include a plurality of sub-pixels, Specifically, a single pixel may include three sub-pixels: a red display sub-pixel, a green display sub-pixel, and a blue display sub-pixel. Moreover, a single pixel may include a set of sub-pixels in which one or more types of sub-pixels are added to these three types of sub-pixels (for example, a set in which a sub-pixel that emits white light for higher brightness is added, a set in which a sub-pixel that emits complementary color light for expanding a color reproduction range is added, a set in which a sub-pixel that emits yellow light for expanding a color reproduction range is added, or a set in which sub-pixels that emit yellow light and cyan light for expanding a color reproduction range are added).

Examples of pixel values of the display device may include, without limitation, some resolutions for image display such as VGA (640, 480), S-VGA (800, 600), XGA (1024, 768), APRC (1152, 900), S-XGA (1280, 1024), U-XGA (1600, 1200), HD-TV (1920, 1080), (D-XGA (2048, 1536), as well as (1920, 1035), (720, 480), (1280, 960), and the like.

A partition can be formed by using a material appropriately selected from known inorganic materials and organic materials, and can be formed by, for example, a combination of a well-known film forming method such as a physical vapor deposition method (PVD method) exemplified by a vacuum evaporation method and a sputtering method, various chemical vapor deposition methods (CVD methods), and the like with a well-known patterning method such as an etching method, a lift-off method, and the like.

In the display device according to the present disclosure, the configuration of the drive circuit or the like that controls light emission from the light emission unit is not particularly limited. The light emission unit may be formed on a certain plane over the circuit board and, for example, disposed via the interlayer insulation layer above the drive circuit that drives the light emission unit. The configuration of the transistor included in the drive circuit is not particularly limited. The transistor may be a p-channel type field effect transistor or an n-channel type field effect. transistor.

Examples of a material included in the circuit board may include a semiconductor material, a glass material, or a plastic material. In a case where the drive circuit includes a transistor formed on a semiconductor substrate, for example, a well region is only needed to be disposed on the semiconductor substrate including silicon and the transistor is only needed to be formed in the well. On the other hand, in a case where the drive circuit includes a thin film transistor or the like, the drive circuit can be formed by forming a semiconductor thin film on a substrate that includes a glass material or a plastic material. Various types of wiring may have a well-known configuration and structure.

The first electrode is disposed on the circuit board for each light emission unit. In a case where the cathode is shared, the first electrode functions as the anode electrode for the light emission unit. The first electrode may include, for example, a transparent conductive material such as indium zinc oxide, indium tin oxide, or the like. Alternatively, the first electrode may include a metal, an alloy, or the like to be formed to be thin enough to have light transmissibility.

The organic layer includes an organic light emission material and, as a common continuous film, is disposed on the first electrode and on the partition. The organic layer emits light when a voltage is applied between the first electrode and the second electrode. The organic layer may have a structure in which, for example, a hole injection layer, a hole transport layer, a light emission layer, an electron transport layer, and an electron injection layer are stacked in the order mentioned from the first electrode side. A hole transport material, a hole transport material, an electron transport material, and an organic light emission material included in the organic layer are not particularly limited and a well-known material can be used.

The organic layer may have a so-called tandem structure in which a plurality of light emission layers is connected via a charge generation layer or an intermediate electrode. For example, a light emission unit that emits white light can be formed by stacking light emission layers that emit red light, green light, and blue light, or by stacking light emission layers that emit yellow light and blue light.

The second electrode is disposed as a common continuous film on the organic layer. The second electrode preferably includes a material that has high light transmissibility and a low work function. For example, the second electrode can be formed by using a transparent conductive material such as indium tin oxide (IT), indium zinc oxide (IZO), zinc oxide, aluminum-doped zinc oxide, or gallium-doped zinc oxide. Alternatively, the second electrode may include magnesium (Mg), silver (Ag), an alloy thereof, or the like to be formed to be thin enough to have light transmissibility. The thickness of the second electrode is preferably set to a range of about 3 to 15 nanometers. Furthermore, the second electrode may include a multilayer film in some cases. For example, a first, layer may include calcium (Ca), barium (Ba), lithium (Li), cesium (Cs), indium (In), magnesium. (Mg), silver (Ag), or the like, while a second layer may include magnesium (Mg), silver (Ag), an alloy thereof, or the like.

A condition shown in each of a variety of formulas herein is satisfied not only in a case where the formula is mathematically precisely satisfied but also in a case where the formula is substantially satisfied. For a formula to be satisfied, various variations occurring in the design or manufacture of the display element, the display panel, or the like are permitted to be present. Furthermore, the drawings referred to in the following description are schematic drawings. For example, FIG. 2 described later shows a cross-sectional structure of the display device, but does not indicate ratios of width, height, thickness, and the like.

First Embodiment

The first embodiment relates to a display device, a method for manufacturing a display device, and an electronic apparatus according to a first aspect of the present disclosure.

FIG. 1 is a schematic plan view of a display device according to a first embodiment of the present disclosure. The display device 1 includes a display region 11 in which pixels 10 each including a light emission unit ELP and a drive circuit that drives the light emission unit ELP are arranged in a two-dimensional matrix while being connected to a scanning line SCL extending along the row direction (X direction in FIG. 1) and to a data line DTL extending along the column direction (Y direction in FIG. 1), and also includes a power supply unit 100 that supplies voltages to a power supply line PS1, a scanning unit 101 that supplies scanning signals to the scanning line SCL, and a data driver 102 that supplies signal voltages to the data line DTL. Note that FIG. 1 shows a single pixel 10 for convenience of illustration, or more specifically, FIG. 1 shows a connection relationship in the (q, p)-th pixel 10 as described later.

The display device 1 further includes a common power supply line PS2 that is connected to all the pixels 10 in common. A predetermined drive voltage is supplied from the power supply unit 100 to the power supply line PS1, while a common voltage (a ground potential, for example) is supplied to the common power supply line PS2.

Although not illustrated in FIG. 1, the display region 11 includes a total of Q×P pixels (display elements) 10, namely Q pixels along the row direction and P pixels along the column direction, arranged in a two-dimensional matrix. In the display region, the number of rows of the pixels 10 is P and the number of pixels 10 constituting each row is Q.

Furthermore, the number of the scanning lines SCL and the number of power supply lines PS1 are each P. The pixels 10 in the p-th row (where p=1, 2, . . . , P) are connected to the p-th scanning line $SCL_p$ and the p-th power supply line $PS1_p$ to constitute a single display element row. Note that FIG. 1 shows the scanning line $SCL_p$ and the power supply line $PS1_p$ only.

Furthermore, the number of the data lines DTL is Q. The pixels 10 in the q-th column (where q=1, 2, . . . , Q) are connected to the q-th data line $DTL_q$. Note that FIG. 1 shows the data line $DTL_q$ only.

The display device 1 is, for example, a color display device. A single pixel 10 constitutes a single sub-pixel. The display device 1 is line-sequentially scanned row by row in response to a scanning signal from the scanning unit 101. The pixel 10 located in the p-th row and the q-th column is hereinafter referred to as a (q, p)-th pixel 10 or the (q, p)-th pixel 10.

In the display device 1, Q pixels 10 arranged in the p-th row are simultaneously driven. In other words, in the Q pixels 10 arranged along the row direction, the timing of light emission/non-emission is controlled for each row to which the pixels belong. Assuming that the display frame rate of the display device 1 is denoted by FR (times/second), the scanning period (so-called. horizontal scanning period) per row when the display device 1 is line-sequentially scanned row by row is less than (1/FR)×(1/P) seconds.

The pixel 10 includes the light emission unit ELP and the drive circuit that drives the light emission unit ELP. The light emission unit ELP includes an organic electroluminescent light emission unit. The drive circuit includes a write transistor $TR_W$, a drive transistor $TR_D$ and a capacitance unit $C_1$. When a current flows through the light emission unit ELP via the drive transistor $TR_D$, the light emission unit ELP emits light. Each transistor includes a p-channel type field effect transistor.

In the pixel 10, one source/drain region of the drive transistor $TR_D$ is connected to one end of the capacitance unit $C_1$ and to the power supply line PS1, while the other source/drain region is connected to one end (specifically, the anode electrode) of the light emission unit ELP. The gate electrode of the drive transistor $TR_D$ is connected to the other source/drain region of the write transistor $TR_W$ and is also connected to the other end of the capacitance unit $C_1$.

Furthermore, in the write transistor $TR_W$, one source/drain region is connected to the data line DTL and the gate electrode is connected to the scanning line SCL.

The other end (specifically, the cathode electrode) of the light emission unit ELP is connected to the common power supply line PS2. A predetermined cathode voltage $V_{Cat}$ is supplied to the common power supply line PS2. Note that the capacitance of the light emission unit ELP is denoted by the symbol $C_{EL}$.

The following describes driving of the pixel 10 in outline. When the write transistor $TR_W$ is caused to become conductive by a scanning signal from the scanning unit 101 while a voltage corresponding to the brightness of the image to be displayed is supplied from the data driver 102 to the data line DTL, the voltage corresponding to the brightness of the image to be displayed is written to the capacitance unit $C_1$. After the write transistor $TR_W$ is caused to become non-conductive, a current flows through the drive transistor $TR_D$ in accordance with the voltage held in the capacitance unit $C_1$, whereby the light emission unit ELP emits light.

Note that, in the present disclosure, the configuration of the drive circuit that controls light emission of the pixel 10 is not particularly limited. Therefore, the configuration illustrated in FIG. 1 is merely an example, and the display device according to the present embodiment may have various configurations.

The following describes a detailed structure of the display device 1.

Figure 2:
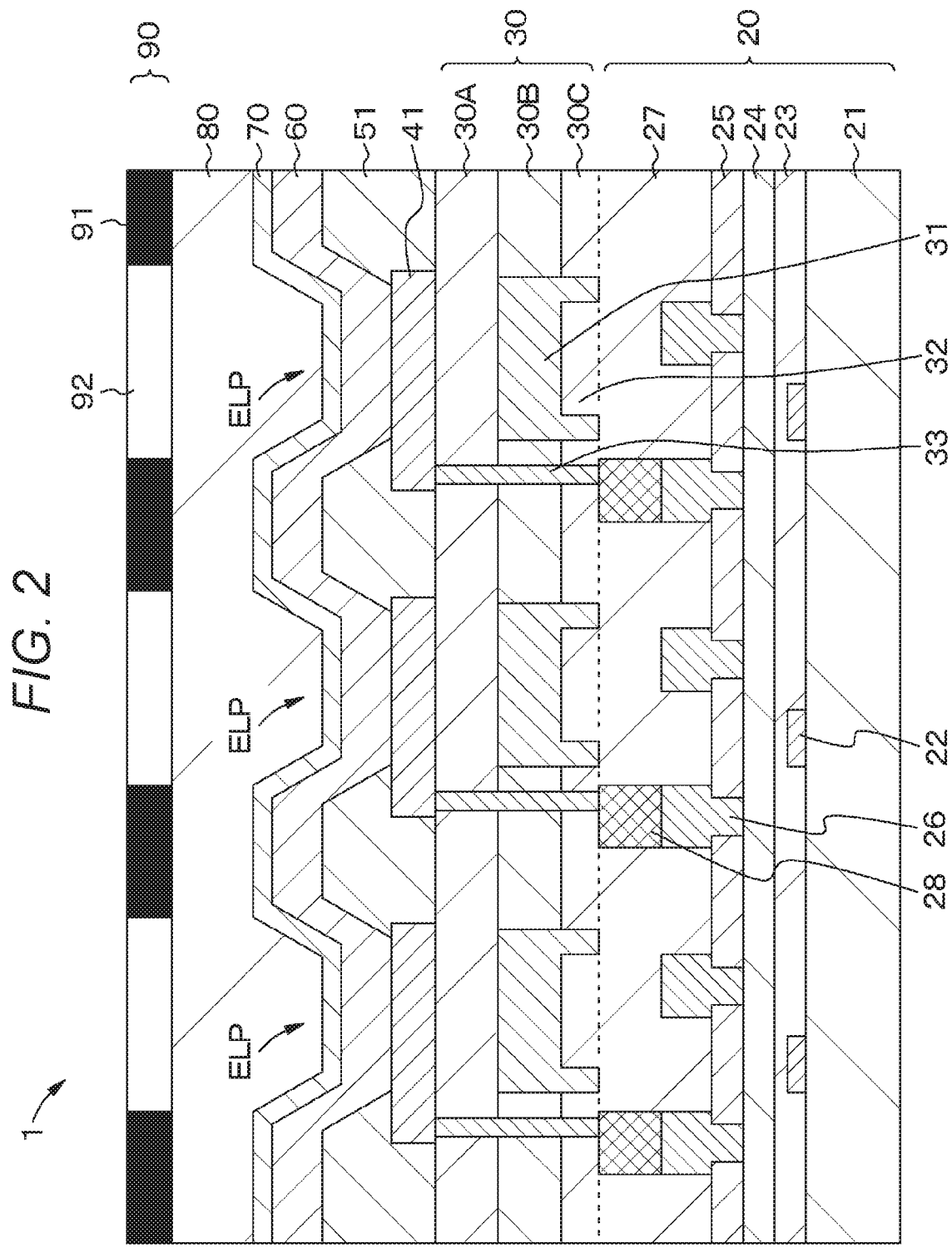
FIG. 2 is a schematic partial cross-sectional view of the display device according to the first embodiment.

FIG. 2 is a schematic partial cross-sectional view of the display device according to the first embodiment.

In the display device 1, the light emission unit ELP includes a first electrode 41, an organic layer 60, and a second electrode 70, which are stacked together. The first electrode 41 is disposed for each light emission units ELP, and a partition 51 is formed between adjacent first electrodes 41. In addition, the organic layer 60 and the second electrode 70 are stacked over the entire surface including the first electrode 41 and the partition 51. Moreover, a protection film 80 is disposed on the entire surface including the second electrode 70, and a color filter 90 is placed on the protection film 80. The reference numeral 91 denotes a portion of a light shielding region, and the reference numeral 92 denotes a portion of a filter region.

The first electrode 41 is formed on an interlayer insulation film 30. Below the first electrode 41, there is formed a reflection film 31 that has a light reflecting surface disposed to be flush with a boundary plane on which different insulation materials are in contact with each other in the interlayer insulation film 30.

The film thickness of the interlayer insulation film 30 located between the reflection film 31 and the first electrode 41 is set such that light with a wide wavelength band ranging from blue to red can be taken out from the pixel.

Various components will now be described in detail with reference to FIG. 2.

The circuit board 20 includes: a base material 21; a gate electrode 22 formed on the base material 21; a gate insulation film 23 formed to cover the entire surface of the gate electrode 22; a semiconductor material layer 24; a planarization film 25 formed to cover the entire surface including the semiconductor material layer 24; a source/drain electrode 26 connected to a source/drain region of a transistor formed in the semiconductor material layer 24; a planarization film 27 formed to cover the entire surface including the source/drain electrode 26; and a contact plug 28 that is disposed in as opening is the planarization film 27 and is connected to the source/drain electrode 26 of the drive transistor.

The circuit board 20 is equipped with a drive circuit including the transistor and others described above for driving the pixel 10. In addition, the first electrode 41 and the drive circuit are electrically connected. More specifically, the first electrode 41 is connected to the source/drain electrode 26 of the transistor formed in the semiconductor material layer 24 via the conductive portion 33 connected to the contact plug 28.

The base material 21 may include, for example, a glass material, a semiconductor material, a plastic material, or the like. The drive circuit including a thin film transistor that controls light emission of the light emission unit ELP is formed on the base material 21.

The gate electrode 22 for various transistors included is the drive circuit may be formed by using, for example, aluminum (Al) or some other metal, polysilicon, or the like. The gate insulation film 23 is disposed on the entire surface of the base material 21 so as to cover the gate electrode 22. The gate insulation film 23 can be formed by using, for example, silicon oxide ($SiO_x$), silicon nitride ($SiN_x$), or the like.

The semiconductor material layer 24 can be formed on the gate insulation film 23 by using, for example, amorphous silicon, polycrystalline silicon, an oxide semiconductor, or the like. Furthermore, some regions of the semiconductor material layer 24 are doped with an impurity to form a source/drain region. Moreover, the semiconductor material layer 24 includes a region that is located between one source/drain region and the other source/drain region and above the gate electrode 22 to form a channel region. With these components, a bottom-gate type thin film transistor is disposed on the base material 21. Note that illustration of the source/drain regions and the channel region is omitted in FIG. 2.

The planarization film 25 is disposed on the semiconductor material layer 24. The planarization film 25 includes, for example, silicon oxide ($SiO_x$), silicon nitride ($SiN_x$), silicon oxynitride ($SiO_xN_y$), or the like. The source/drain electrode 26 is connected to the semiconductor material layer 24 via a contact hole provided in the planarization film 25. The source/drain electrode 26 includes a metal such as, for example, aluminum (Al).

The planarization film 27 is formed for the purpose of covering and planarizing the drive circuit and others. The planarization film 27 can be formed by using, for example, an organic insulation film such as a polyimide-based resin, an acrylic-based resin, or a novolak-based resin, or an inorganic insulation film such as silicon oxide ($SiO_x$), silicon nitride ($SiN_x$), or silicon oxynitride ($Si_xN_y$).

The contact plug 28 includes a metal material such as, for example, copper (Cu) or a copper alloy, and is formed in an opening provided in the planarization film 27. The first electrode 41 and the contact plug 28 are electrically connected by the conductive portion 33 formed in an opening provided in the interlayer insulation film 30, which is described below.

The interlayer insulation film 30 includes different types of a plurality of insulation materials stacked to be in contact with each other. In the example illustrated in FIG. 2, the interlayer insulation film 30 is formed by stacking a first layer 30A, a second layer 30B, and a third layer 30C.

The interlayer insulation film 30 can be formed by using an inorganic insulation material or the like. The interlayer insulation film 30 may be formed to include at least two types of layers selected from, for example, a layer of silicon oxide, a layer of silicon nitride, and a layer of silicon oxynitride, or may be formed with two types of layers stacked alternately. The following description is provided on the assumption that the interlayer insulation film 30 includes a layer of silicon oxide and a layer of silicon nitride.

The reflection film 31, which is disposed below the first electrode 41, is formed to have a light reflecting surface disposed to be flush with a boundary plane on which different insulation materials are in contact with each other in the interlayer insulation film 30. More specifically, the light reflecting surface of the reflection film 31 is formed to be flush with the boundary plane on which the first layer 30A and the second layer 30B are in contact with each other in the interlayer insulation film 30.

The reflection film 31 is embedded in an opening provided in the interlayer insulation film 30. The reflection film 31 includes a metal material. The description is provided here on the assumption that the reflection film 31 includes silver or a silver alloy. Note that the reference numeral 32 denotes a filling member that fills an opening in the reflection film 31 on the circuit board 20 side. From the viewpoint of bondability to the circuit board 20, the filling member 32 is formed by using the same material as the material of the planarization film 27.

More specifically, the reflection film 31 is embedded in the opening provided in the interlayer insulation film 30 with the first layer 30A serving as a stopper film. Thus, the position of the light reflecting surface of the reflection film 31 is defined by the thickness of a layer included in the interlayer insulation film 30. The film thickness of a layer included in the interlayer insulation film 30 and the film thickness of the organic layer 60 can be controlled with high precision by a film forming process. As a result, the dimension between the light reflecting surface of the reflection film 31 and the second electrode 70 (the portion indicated by an arrow in FIG. 2) can be set with high precision.

Furthermore, for example, it is made possible to reduce the stray light to an adjacent pixel by adjusting the composition of the second layer 30B in the interlayer insulation film 30 so that the light shielding rate is set to a higher value relative to the first layer 30A.

The first electrode 41 is formed on an interlayer insulation film 30. The first electrode 41 includes a transparent conductive material such as ITO, for example. The thickness of the first electrode 41 is preferably set to a range of 20 to 200 nanometers.

The organic layer 60 is formed on the entire surface including the first electrode 41 and the partition 51. The organic layer 60 is a white light emission functional layer that emits white light, and may have a structure in which a hole injection layer, a hole transport layer, a red light emission layer, a light emission separation layer, a blue light emission layer, a green light emission layer, and an electron transport layer, which include an organic material, are sequentially stacked, for example. Alternatively, the organic layer 60 may have a structure in which a hole injection layer, a hole transport layer, a blue light emission layer, an electron transport layer, a charge generation layer, a hole injection layer, a hole transport layer, a yellow light emission layer, and an electron transport layer are sequentially stacked from the bottom layer. Note that the organic layer 60 has a multilayer structure, but is illustrated as a single layer in the figure.

The second electrode 70 is formed on the entire surface including the organic layer 60. The second electrode 70 includes a material that has high light transmissibility and a low work function. The description is provided here on the assumption that the second electrode 70 includes ITO.

The protection film 80 is formed on the entire surface including the second electrode 70. The protection film 80, which is intended to prevent moisture from entering the organic layer 60, includes a material having low water permeability and is formed to have a thickness of about 1 to 8 micrometers. As a material of the protection film 80, silicon nitride ($SiN_x$), silicon oxide ($SiO_x$), aluminum oxide ($AlO_x$), titanium oxide ($TiO_x$), or a combination thereof is used.

The color filter 90 is formed on, for example, a counter substrate side (not illustrated), and is stuck on the protection film 80 with an ultraviolet curable resin, a thermosetting resin, or the like. Through the color filter 90, the light emitted by the light emission unit ELP is color-separated and taken.

The foregoing has described a detailed structure of the display device 1. The above-described display device 1 can be manufactured as follows.

The following describes a method for manufacturing the display device 1 described above. The method for manufacturing the display device 1 includes the steps of:

forming, on a substrate, an interlayer insulation film in which layers of different types of insulation materials are stacked to be in contact with each other;

forming an opening in a region of the interlayer insulation film, the region corresponding to a first electrode, in such a way that a plane flush with a boundary plane on which different insulation materials are in contact with each other in the interlayer insulation film is exposed to a bottom;

embedding a reflection film in the opening;

joining a surface of the embedded reflection film with a circuit board, and then removing the substrate; and forming, on the interlayer insulation film, a light emission unit in which the first electrode, an organic layer, and a second electrode are stacked. The same applies to other embodiments described later.

FIGS. 3 to 12 are schematic partial end views for explaining the method for manufacturing the display device according to the first embodiment.

The method for manufacturing the display device 1 will now be described in detail with reference to these drawings.

Step-100 (see FIG. 3A)

First, the circuit board 20 on which a drive circuit is formed is prepared. The base material 21 is prepared, and then the base material 21 is subjected to a predetermined film forming and patterning process, whereby the drive circuit including a thin film transistor is formed. Then, the planarization film 27 is formed on the entire surface of the drive circuit by a spin coating method, a slit coating method, a sputtering method, a CVD method, or the like. Next, an opening is formed in the planarization film 27, and then the contact plug 28 is formed in the opening, whereby the circuit board 20 illustrated in FIG. 3A can be obtained.

Subsequently, the interlayer insulation film 30 having the reflection film 31 formed therein is disposed on the circuit board 20 by the procedure illustrated in FIGS. 3B to 7.

Step-110 (see FIG. 3B)

A substrate 39 of a silicon wafer is prepared, and the interlayer insulation film 30 is formed thereon by, for example, stacking two types of layers alternately, such as a layer of silicon oxide and a layer of silicon nitride (see FIG. 3B). In the example shown in the figure, the first layer 30A and the third layer 30C are layers of silicon oxide and the second layer 30B is a layer of silicon nitride.

Figure 4A:
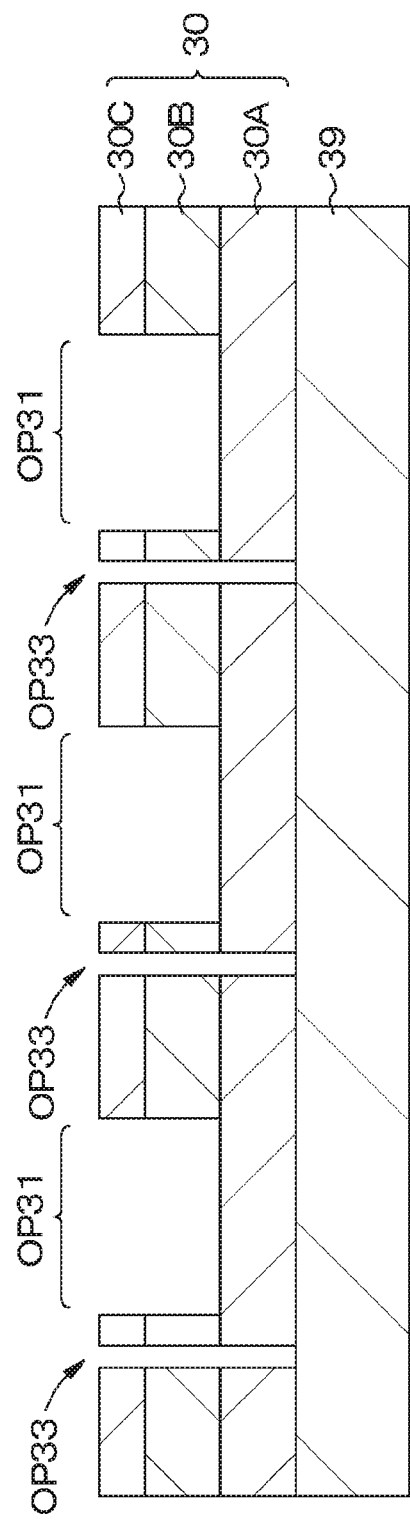
FIGS. 4A and 4B are schematic partial end views for explaining the method for manufacturing the display device according to the first embodiment, as continued from FIG. 3B.

Step-120 (see FIG. 4A)

Then, an opening OP31 is formed in the interlayer insulation film 30 in a portion corresponding to the reflection film 31 such that the boundary plane between the first layer 30A and the second layer 30B is exposed to the bottom (see FIG. 4A). The opening OP31 can be formed by, for example, performing dry etching under the condition that the first layer 30A acts as a stopper film. Furthermore, at the same time, an opening OP33 is formed in the interlayer insulation film 30 in a portion corresponding to the conductive portion 33 so as to penetrate through the interlayer insulation film 30. The opening OP33 can be formed by, for example, performing dry etching under the condition that the substrate 39 acts as a stopper.

Figure 4B:
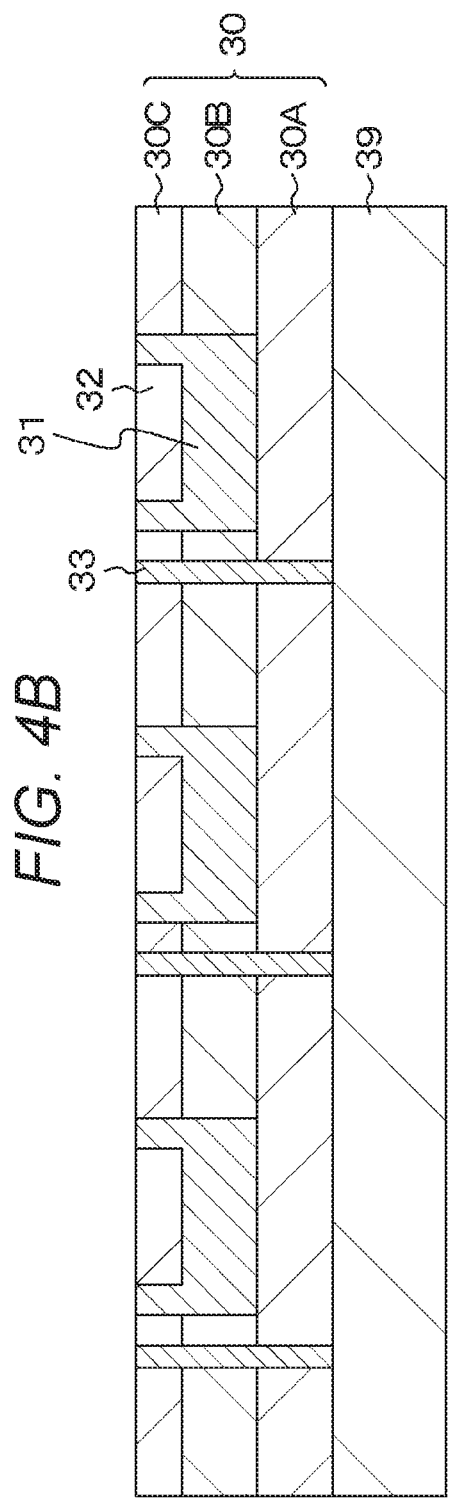

Step-130 (see FIG. 4B)

Then, the reflection film 31 and others are formed in the opening OP31, while the conductive portion 33 is formed in the opening OP33. For example, a silver thin film is formed on the entire surface including the opening by a sputtering method, and then the filling member 32 to fill the opening of the reflection film 31 is formed, followed by planarization carried out by using, for example, a CMP method.

Figure 7:
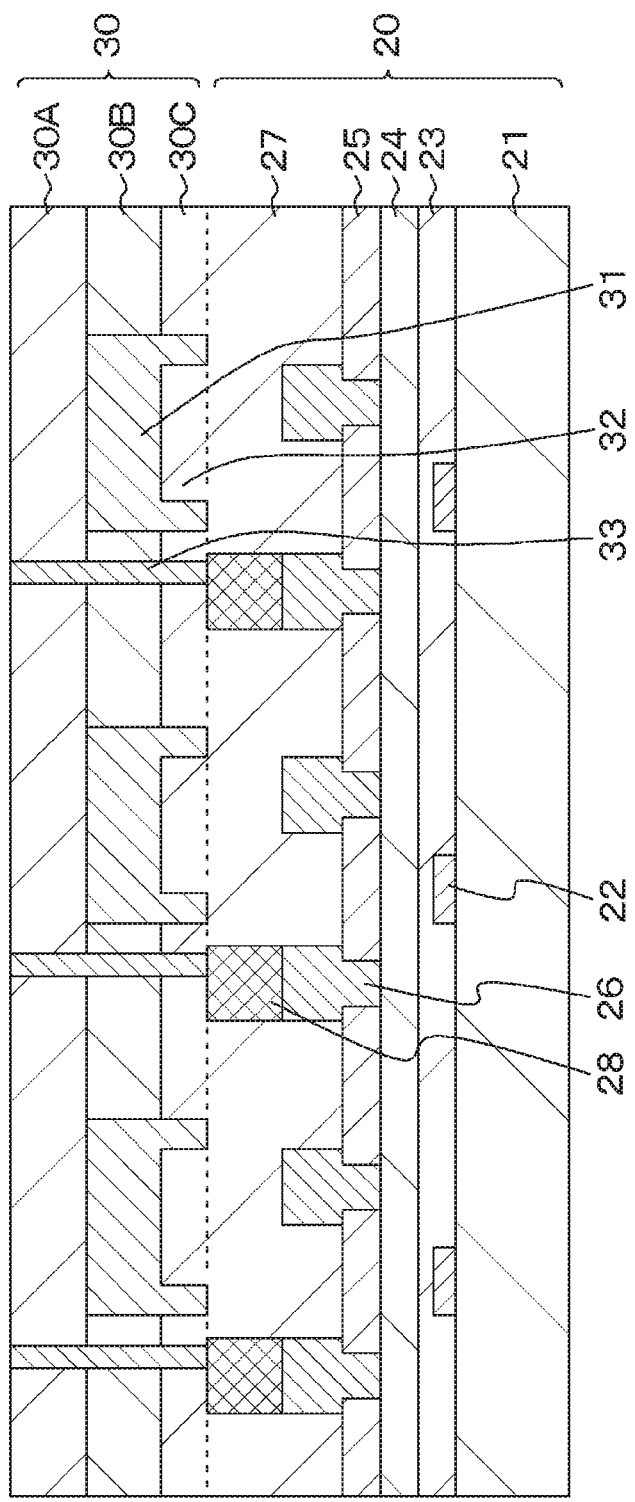
FIG. 7 is a schematic partial end view for explaining the method for manufacturing the display device according to the first embodiment, as continued from FIG. 6.

Step-140 (see FIGS. 5, 6, and 7)

Subsequently, with the interlayer insulation film 30 and the circuit board 20 facing each other (see FIG. 5), the interlayer insulation film 30 and the circuit board. 20 are joined together. For example, the facing surfaces of the interlayer insulation film 30 and the circuit board 20 are activated by removing the inert layer on each surface by irradiating the inert layer with energy waves such as plasma or accelerated ion beams under an ultra-high vacuum. Then, the surface-activated substances are brought into close contact with each other, whereby the interlayer insulation film 30 and the circuit board 20 can be joined together by as atomic force (see FIG. 6). Then, the substrate 39 is removed (see FIG. 7).

Next, the light emission unit ELP ant others are formed on the interlayer insulation film 30 by the procedure illustrated in FIGS. 8 to 12.

Figure 8:
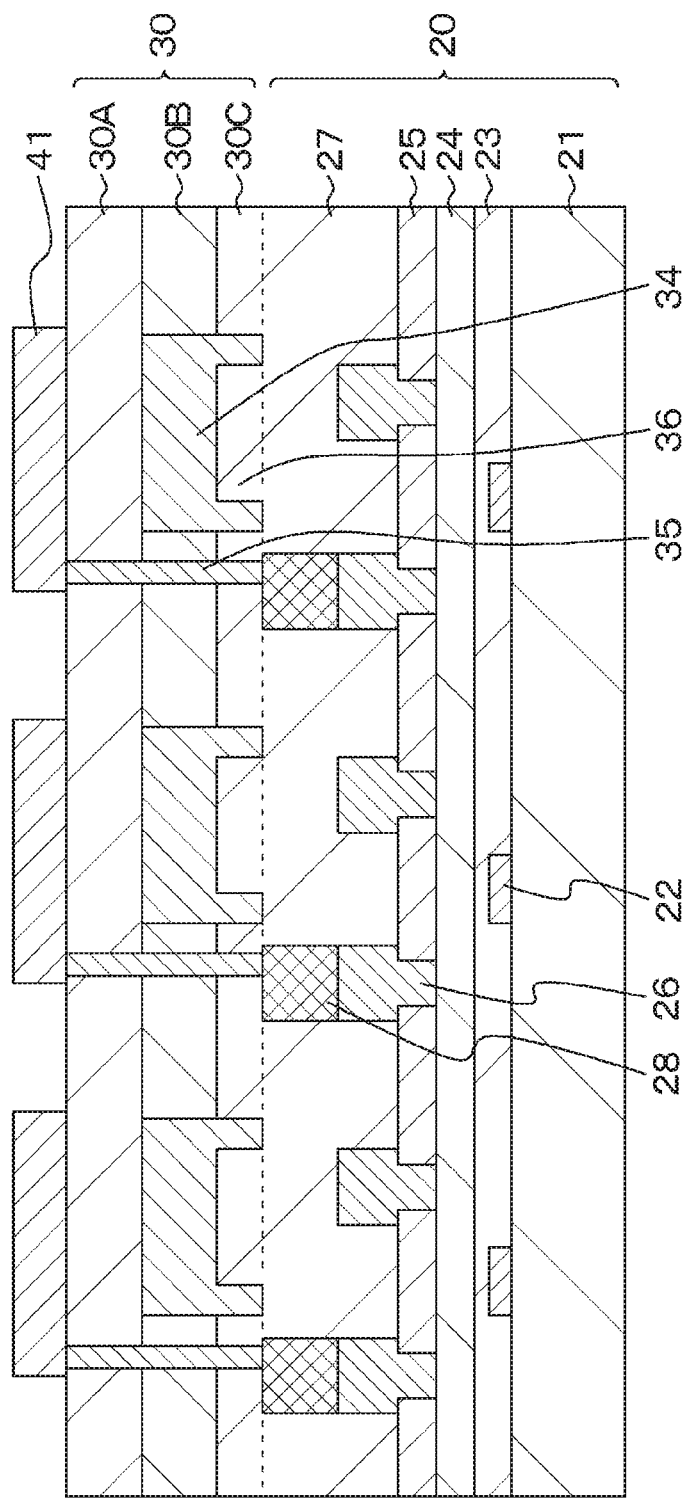
FIG. 8 is a schematic partial end view for explaining the method for manufacturing the display device according to the first embodiment, as continued from FIG. 7.

Step-150 (see FIG. 8)

First, the first electrode 41 is formed on the interlayer insulation film 30. The first electrode 41 can be obtained by, for example, forming an ITO film on the interlayer insulation film 30 and then patterning the ITO film.

Figure 9:
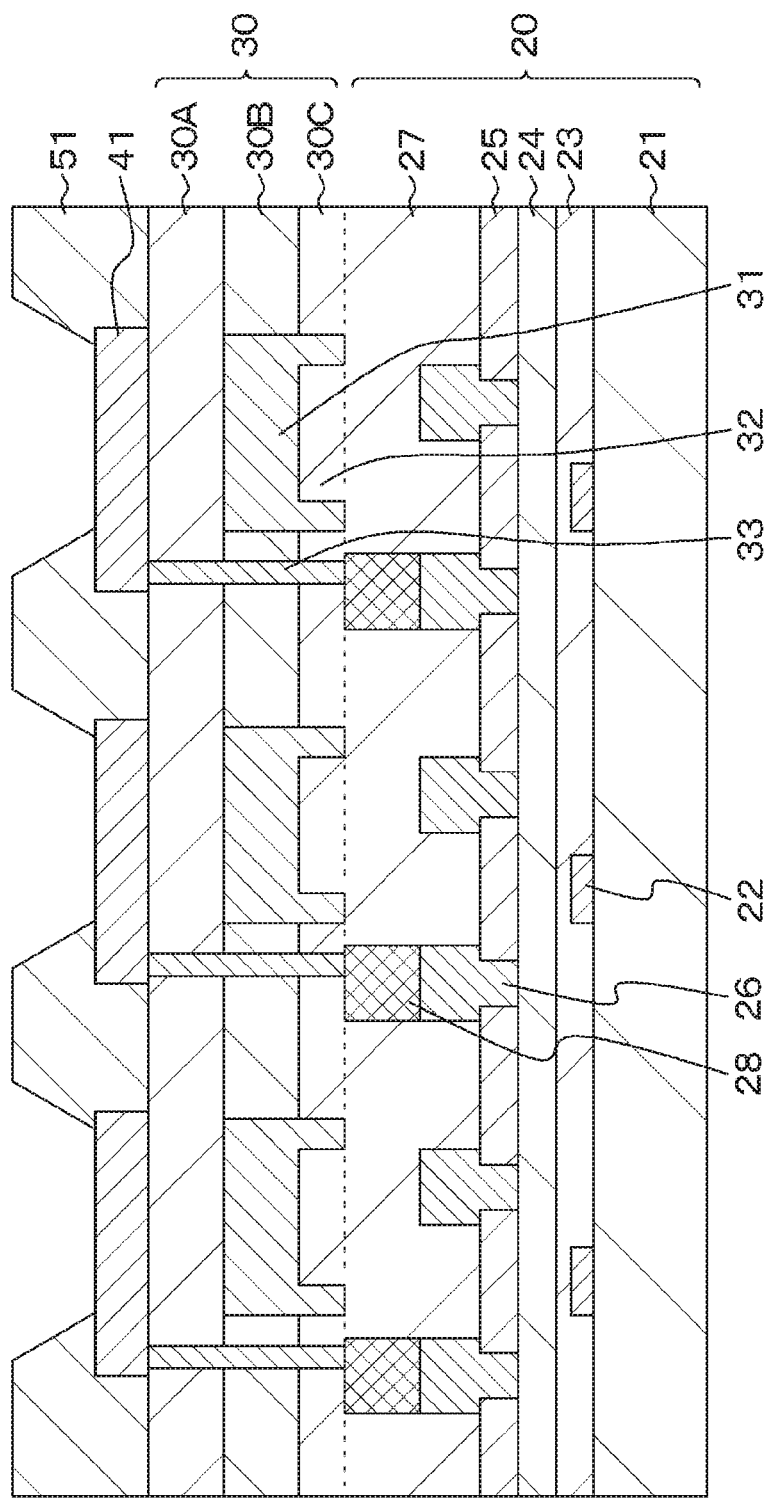
FIG. 9 is a schematic partial end view for explaining the method for manufacturing the display device according to the first embodiment, as continued from FIG. 8.

Step-160 (see FIG. 9)

Next, the partition 51 serving as an inter-pixel insulation film is formed between the first electrode 41 and the first electrode 41. An inorganic insulation film such as silicon oxynitride is formed on the entire surface including the first electrode 41 by a sputtering method, a CVD method, or the like. Subsequently, a pixel opening is patterned by a lithography method and a dry etching method so that the formed inorganic insulation film has a predetermined recess, whereby the partition 51 can be formed.

Figure 10:
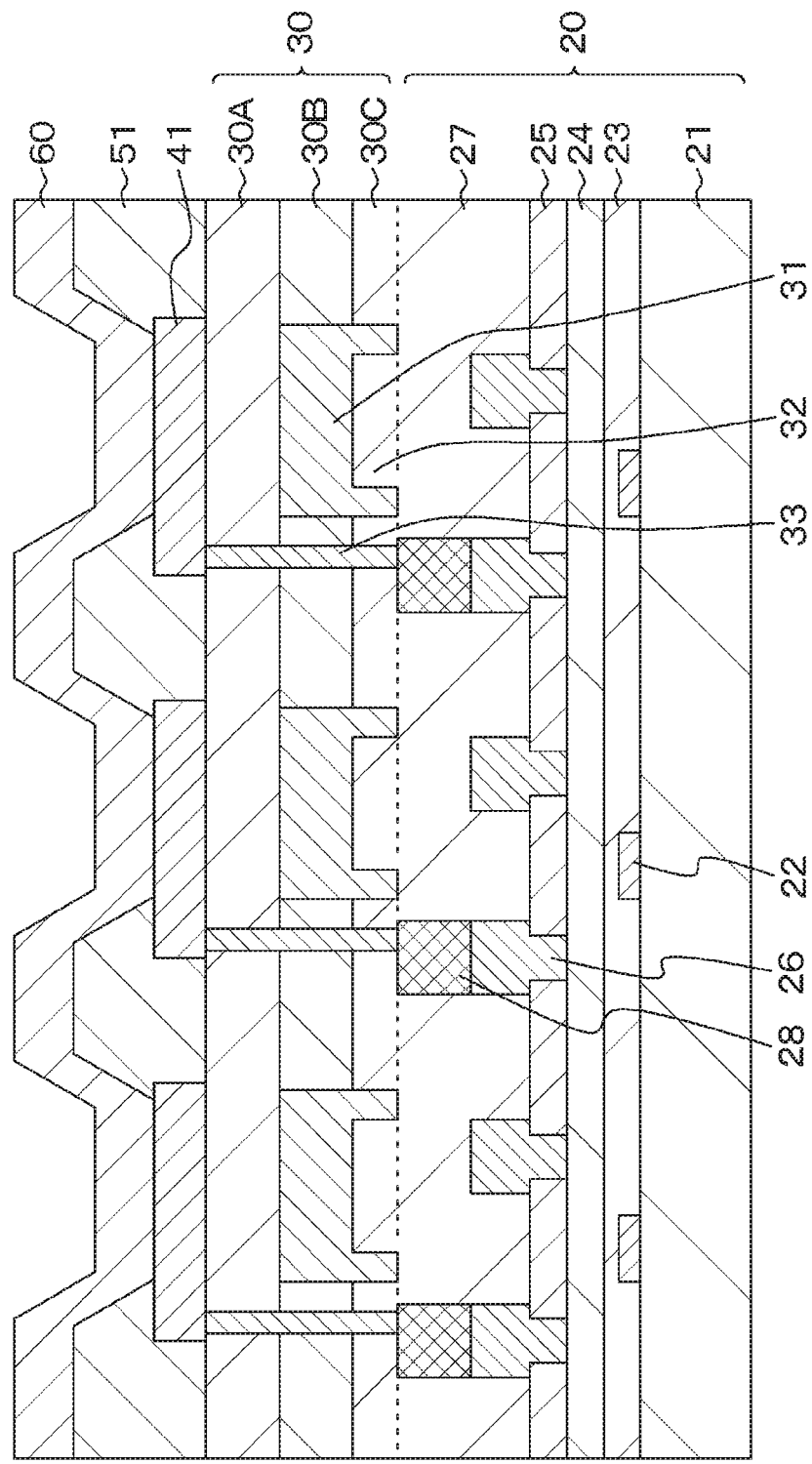
FIG. 10 is a schematic partial end view for explaining the method for manufacturing the display device according to the first embodiment, as continued from FIG. 9.

Step-170 (see FIG. 10)

Next, the organic layer 60 that emits white light is formed on the entire surface including the first electrode 41 serving as an anode electrode by, for example, sequentially forming a hole injection layer, a hole transport layer, a red light emission layer, a light emission separation layer, a blue light emission layer, a green light emission layer, and an electron transport layer.

Figure 11:
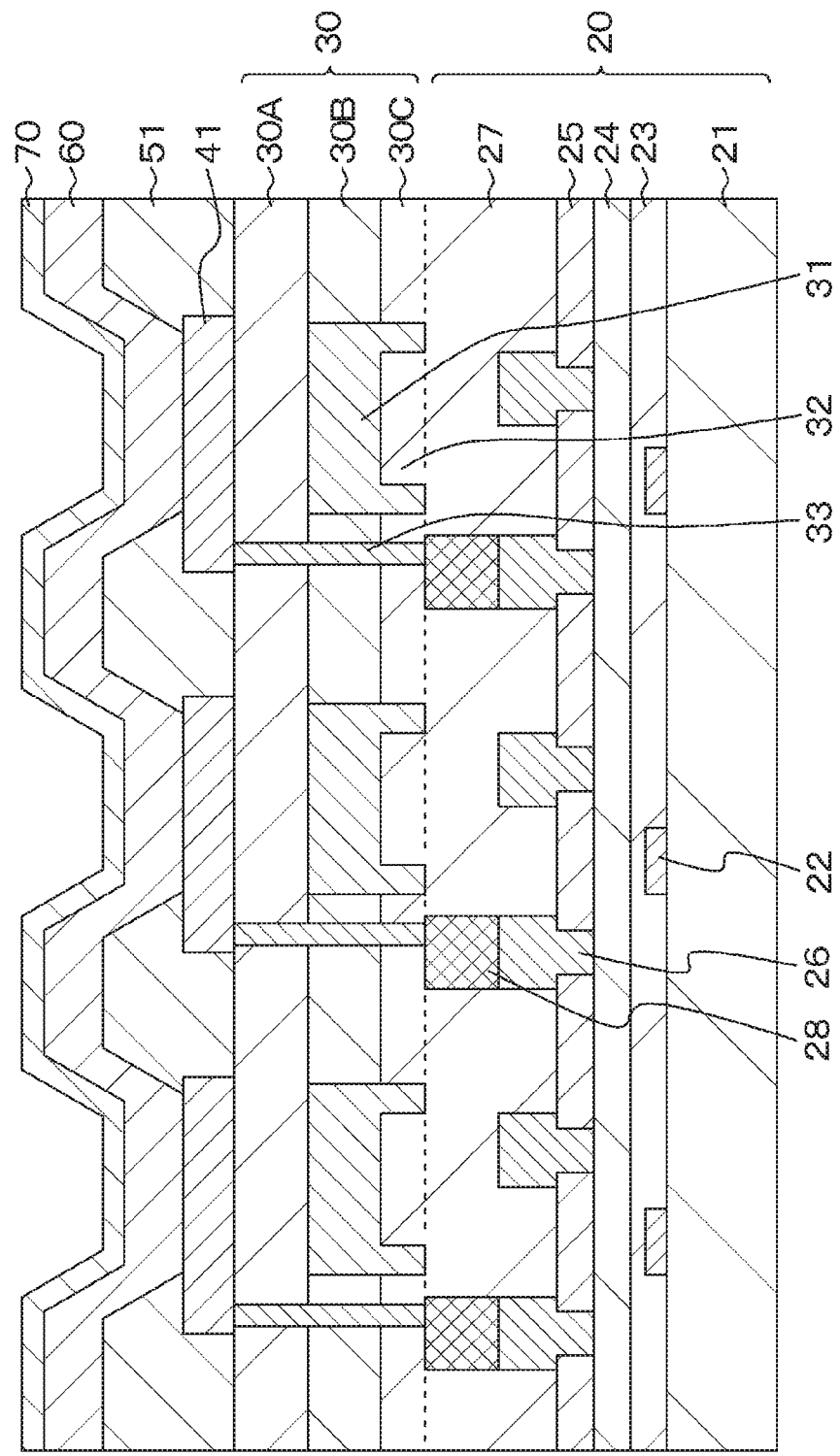
FIG. 11 is a schematic partial end view for explaining the method for manufacturing the display device according to the first embodiment, as continued from FIG. 10.
Figure 12:
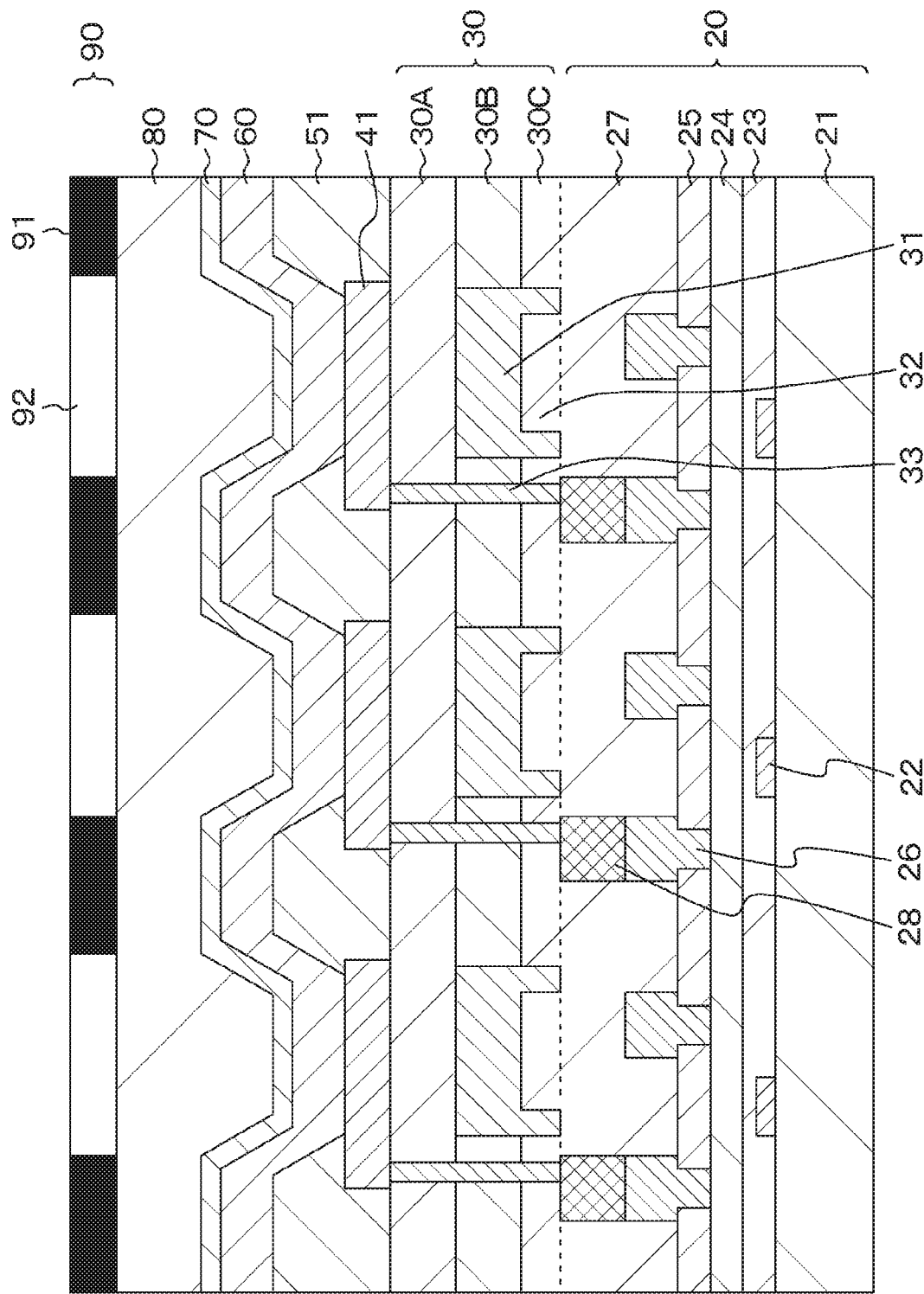
FIG. 12 is a schematic partial end view for explaining the method for manufacturing the display device according to the first embodiment, as continued from FIG. 11.

Step-180 (see FIGS. 11 and 12)

Next, the second electrode 70 serving as a cathode electrode is formed on the entire surface of the organic layer 60. The second electrode 70 can be obtained by, for example, forming a film of a silver-magnesium alloy on the entire surface by a vapor deposition method (see FIG. 11). After that, the protection film 80 is formed on the entire surface, and then the counter substrate on which the color filter 90 is formed is stuck thereto, whereby the display device 1 can be obtained (see FIG. 12).

The distance between the light reflecting surface of the reflection film 31 and the second electrode 70 is defined by the thicknesses of the organic layer 60, the first electrode 41, and the first layer 30A of the interlayer insulation film 30. These film thicknesses can be controlled with high precision due to the process of forming the components. Therefore, since the positional relationship between the organic layer and the reflection film can be set with high precision, variations in color and the like can be suppressed.

In addition, the light reflecting surface of the reflection film 31 is formed by embedding a metal material is the interlayer insulation film 30. Therefore, the light reflecting surface is not exposed to the outside air. For this reason, a material that has a high reflectance but is prone to oxidization, such as silver or a silver alloy, can be used as a material for forming the reflection film 31 without trouble.

Note that, in some cases, a mode in which a thin film of a transparent conductive material such as ITO is formed in the opening provided is the interlayer insulation film 30 and then a metal material is embedded may be carried out.

Second Embodiment

The second embodiment is a modification of the first embodiment. In the first embodiment, the first electrode 41 is connected to the drive circuit that drives the pixel 10 via the conductive portion 33 connected to the contact plug 28. In the second embodiment, the first electrode and the drive circuit are electrically connected via the reflection film, which is a major difference.

Figure 13:
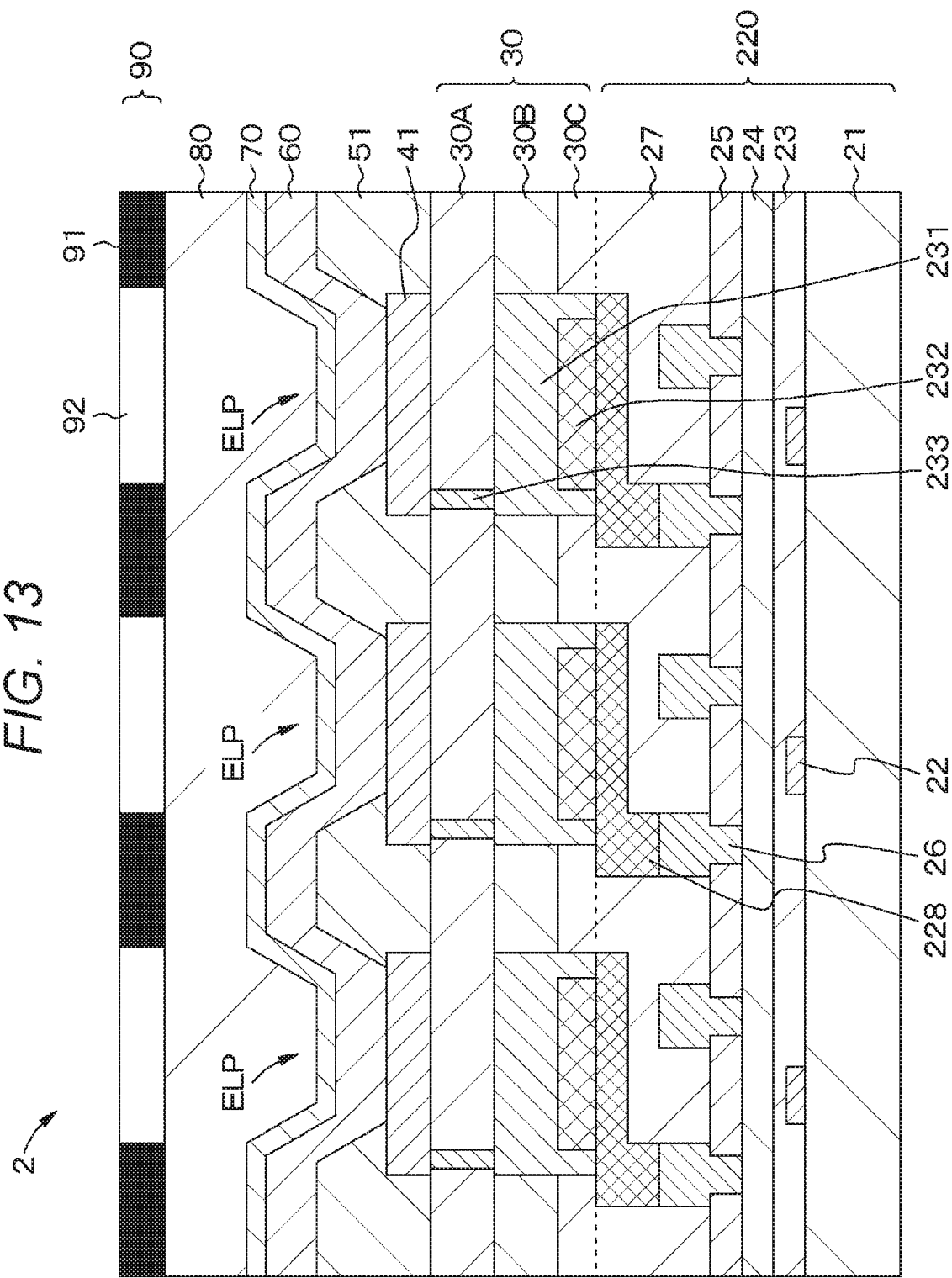
FIG. 13 is a schematic partial cross-sectional view of a display device according to a second embodiment.

FIG. 13 is a schematic partial cross-sectional view of a display device according to a second embodiment. Note that a schematic plan view of the display device according to the second embodiment is found in FIG. 1 by replacing the display device 1 with the display device 2.

The display device 2 is different from the display device 1 in shape and configuration of a contact plug 228, a reflection film 231, a filling member 232, and a conductive portion 233.

The contact plug 228 is formed to have a surface facing the reflection film 231, the surface being shaped to cover the reflection film 231. In addition, the reflection film 231 is connected to the source/drain electrode 26 of the drive transistor via the contact plug 228.

The reflection film 231, which is disposed below the first electrode 41, is formed to have a light reflecting surface disposed to be flush with a boundary plane on which different insulation materials are in contact with each other in the interlayer insulation film 30. As in the first embodiment, the light reflecting surface of the reflection film 231 is formed to be flush with the boundary plane on which the first layer 30A and the second layer 30B are in contact with each other in the interlayer insulation film 30.

The reflection film 231 is embedded in an opening provided in the interlayer insulation film 30. Note that the reference numeral 232 denotes a filling member that fills an opening in the reflection film 231 on the circuit board 20 side. From the viewpoint of bondability to the circuit board 20, the filling member 232 is formed by using the same material as the material of the contact plug 228. Therefore, the filling member 232 substantially forms a lower layer portion of the reflection film. The reflection film has an upper layer portion and a lower layer portion, the upper layer portion including silver or a silver alloy, and the lower layer portion including copper or a copper alloy.

In the configuration illustrated in FIG. 13, the reflection film 231 and the contact plug 228 are electrically connected. In addition, the first electrode 41 and the reflection film 231 are electrically connected by the conductive portion 233 formed in an opening provided in the interlayer insulation film 30. In this way, the first electrode 41 and the drive circuit are electrically connected via the reflection film 231.

The foregoing has described a detailed structure of the display device 2. The above-described display device 2 can be manufactured as follows.

FIGS. 14 to 24 are schematic partial end views for explaining the method for manufacturing the display device according to the second embodiment.

Step-200 (see FIG. 14A)

First, a circuit board 220 on which a drive circuit is formed is prepared. The base material 21 is prepared, and then the base material 21 is subjected to a predetermined film forming and patterning process, whereby the drive circuit including a thin film transistor is formed. Then, the planarization film 27 is formed on the entire surface of the drive circuit by a spin coating method, a slit coating method, a sputtering method, a CVD method, or the like. Next, arm opening is formed in the planarization film 27, and then the contact plug 228 is formed in the opening, whereby the circuit board 220 illustrated in FIG. 14A can be obtained.

Subsequently, the interlayer insulation film 30 having the reflection film 231 formed therein is disposed on the circuit board 220 by the procedure illustrated in FIGS. 14B to 18.

Step-210 (see FIG. 14B)

The substrate 39 of a silicon wafer is prepared, and the interlayer insulation film 30 is formed thereon by, for example, stacking two types of layers alternately, such as a layer of silicon oxide and a layer of silicon nitride (see FIG. 14B). The composition of the interlayer insulation film 30 is similar to the composition described in [Step-110] above, and thus the description thereof is omitted.

Figure 15A:
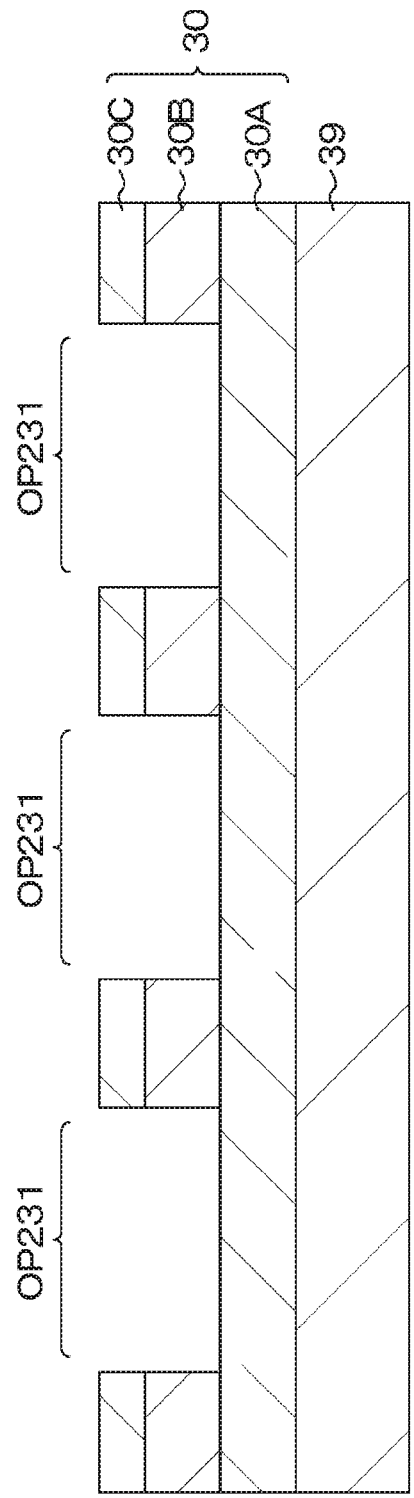
FIGS. 15A and 15B are schematic partial end views for explaining the method for manufacturing the display device according to the second embodiment, as continued from FIG. 14B.

Step-220 (see FIG. 15A)

Then, an opening OP231 is formed in the interlayer insulation film 30 in a portion corresponding to the reflection film 231 such that the boundary plane between the first layer 30A and the second layer 30B is exposed to the bottom (see FIG. 15A). The opening OP231 can be formed by, for example, performing dry etching under the condition that the first layer 30A acts as a stopper film.

Figure 15B:
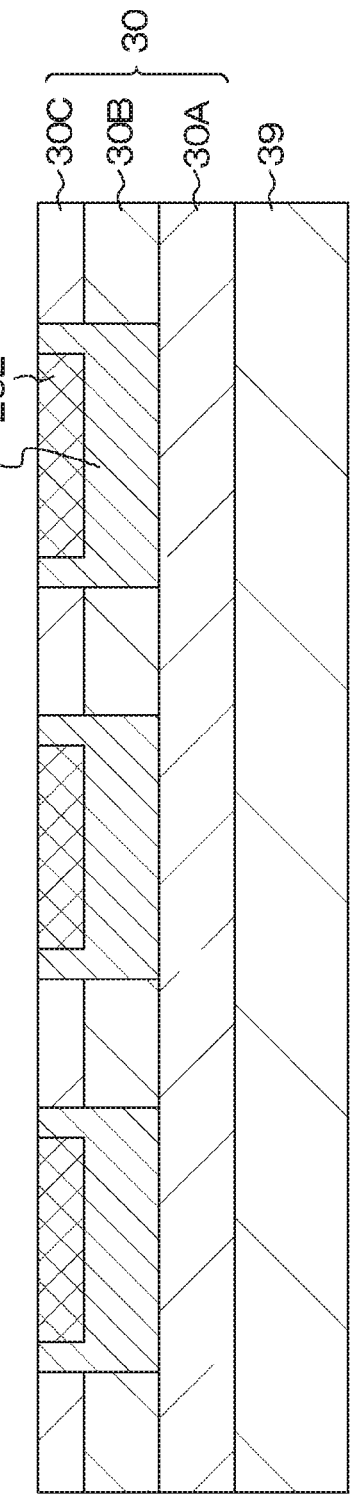

Step-230 (see FIG. 15B)

After that, the reflection film 231 and others are formed in the opening OP231. For example, a silver thin film is formed on the entire surface including the opening OP231 by a sputtering method, and then the filling member 232 to fill the opening of the reflection film 231 is formed, followed by planarization carried out by using, for example, a CMP method.

Figure 16:
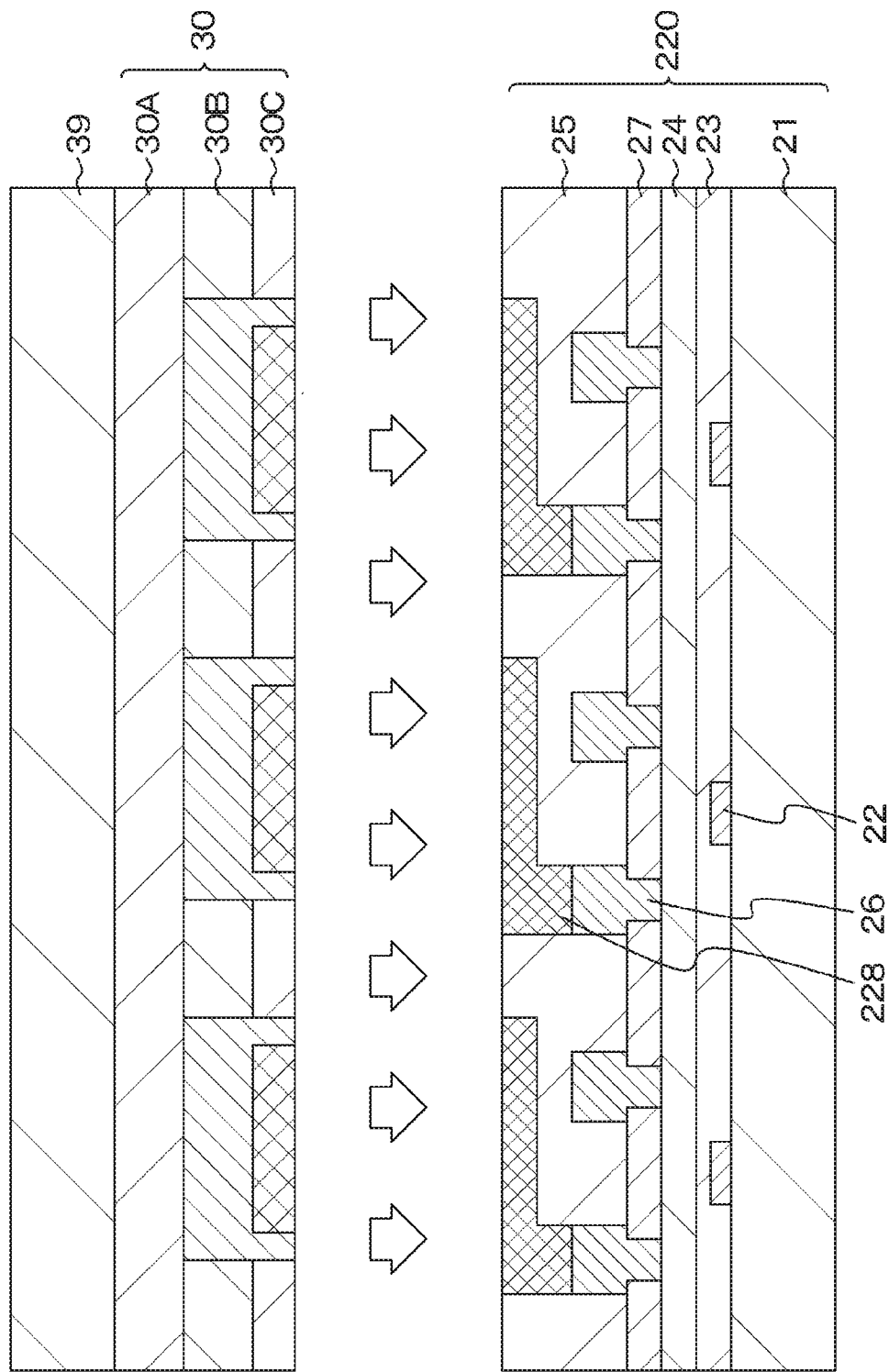
Figure 17:
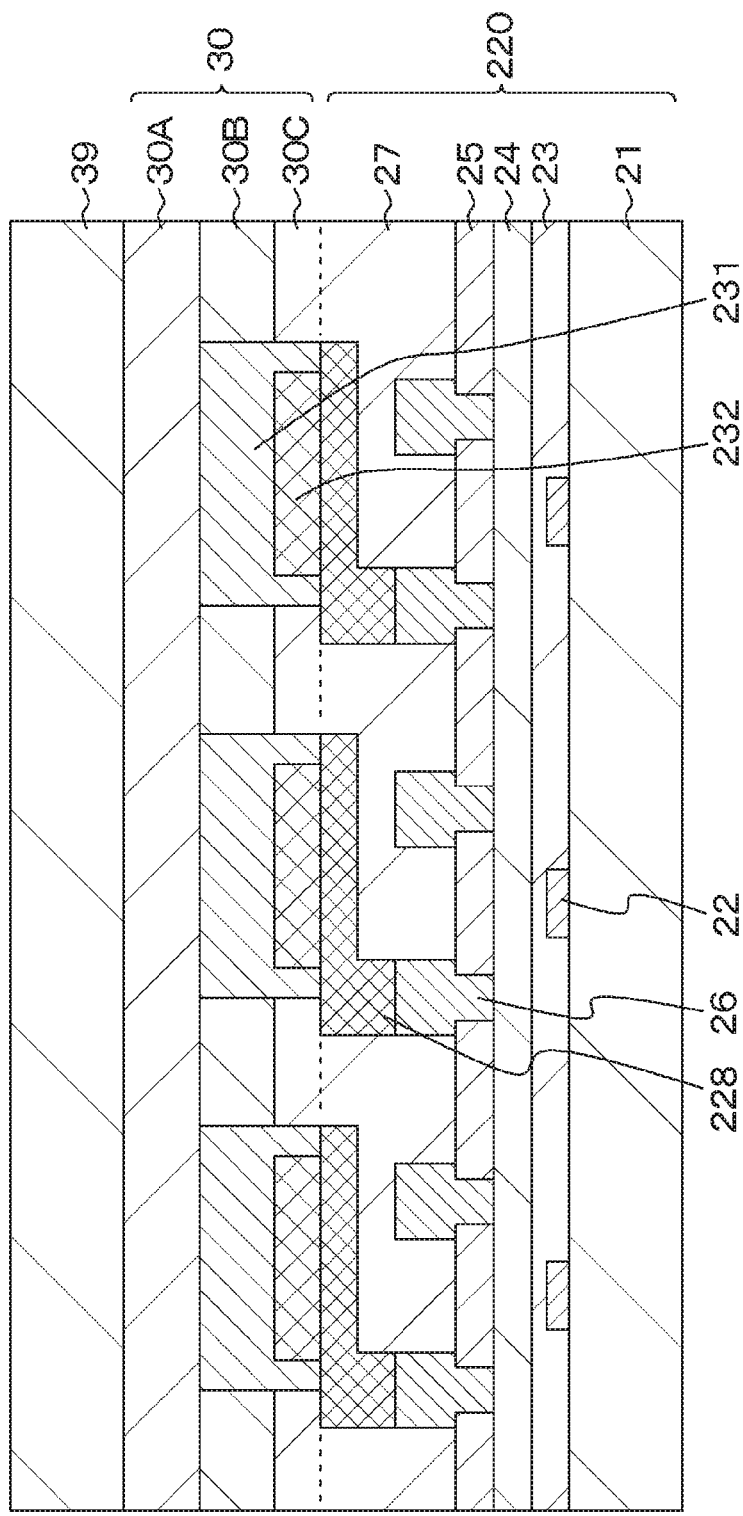
FIG. 17 is a schematic partial end view for explaining the method for manufacturing the display device according to the second embodiment, as continued from FIG. 16.
Figure 18:
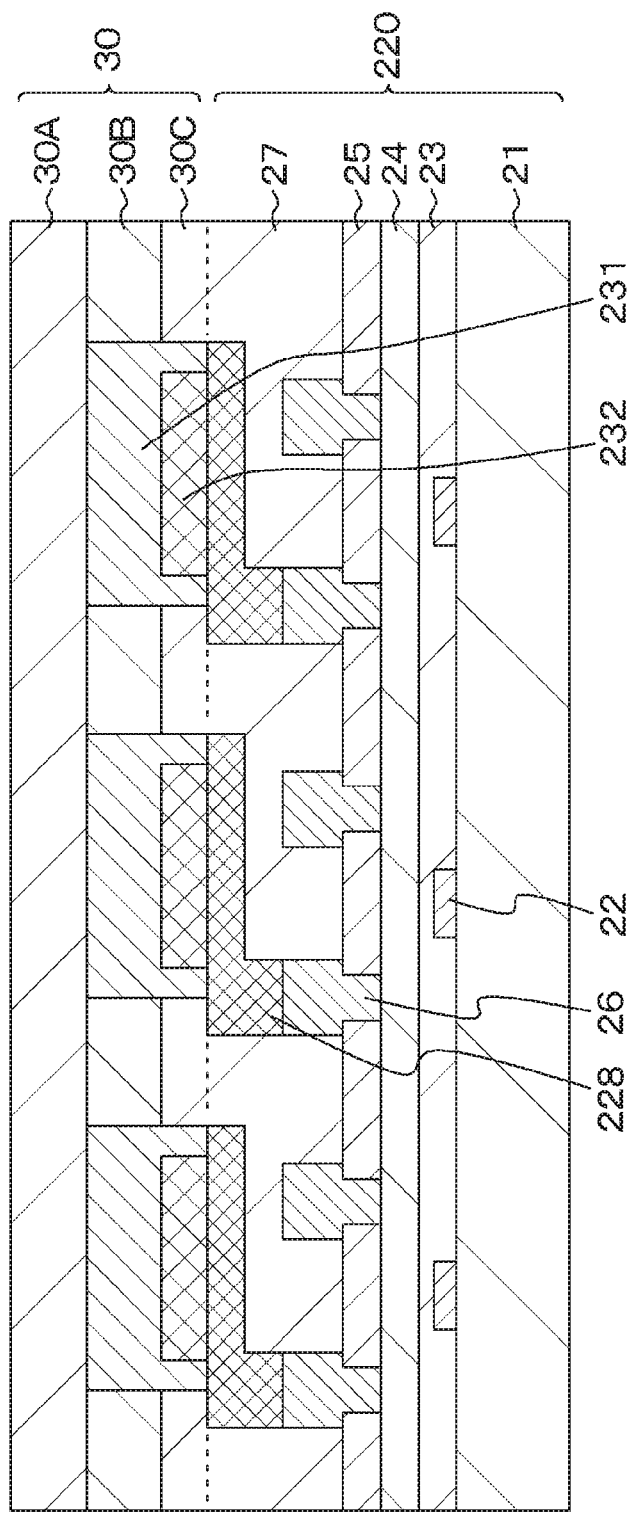
FIG. 18 is a schematic partial end view for explaining the method for manufacturing the display device according to the second embodiment, as continued from FIG. 17.

Step-240 (see FIGS. 16, 17, and 18)

Subsequently, with the interlayer insulation film 30 and the circuit board 220 facing each other (see FIG. 16), the interlayer insulation film 30 and the circuit board 220 are joined together. For example, the facing surfaces of the interlayer insulation film 30 and the circuit board 220 are activated by removing the inert layer on each surface by irradiating the inert layer with energy waves such as plasma or accelerated ion beams under an ultra-high vacuum. Then, the surface-activated substances are brought into close contact with each other, whereby the interlayer insulation film 30 and the circuit board 220 can be joined together by anatomic force (see FIG. 17). Then, the substrate 39 is removed (see FIG. 18).

Figure 19:
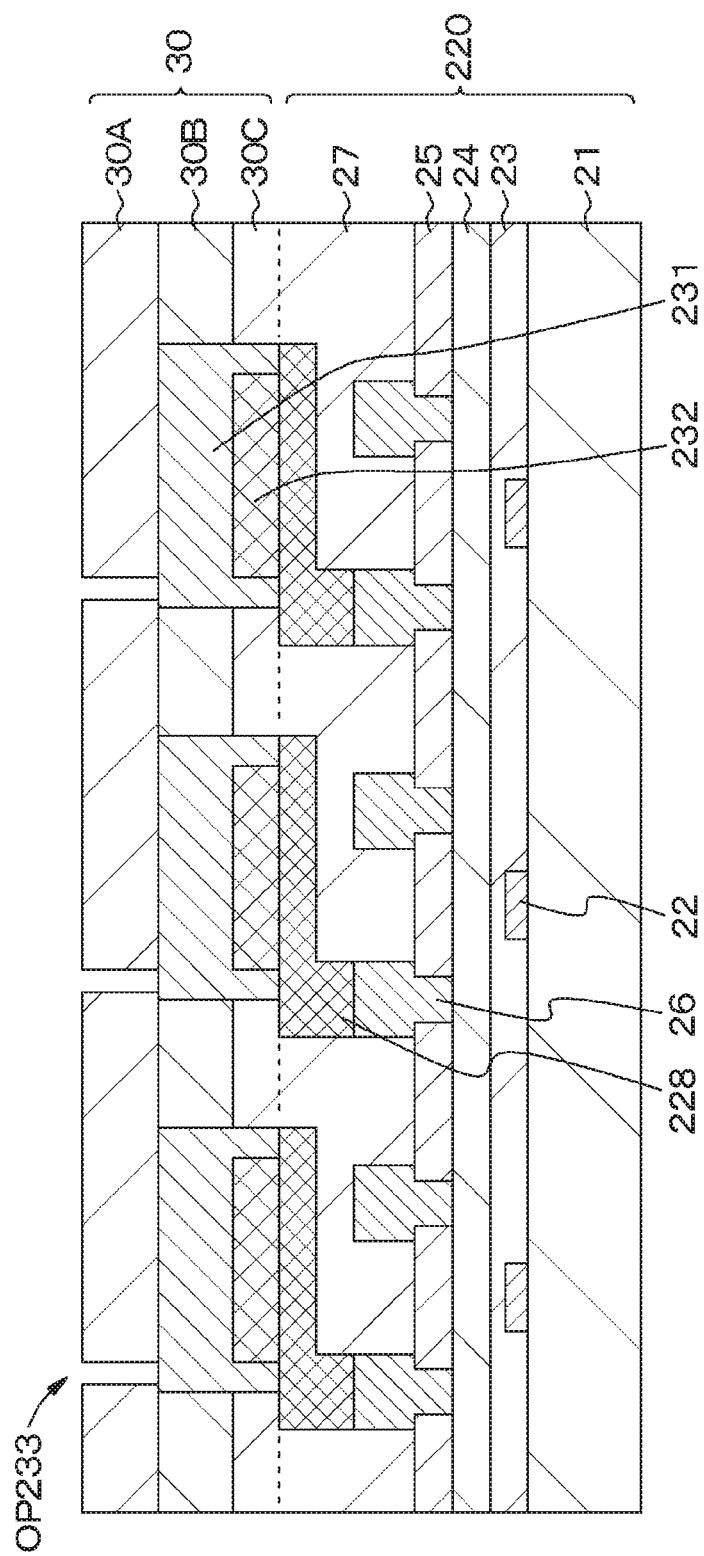
FIG. 19 a schematic partial end view for explaining the method for manufacturing the display device according to the second embodiment, as continued from FIG. 18.
Figure 20:
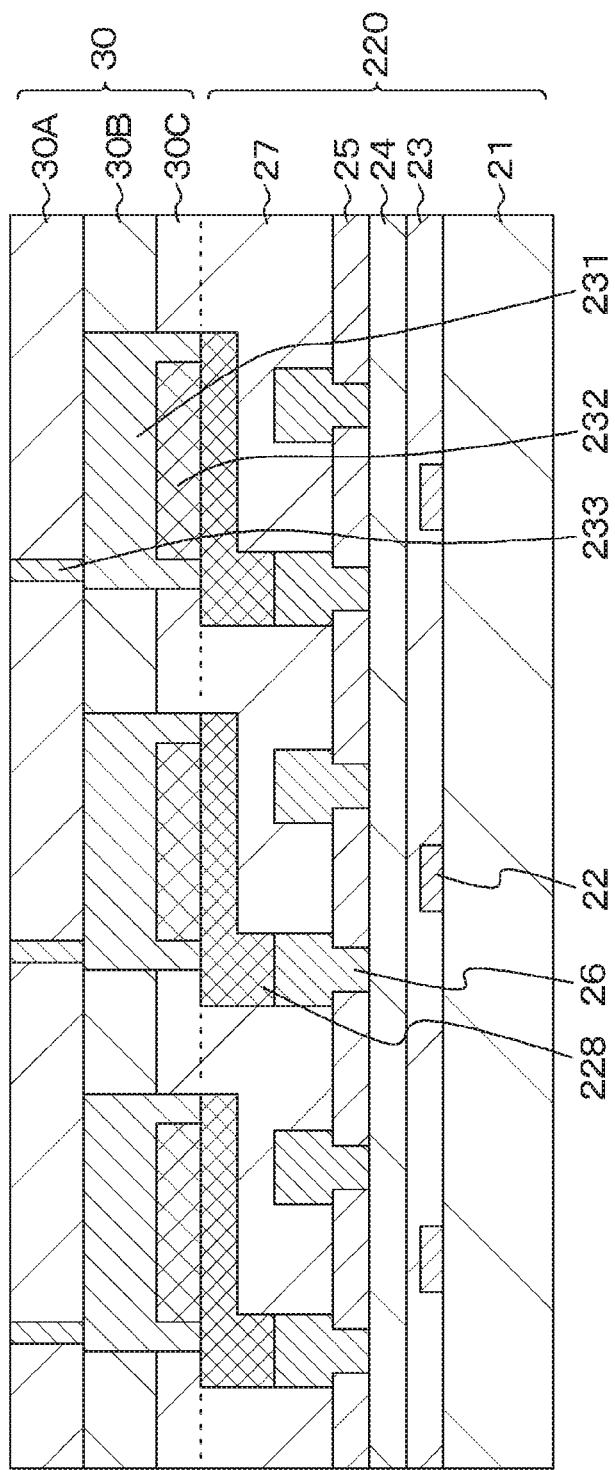
FIG. 20 is a schematic partial end view for explaining the method for manufacturing the display device according to the second embodiment, as continued from FIG. 19.

Step-250 (see FIGS. 19 and 20)

Next, an opening OP233 is formed in the interlayer insulation film 30 in a portion corresponding to the conductive portion 233. The opening OP233 can be formed by, for example, performing dry etching under the condition that the reflection film 231 acts as a stopper (see FIG. 19). After that, the conductive portion 233 is formed in the opening OP233. The conductive portion 233 can be formed by, for example, forming a conductive film on the entire surface and then performing planarization by using, for example, a CMP method (see FIG. 20).

Next, the light emission unit ELP and others are formed on the interlayer insulation film 30 by the procedure illustrated in FIGS. 21 to 24.

Figure 21:
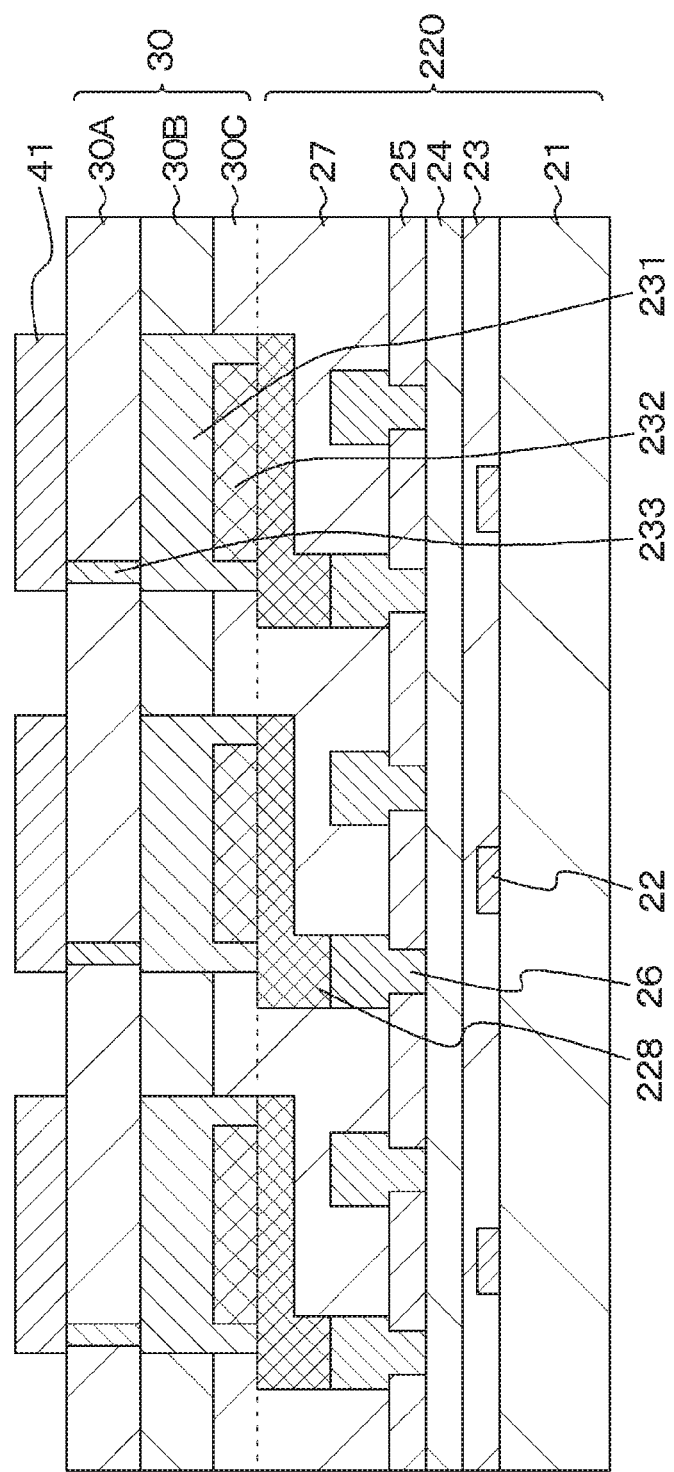
FIG. 21 is a schematic partial end view for explaining the method for manufacturing the display device according to the second embodiment, as continued from FIG. 20.

Step-260 (see FIG. 21)

First, the first electrode 41 is formed on the interlayer insulation film 30. The first electrode 41 can be obtained by, for example, forming an ITO film on the interlayer insulation film 30 and then patterning the ITO film. The first electrode 41 and the reflection film 231 are electrically connected via the conductive portion 233.

Figure 22:
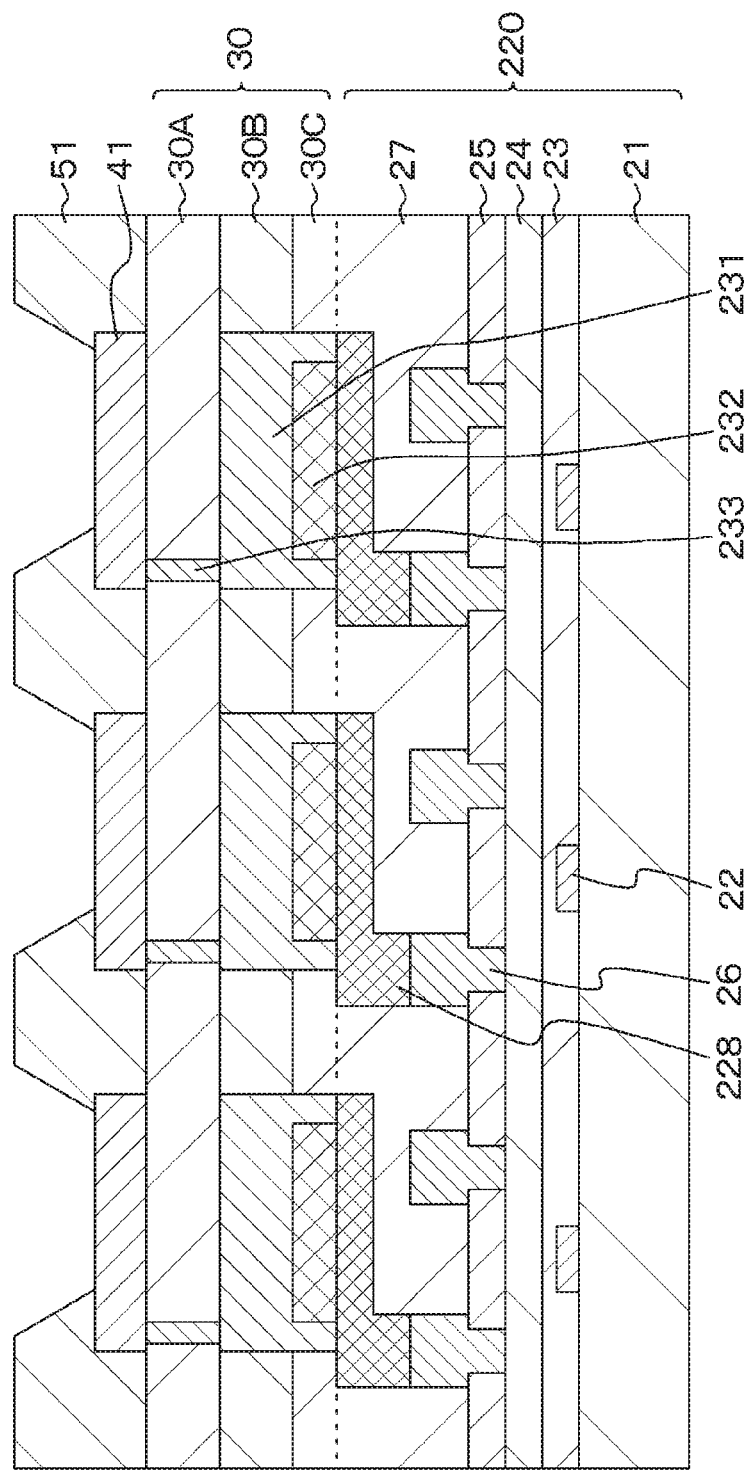
FIG. 22 is a schematic partial end view for explaining the method for manufacturing the display device according to the second embodiment, as continued from FIG. 21.

Step-270 (see FIG. 22)

Next, the partition 51 serving as an inter-pixel insulation film is formed between the first electrode 41 and the first electrode 41. The step is similar to the step described in [Step-160] above, and thus the description thereof is omitted.

Figure 23:
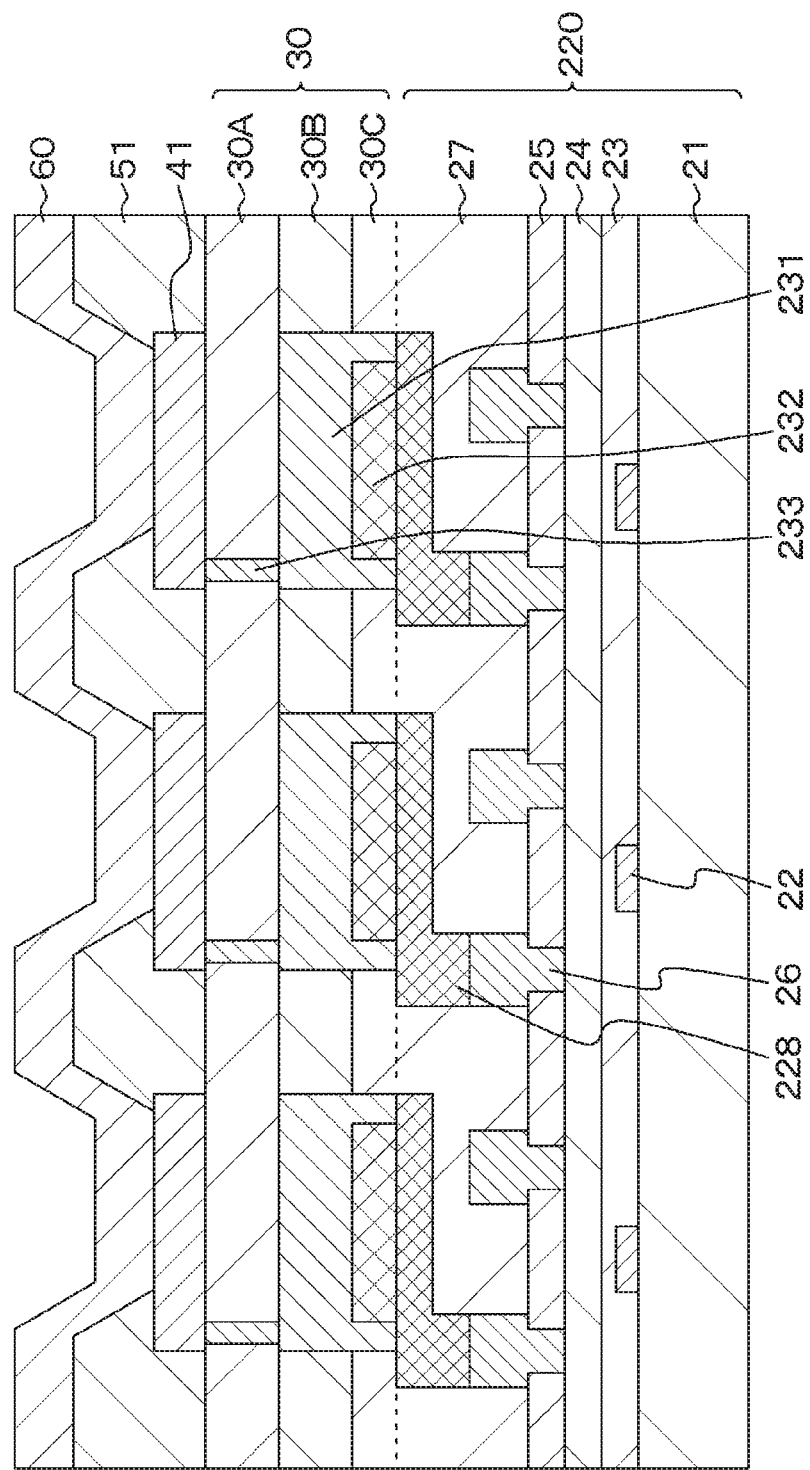
FIG. 23 is a schematic partial end view for explaining the method for manufacturing the display device according to the second embodiment, as continued from FIG. 22.

Step-280 (see FIG. 23)

Next, the organic layer 60 that emits white light is formed on the entire surface including the first electrode 41 serving as an anode electrode by, for example, sequentially forming a hole injection layer, a hole transport layer, a red light emission layer, a light emission separation layer, a blue light emission layer, a green light emission layer, and an electron transport layer.

Figure 24:
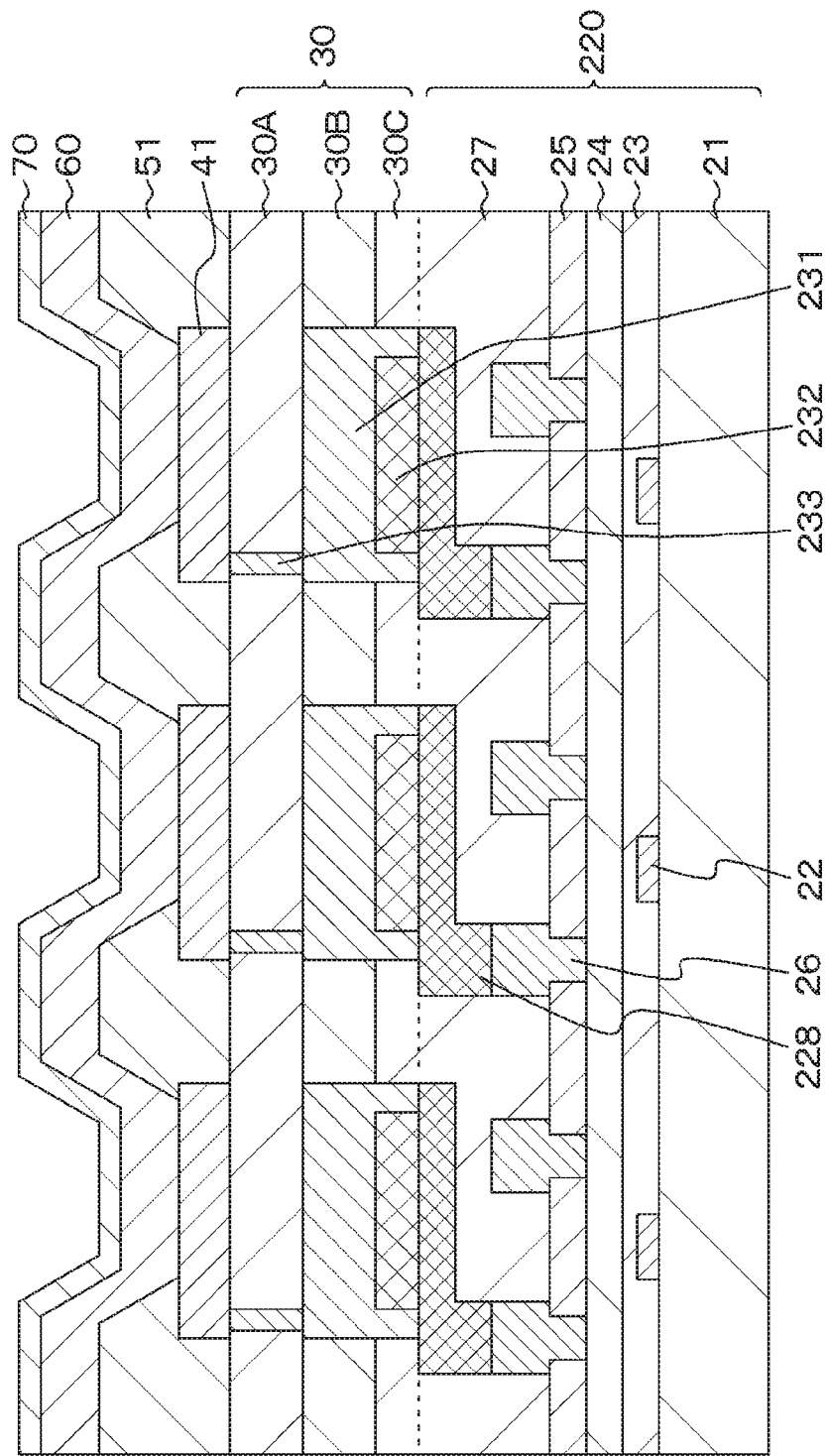
FIG. 24 is a schematic partial end view for explaining the method for manufacturing the display device according to the second embodiment, as continued from FIG. 23.

Step-290 (see FIG. 24)

Next, the second electrode 70 serving as a cathode electrode is formed on the entire surface of the organic layer 60. The second electrode 70 can be obtained by, for example, forming a film of a silver-magnesium alloy on the entire surface by a vapor deposition method. After that, the protection film 80 is formed on the entire surface, and then the counter substrate on which the color filter 90 is formed is stuck thereto, whereby the display device 2 illustrated in FIG. 13 can be obtained.

The distance between the light reflecting surface of the reflection film 231 and the second electrode 70 in the display device 2 is also defined by the thicknesses of the organic layer 60, the first electrode 41, and the first layer 30A of the interlayer insulation film 30. These film thicknesses can be controlled with high precision due to the process of forming the components. Therefore, since the positional relationship between the organic layer and the reflection film can be set with high precision, variations in color and the like can be suppressed.

In addition, the light reflecting surface of the reflection film 231 is formed by embedding a metal material in the interlayer insulation film 30. Therefore, the light reflecting surface is not exposed to the outside air. For this reason, a material that has a high reflectance but is prone to oxidization, such as silver or a silver alloy, can be used as a material for forming the reflection film 231 without trouble.

Furthermore, the filling member 232 in the reflection film 231 and the contact plug 228 are made by using the same material. Therefore, when the interlayer insulation film 30 and the circuit board 220 are joined together, the contact plug 228 and the reflection film 231 are electrically joined favorably.

Third Embodiment

The third embodiment is also a modification of the first embodiment In the third embodiment, the number of layers in the interlayer insulation film located between the reflection film and the first electrode differs depending on the display color of the pixel, which is a major difference.

FIG. 25 is a schematic partial cross-sectional view of a display device according to a third embodiment. Note that a schematic plan view of the display device according to the third embodiment is found in. FIG. 1 by replacing the display device 1 with the display device 3.

The display device 3 is different from the display device 1 in shape and configuration of an interlayer insulation film 330, a reflection film 331, and a conductive portion 333.

As in the first embodiment, the interlayer insulation film 330 includes different types of a plurality of insulation materials that are stacked to be in contact with each other. In the example illustrated in FIG. 25, the interlayer insulation film 330 is formed by stacking a first layer 330A, a second layer 330B, a third layer 330C, a fourth layer 330D, and a fifth layer 330E.

The interlayer insulation film 330 can be formed by using an inorganic insulation material or the like. The interlayer insulation film 330 may be formed to include at least two types of layers selected from, for example, a layer of silicon oxide, a layer of silicon nitride, and a layer of silicon oxynitride, or may be formed with two types of layers stacked alternately. The following description is provided on the assumption that the interlayer insulation film 330 includes a layer of silicon oxide and a layer of silicon nitride.

The reflection film 331, which is disposed below the first electrode 41, is formed to have a light reflecting surface disposed to be flush with a boundary plane on which different insulation materials are in contact with each other in the interlayer insulation film 330. In addition, the number of layers in the interlayer insulation film 330 located between the reflection film 331 and the first electrode 41 differs depending on the display color of the pixel 10.

Specifically, the light reflecting surface of the reflection film 331A used for the pixel 10 for blue display is formed to be flush with the boundary plane on which the first layer 330A and the second layer 330B are in contact with each other in the interlayer insulation film 330. Accordingly, the number of layers in the interlayer insulation film 330 located between the reflection film 331A and the first electrode 41 is one. The reflection film 331A is embedded in the opening provided in the interlayer insulation film 330 with the first layer 330A serving as a stopper film.

The light reflecting surface of the reflection film 331B used for the pixel 10 for green display is formed to be flush with the boundary plane on which the second layer 330B and the third layer 330C are in contact with each other in the interlayer insulation film 330. Accordingly, the number of layers in the interlayer insulation film located between the reflection film 331B and the first electrode 41 is two. The reflection film 331B is embedded in the opening provided in the interlayer insulation film 330 with the second layer 330B serving as a stopper film.

The light reflecting surface of the reflection film 331C used for the pixel 10 for red display is formed to be flush with the boundary plane on which the third layer 330C and the fourth layer 330D are in contact with each other in the interlayer insulation film 330. Accordingly, the number of layers in the interlayer insulation film located between the reflection film 331C and the first electrode 41 is three. The reflection film 331C is embedded in the opening provided in the interlayer insulation film 330 with the third layer 330C serving as a stopper film.

The film thickness of the interlayer insulation film 330 located between the reflection film 331 and the first electrode 41 is set to an optical distance in accordance with the display color of the pixel 10. The optical distance L is set so as to satisfy the following condition:

$$2L/\lambda + \Phi/2\pi = m \text{ (m is an integer)}$$

where the symbol $\Phi$ represents the phase shift of reflected light generated in the first electrode 41 and the reflection film 330, the symbol L represents the optical distance between the first electrode 41 and the reflection film 331, and the symbol $\lambda$ represents the peak wavelength of a spectrum of light taken from the pixel 10.

As described above, the reflection film 331 is embedded in the opening provided in the interlayer insulation film 330. The reflection film 331 includes a metal material. Note that the reference numeral 332 denotes a filling member that fills an opening in the reflection film 331 on the circuit board 20 side. From the viewpoint of bondability to the circuit board 20, the filling member 332 is formed by using the same material as the material of the planarization film 27.

The position of the light reflecting surface of the reflection film 331 is defined by the thickness of a layer included in the interlayer insulation film 330. The film thickness of a layer included in the interlayer insulation film 330 and the film thickness of the organic layer 60 can be controlled with high precision by a film forming process. As a result, the dimension between each of the light reflecting surfaces of the reflection films 331A, 331B, and 331C and the second electrode 70 (the portions indicated by arrows in FIG. 25) can be set with high precision.

The first electrode 41 is connected to the drive circuit that drives the pixel 10 via the conductive portion 333 connected to the contact plug 28.

The foregoing has described a detailed structure of the display device 3. The above-described display device 3 can be manufactured as follows.

FIGS. 26 to 35 are schematic partial end views for explaining the method for manufacturing the display device according to the third embodiment.

Step-300

First, the circuit board 20 on which a drive circuit is formed is prepared. The configuration of the circuit board 20 is similar to the configuration described in [Step-100] above, and thus the description thereof is omitted.

Subsequently, the interlayer insulation film 330 having the reflection film 331 formed therein is disposed on the circuit board 20 by the procedure illustrated in FIGS. 26 to 35.

Figure 26A:
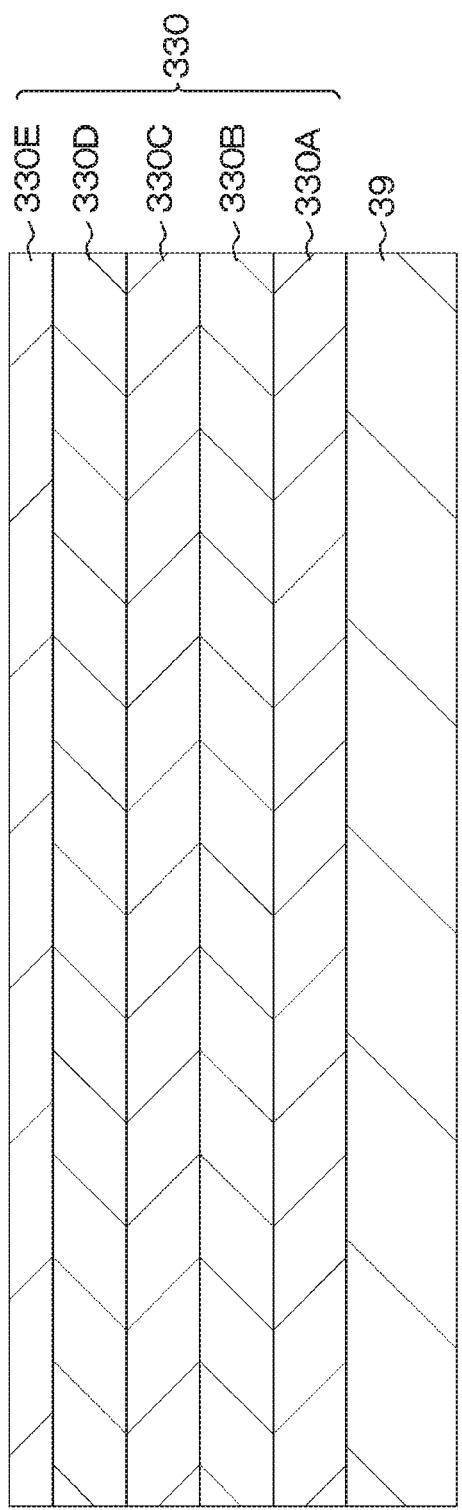
FIGS. 26A and 26B are schematic partial end views for explaining a method for manufacturing the display device according to the third embodiment.

Step-310 (see FIG. 26A)

Figure 26B:
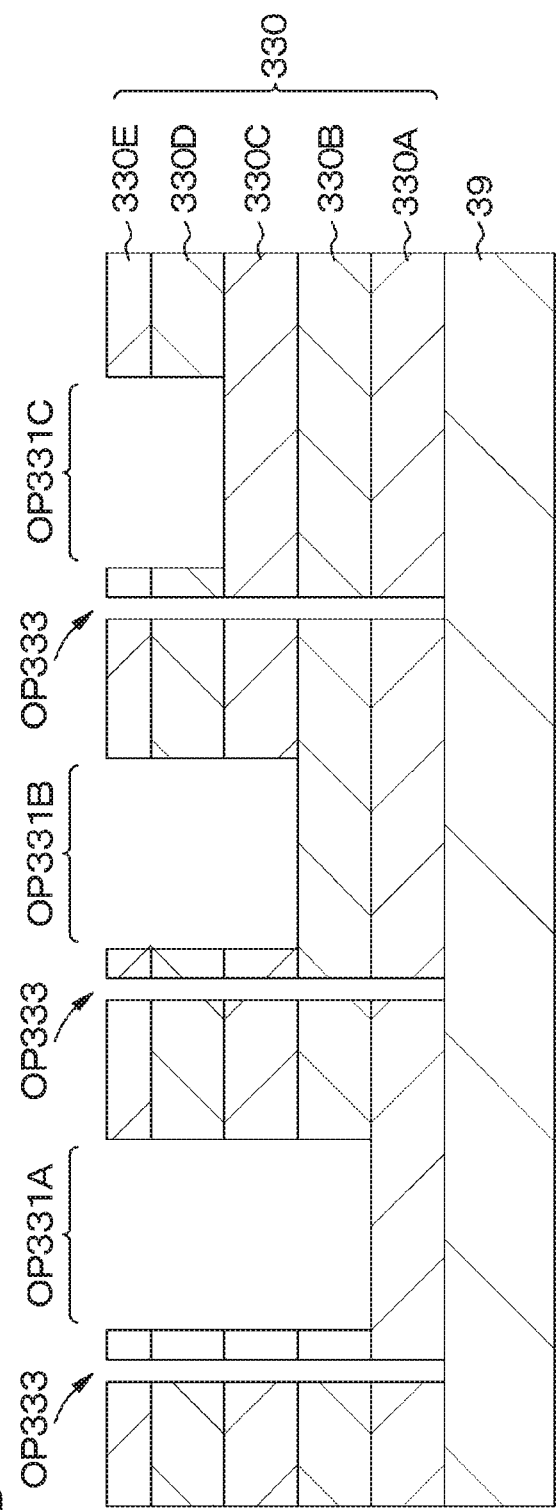

The substrate 39 of a silicon wafer is prepared, and the interlayer insulation film 330 is formed thereon by, for example, stacking two types of layers alternately, such as a layer of silicon oxide and a layer of silicon nitride (see FIG. 26B). In the example shown in the figure, the first layer 330A, the third layer 330C, and the fifth layer 330E are layers of silicon oxide, while the second layer 330B and the fourth layer 330D are layers of silicon nitride.

Step-320 (see FIG. 26B)

Then, in the interlayer insulation film 330, an opening OP331A is formed in a portion corresponding to the reflection film 331A such that the boundary plane between the first layer 330A and the second layer 330B is exposed to the bottom, an opening OP331B is formed in a portion corresponding to the reflection film 331B such that the boundary plane between the second layer 330B and the third layer 330C is exposed to the bottom, and an opening OP331C is formed in a portion corresponding to the reflection film 331C such that the boundary plane between the third layer 330C and the fourth layer 330D is exposed to the bottom.

The opening OP331A can be formed by performing dry etching under the condition that the first layer 330A acts as a stopper film, the opening OP331B can be formed by performing dry etching under the condition that the second layer 330B acts as a stopper film, and the opening OP331C can be formed by performing dry etching under the condition that the third layer 330C acts as a stopper film. Note that etching is only needed in a region in need of etching, and thus a portion not to be etched can be handled by, for example, forming a mask or the like on the portion as appropriate.

Furthermore, at the same time, an opening OP333 is formed in the interlayer insulation film 330 in a portion corresponding to the conductive portion 330 so as to penetrate through the interlayer insulation film 330. The opening OP333 can be formed by, for example, performing dry etching under the condition that the substrate 39 acts as a stopper.

Figure 27:
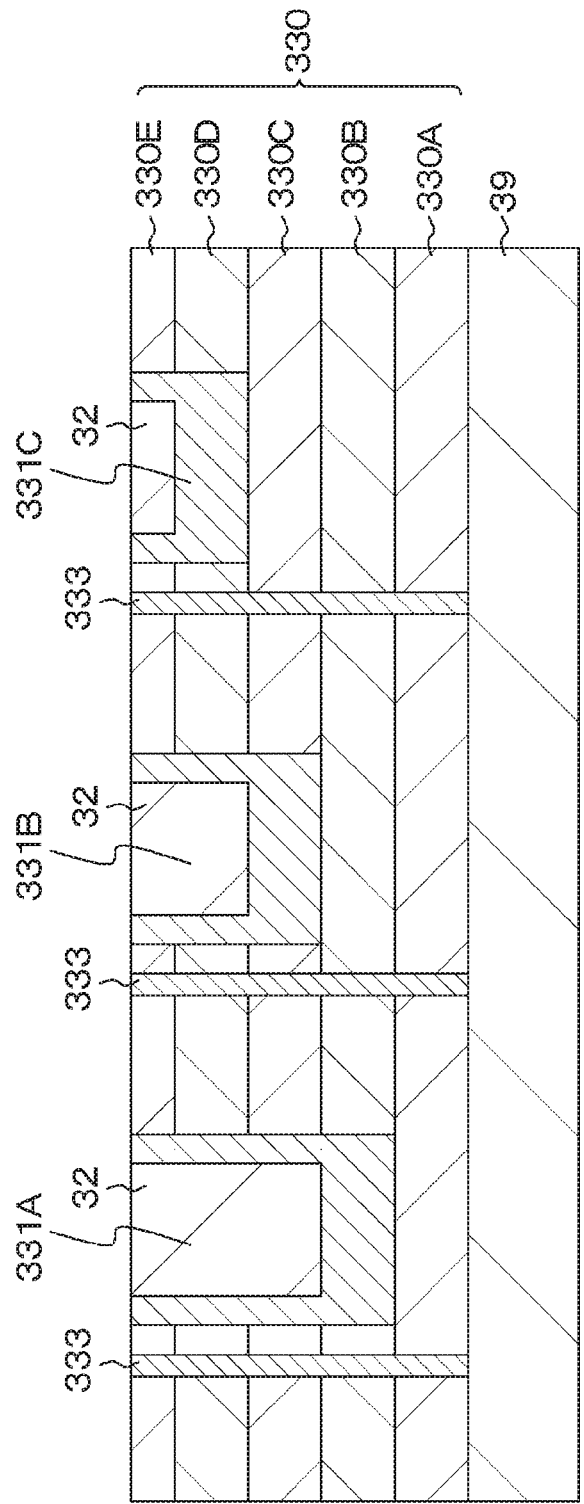
FIG. 27 is a schematic partial end view for explaining the method for manufacturing the display device according to the third embodiment, as continued from FIG. 26B.

Step-330 (see FIG. 27)

Then, the reflection film 331 and others are formed in the opening OP331, while the conductive portion 333 is formed in the opening OP333. For example, a silver thin film is formed on the entire surface including the opening by a sputtering method, and then the filling member 32 to fill the opening in the reflection film 331 is formed, followed by planarization carried out by using, for example, a CMP method.

Figure 28:
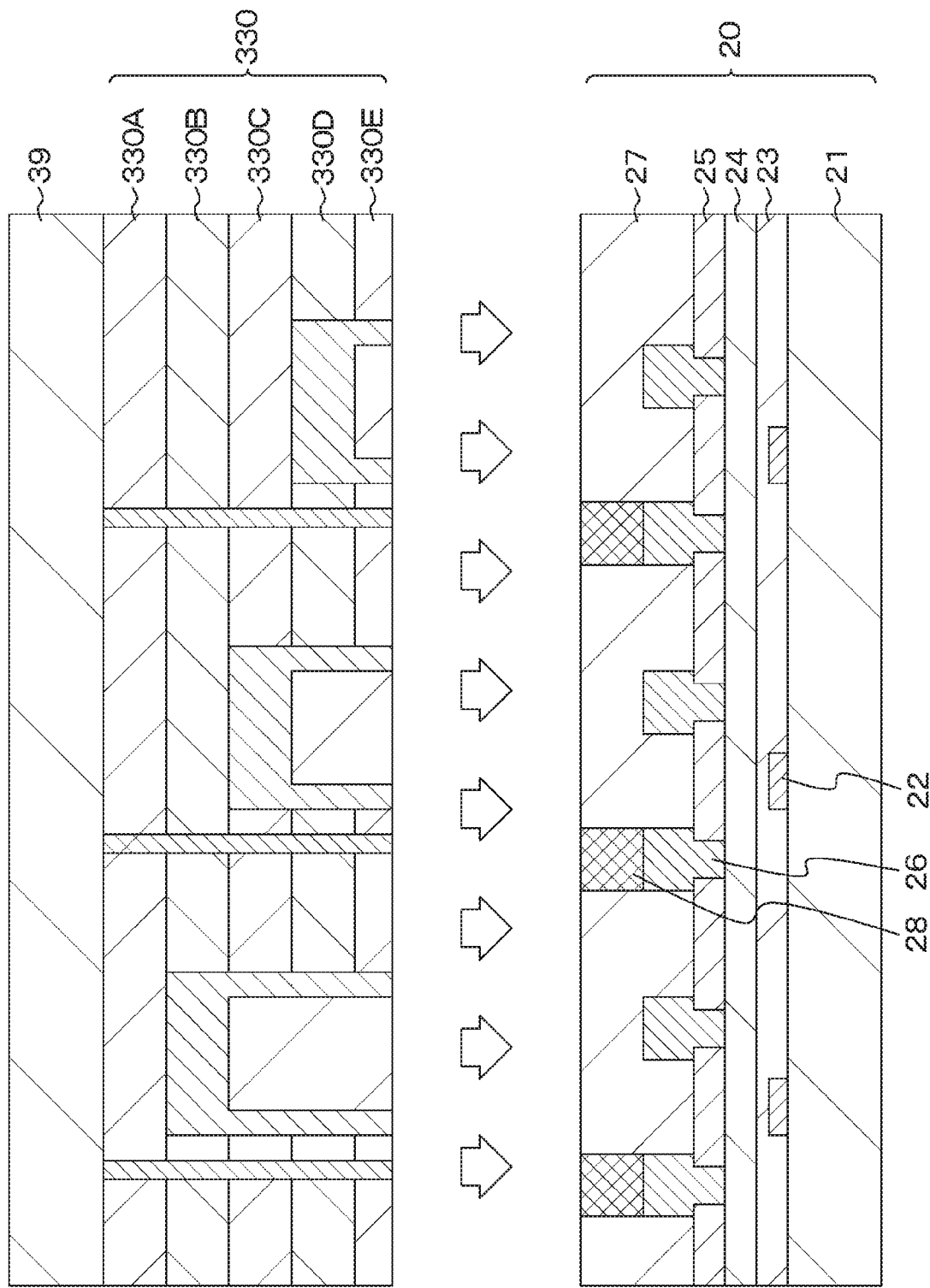
FIG. 28 is a schematic partial end view for explaining the method for manufacturing the display device according to the third embodiment, as continued from FIG. 27.
Figure 29:
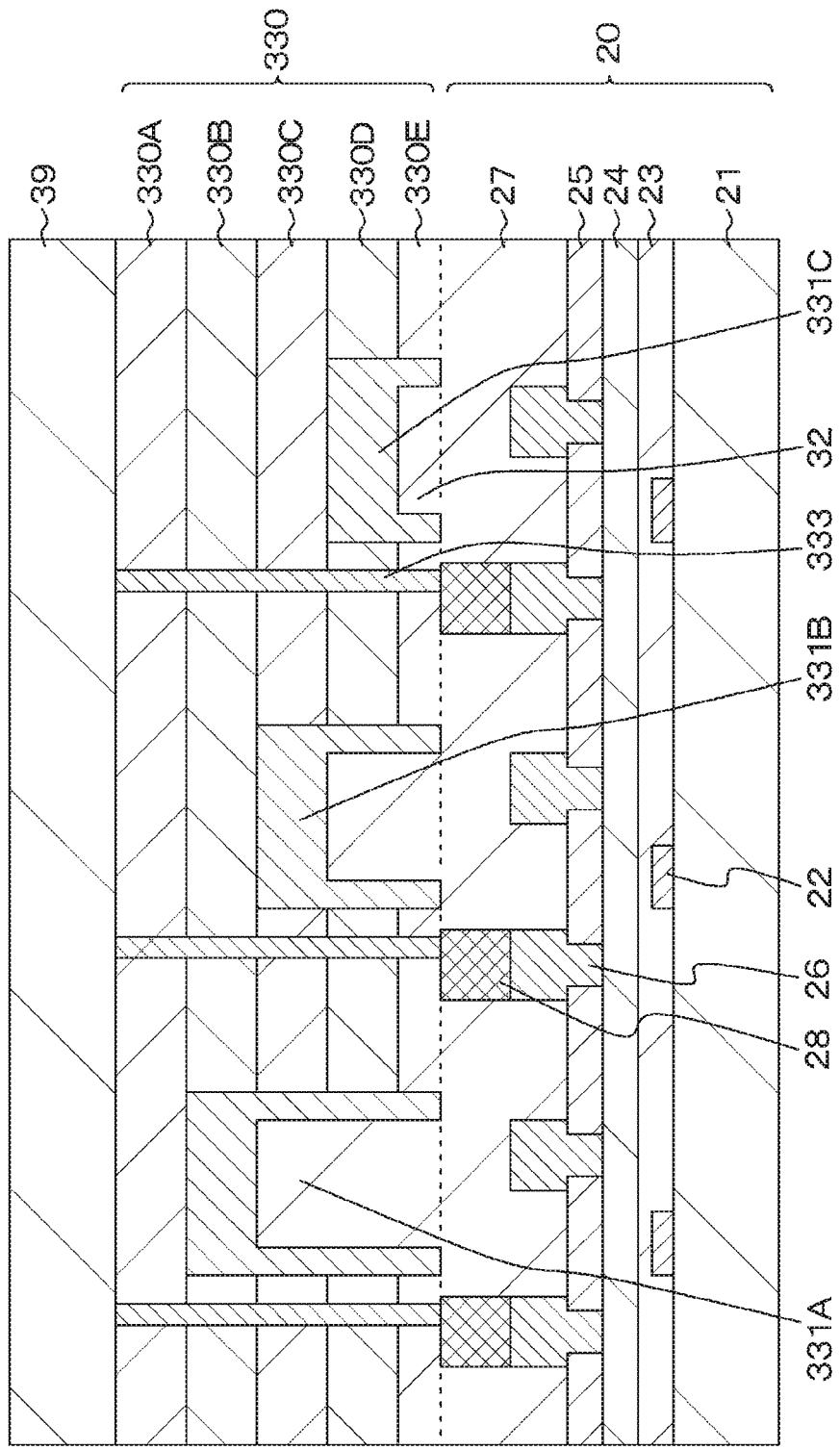
FIG. 29 is a schematic partial end view for explaining the method for manufacturing the display device according to the third embodiment, as continued from FIG. 28.
Figure 30:
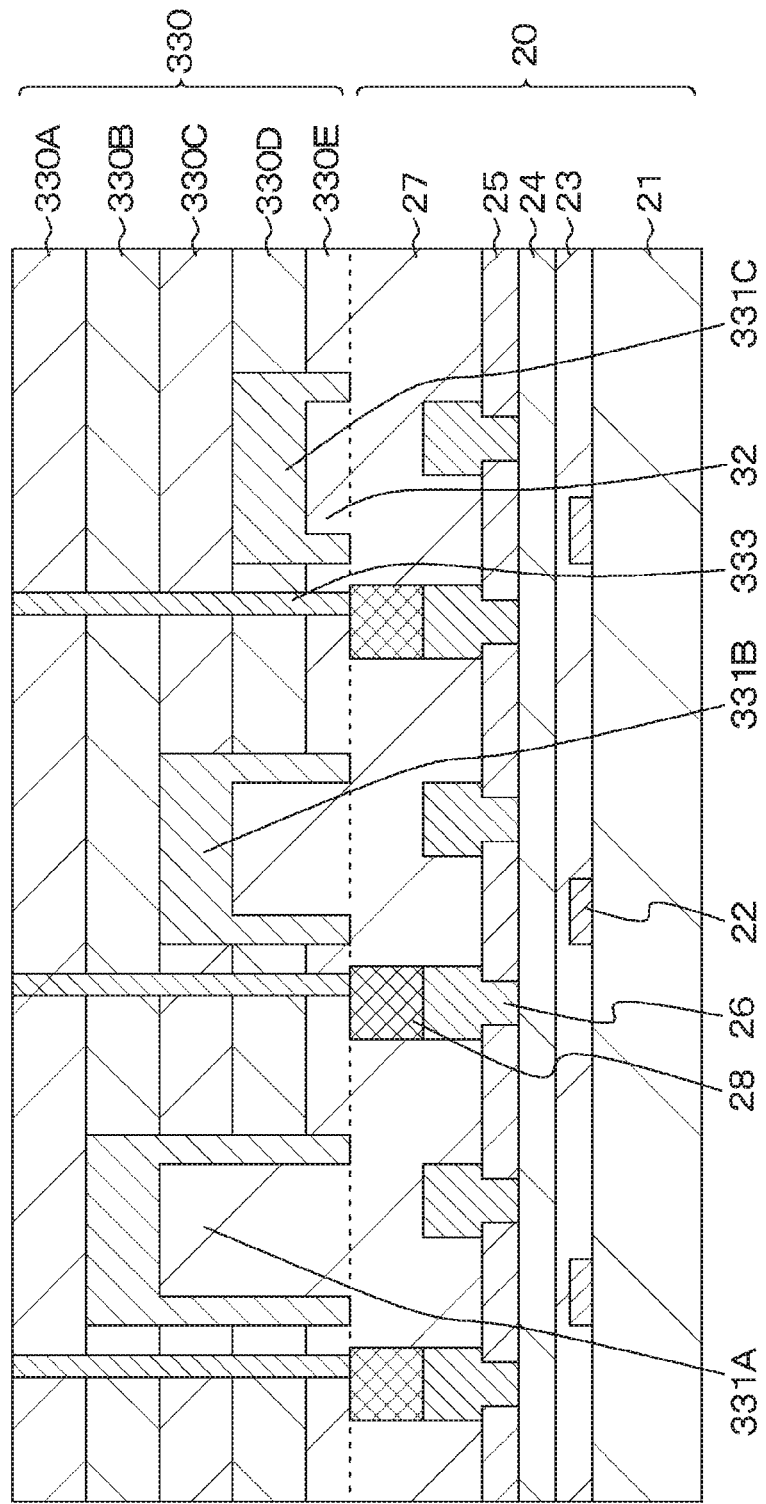
FIG. 30 is a schematic partial end view for explaining the method for manufacturing the display device according to the third embodiment, as continued from FIG. 29.

Step-340 (see FIGS. 28, 29, and 30)

Subsequently, with the interlayer in film. 330 and the circuit board 20 facing each other (see FIG. 28), the interlayer insulation film 330 and the circuit board 20 are joined together. The surfaces of the interlayer insulation film 330 and the circuit board 20 are activated, and then the surface-activated substances are brought into close contact with each other, whereby the interlayer insulation film 330 and the circuit board 20 can be joined together by an atomic force (see FIG. 29). Then, the substrate 39 is removed (see FIG. 30).

Next, the light emission unit ELP and others are formed on the interlayer insulation film 330 by the procedure illustrated in FIGS. 31 to 34.

Figure 31:
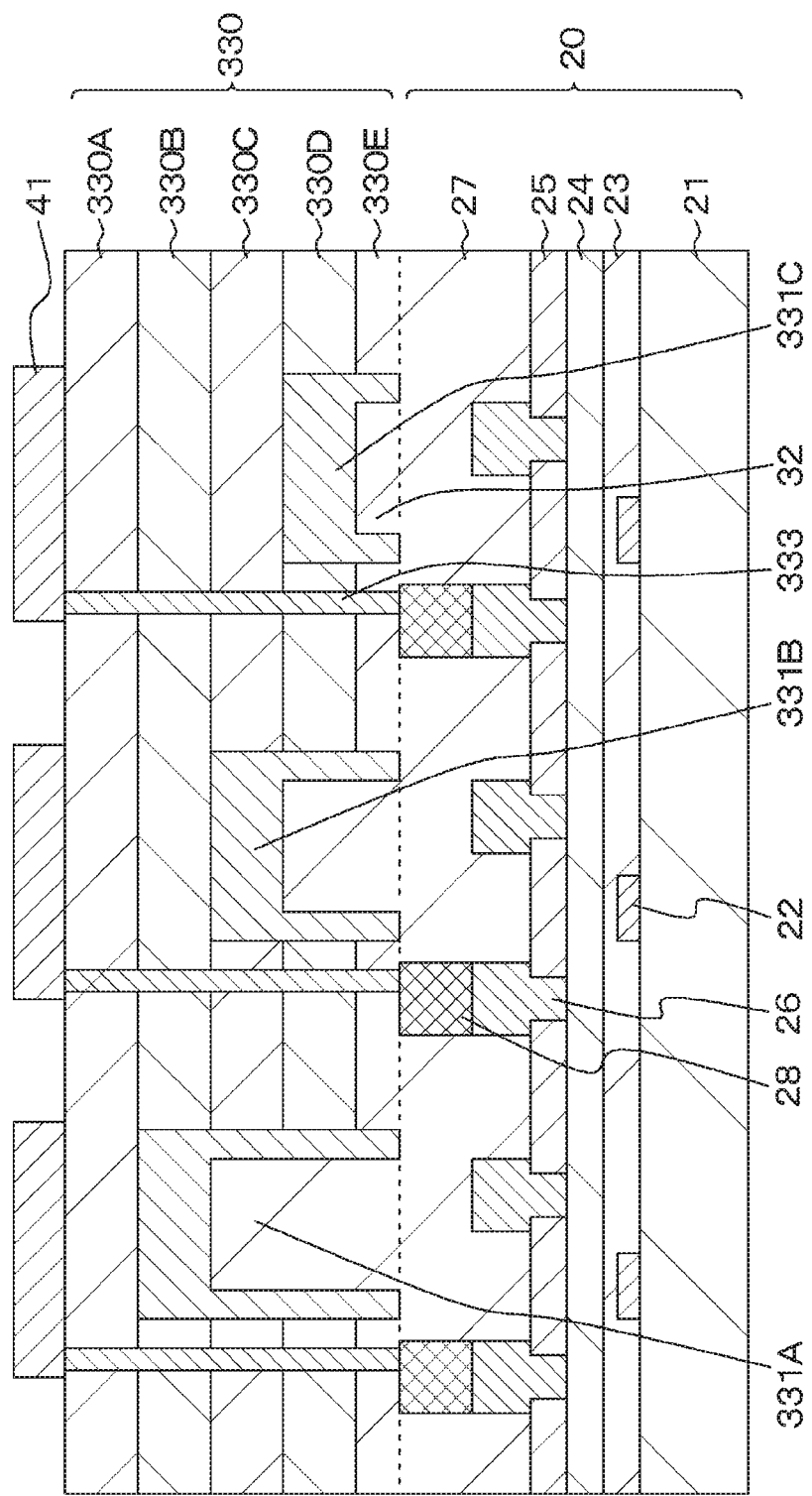
FIG. 31 is a schematic partial end view for explaining the method for manufacturing the display device according to the third embodiment, as continued from FIG. 30.

Step-350 (see FIG. 31)

First, the first electrode 41 is formed on the interlayer insulation film 330. The configuration of the first electrode 41 is similar to the configuration described in [Step-150] above, and thus the description thereof is omitted.

Figure 32:
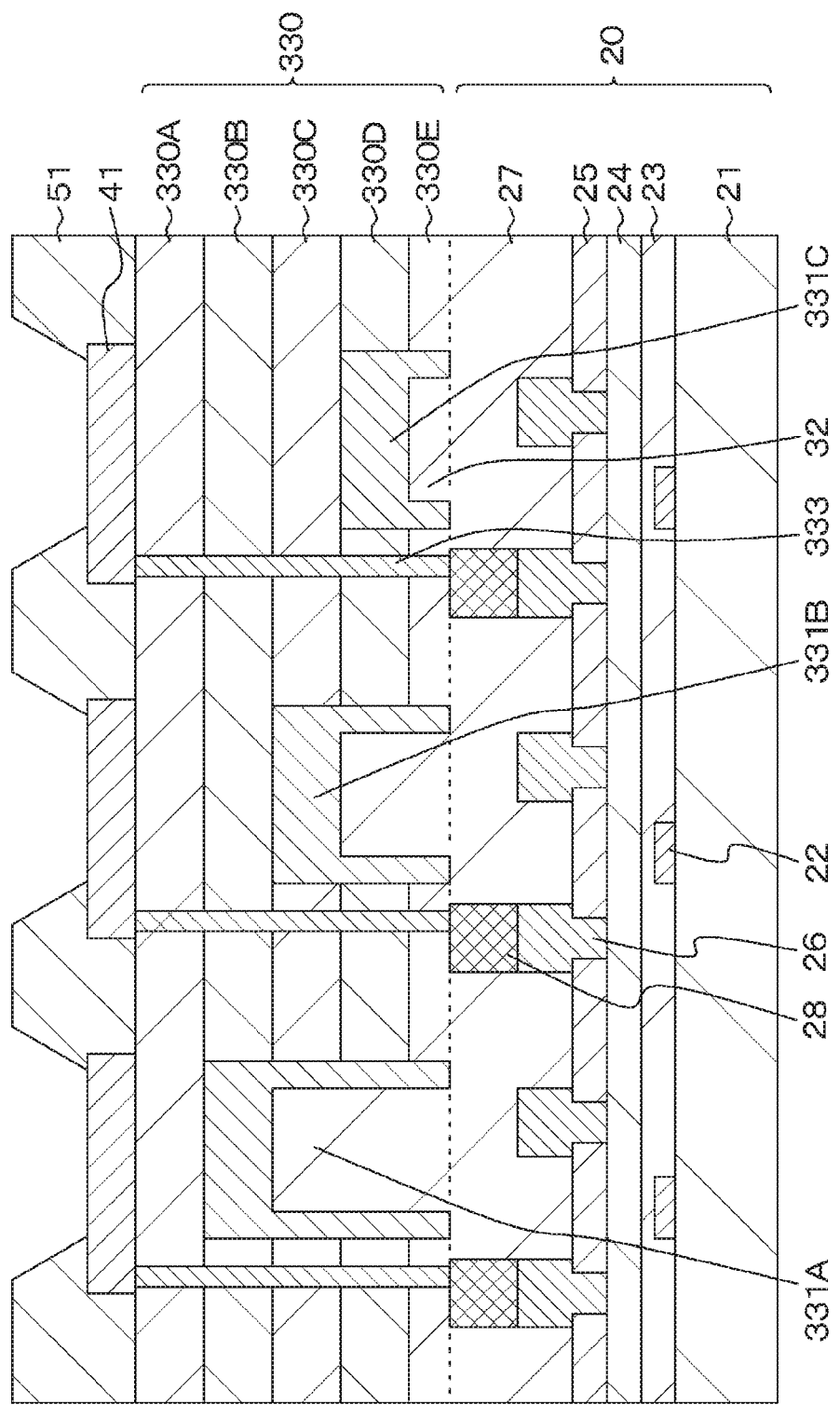
FIG. 32 is a schematic partial end view for explaining the method for manufacturing the display device according to the third embodiment, as continued from FIG. 31.

Step-360 (see FIG. 32)

Next, the partition 51 serving as an inlet-pixel insulation film is formed between the first electrode 41 and the first electrode 41. The configuration of the partition 51 is similar to the configuration described in [Step-160] above, and thus the description thereof is omitted.

Figure 33:
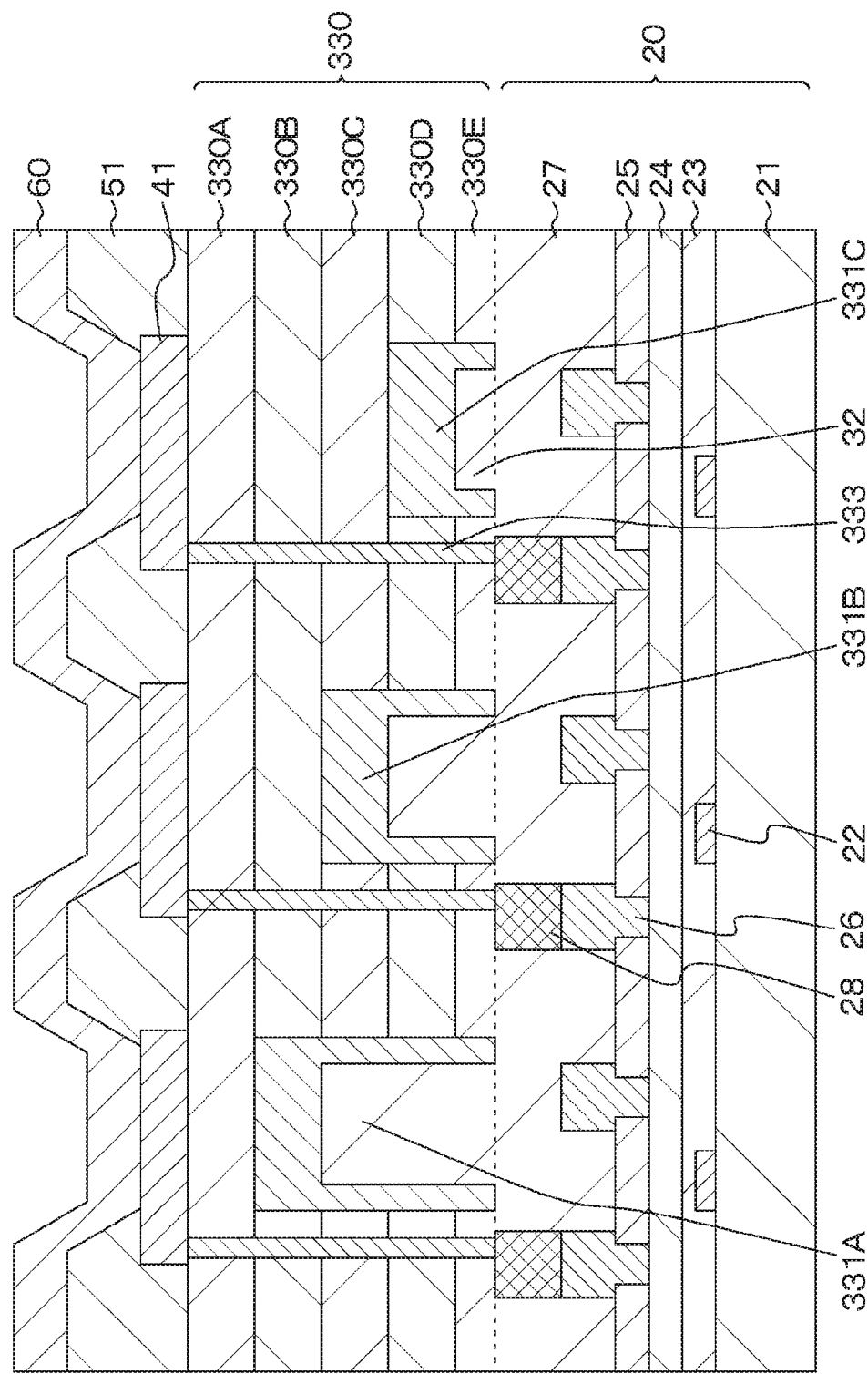
FIG. 33 is a schematic partial end view for explaining the method for manufacturing the display device according to the third embodiment, as continued from FIG. 32.

Step-370 (see FIG. 33)

Next, the organic layer 60 that emits white light is formed on the entire surface including the first electrode 41 serving as an anode electrode by, for example, sequentially forming a hole injection layer, a hole transport layer, a red light emission layer, a light emission separation layer, a blue light emission layer, a green light emission layer, and an electron transport layer.

Figure 34:
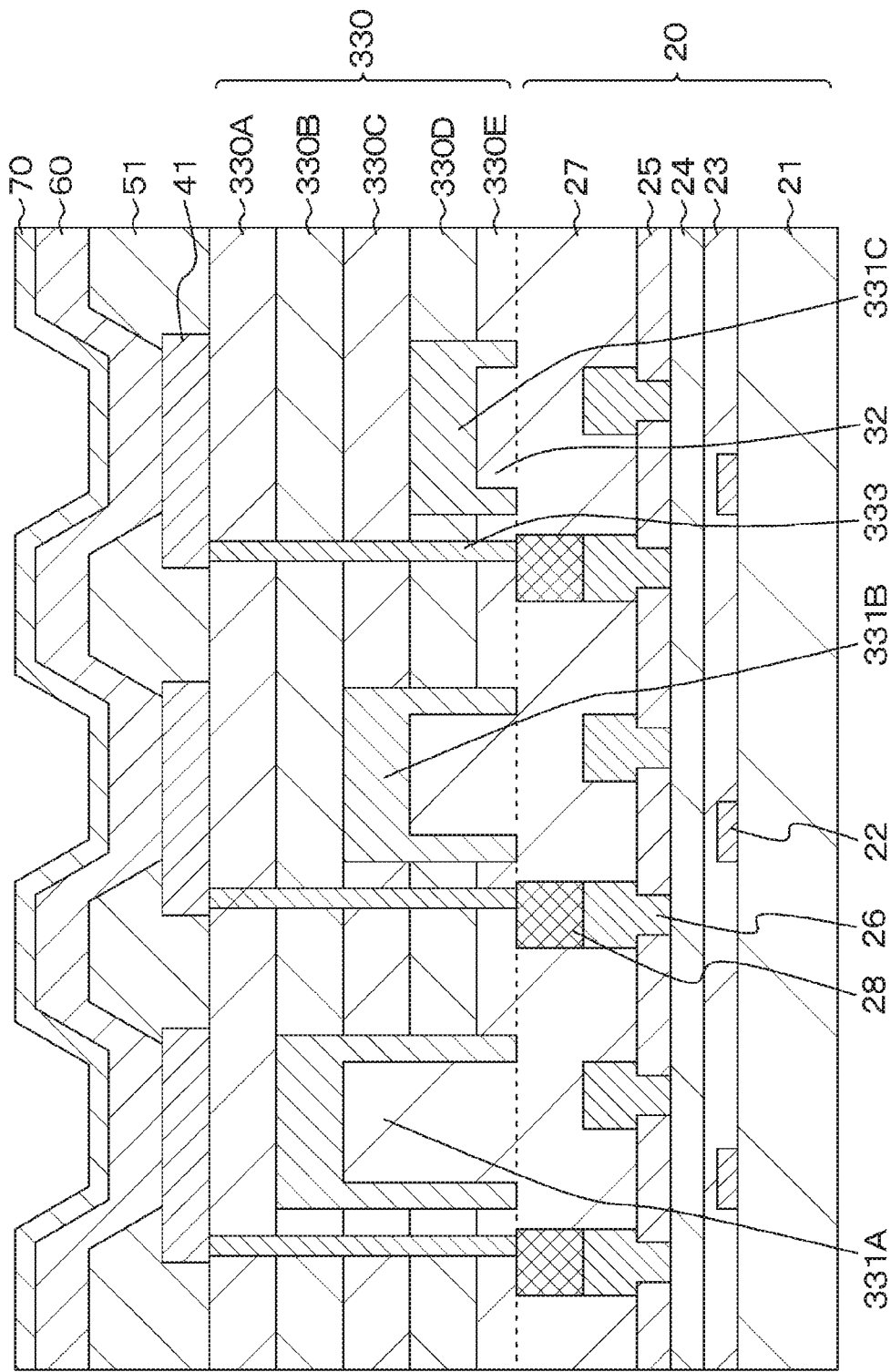
FIG. 34 is a schematic partial end view for explaining the method for manufacturing the display device according to the third embodiment, as continued from FIG. 33.
Figure 35:
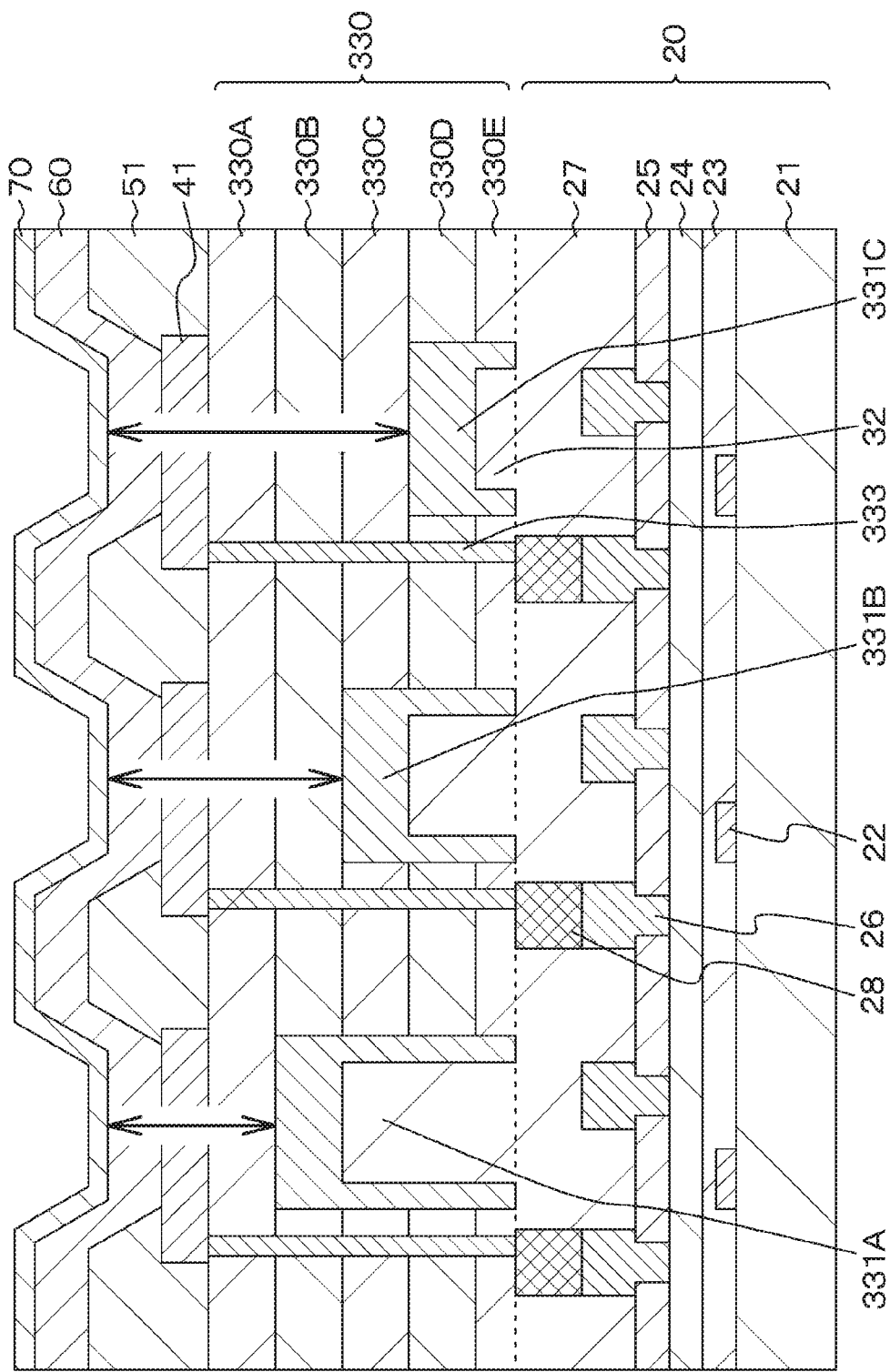
FIG. 35 is a schematic partial end view for explaining a resonator structure in the display device according to the third embodiment.

Step-380 (see FIGS. 34 and 35)

Next, the second electrode 70 serving as a cathode electrode is formed on the entire surface of the organic layer 60. The second electrode 70 can be obtained by, for example, forming a film of a silver-magnesium alloy on the entire surface by a vapor deposition method (see FIG. 34). After that, the protection film 80 is formed on the entire surface, and then the counter substrate on which the color filter 90 is formed is stuck thereto, whereby the display device 3 illustrated in FIG. 25 can be obtained.

A resonator structure is also formed in the display device 3 between the light reflecting surface of the reflection film 331 and the second electrode 70 (the portion indicated by an arrow in FIG. 35). The distance in this portion is defined by the thicknesses of the organic layer 60, the first electrode 41, and each layer included in the interlayer insulation film 330. These film thicknesses can be controlled with high precision due to the process of forming the components. Therefore, variations in luminous efficacy and emission color caused by variations in resonator structure can be suppressed.

In addition, the light reflecting surface of the reflection film 331 is formed by embedding a metal material in the interlayer insulation film 330. Therefore, the light reflecting surface is not exposed to the outside air. For this reason, a material that has a high reflectance but is prone to oxidization, such as silver or a silver alloy, can be used as a material for forming the reflection film 331 without trouble.

Furthermore, a pixel, with a longer distance between the reflection film 331 and the first electrode 41 has more layer cycles in the interlayer insulation film 330, and thus the pixel can reduce lateral escape of light. On the other hand, a pixel with a shorter distance between the reflection film 331 and the first electrode 41 is likely to provide higher efficiency because interfacial attenuation is suppressed. Therefore, for a color pixel having higher luminous efficacy, light loss due to lateral escape is reduced by increasing the number of stacked layers, and for a color pixel having lower luminous efficacy, color mixture is reduced by decreasing the number of stacked layers, thereby achieving optimum luminous efficacy of a plurality of light emission pixels as a whole.

In each of various display devices according to the present disclosure described above, the first electrode is formed on the interlayer insulation film, and the reflection film, which is formed below the first electrode, is formed to have a light reflecting surface disposed to be flush with a boundary plane on which different insulation materials are in contact with each other in the interlayer insulation film. Furthermore, the first electrode, the organic layer, and the second electrode are stacked. Therefore, the positional relationship between the organic layer and the reflection film can be set with high precision by appropriately setting the thickness of the interlayer insulation film.

Electronic Apparatus

The display device of the present disclosure described above can be used as a display unit (display device) of an electronic apparatus in any field for displaying video signals input to the electronic apparatus or video signals generated in the electronic apparatus as an image or video. For example, the display device can be used as a display unit in a television set, a digital still camera, a notebook personal computer, a mobile terminal device such as a mobile phone, a video camera, a head-mounted display (a display attached on one's head), and so on.

The display device of the present disclosure may even include a module-shaped device in a sealed configuration. An example may be a display module formed by attaching opposed units including transparent glass or the like to the pixel array unit. Note that the display module may be provided with a circuit unit, a flexible printed circuit (FPC), and the like for inputting and outputting signals and the like from the outside to the pixel array unit. As specific examples of an electronic apparatus employing the display device of the present disclosure, a digital still camera and a head-mounted display are shown below. Note that, however, the specific examples illustrated here are not restrictive but are merely examples.

Specific Example 1

Figure 36A:
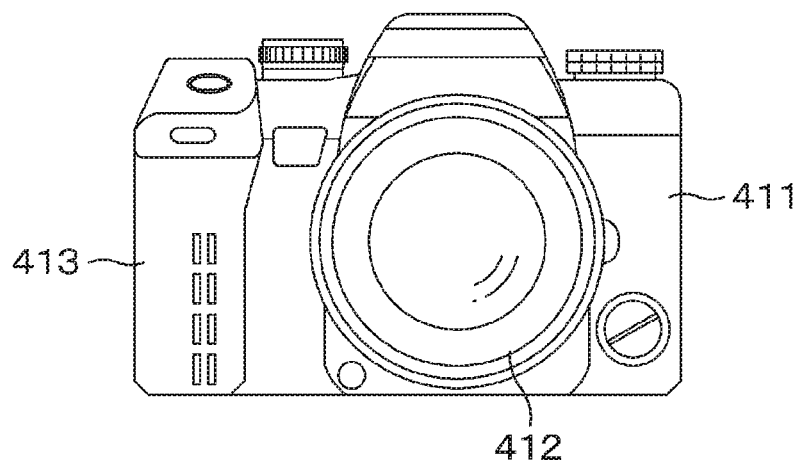
Figure 36B:
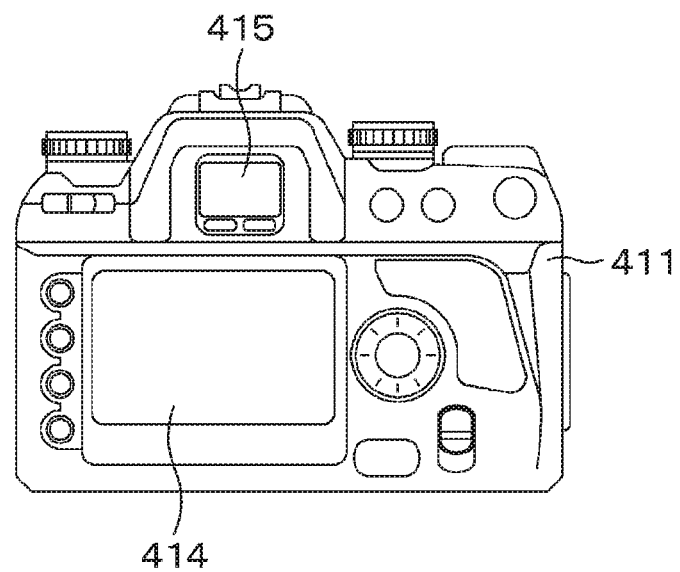

FIG. 36 is an external view of a lens-interchangeable single-lens reflex type digital still camera; FIG. 36A shows a front view thereof and FIG. 36B shows a rear view thereof. The lens-interchangeable single-lens reflex type digital still camera includes, for example, an interchangeable photographing lens unit (interchangeable lens) 412 on the front right side of a camera main body (camera body) 411 and a grip portion 413 to be gripped by a photographer on the front left side.

In addition, a monitor 414 is disposed substantially in the center of the rear surface of the camera main body 411. A viewfinder (eyepiece window) 415 is disposed above the monitor 414. By looking through the viewfinder 415, the photographer can visually recognize the optical image of the subject guided from the photographing lens unit 412 to determine the composition.

In the lens-interchangeable single-lens reflex type digital still camera as configured above, the display device of the present disclosure can be used as the viewfinder 415. That is, the lens-interchangeable single-lens reflex type digital still camera according to the present example is produced by using the display device of the present disclosure as the viewfinder 415.

Specific Example 2

Figure 37:
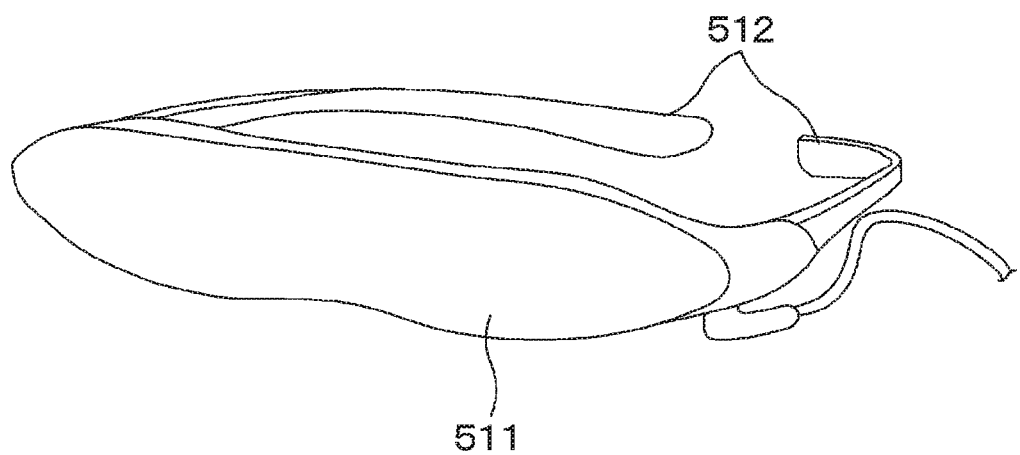
FIG. 37 is an external view of a head-mounted display.

FIG. 37 is an external view of a head-mounted display. The head-mounted display includes, for example, an ear hook portion 512 on both sides of an eyeglass-shaped display portion 511 so that the head-mounted display is attached on the user's head. In the head-mounted display, the display device of the present. disclosure can be used as the display portion 511. That is, the head-mounted display according to the present example is produced by using the display device of the present disclosure as the display portion 511.

Specific Example 3

Figure 38:
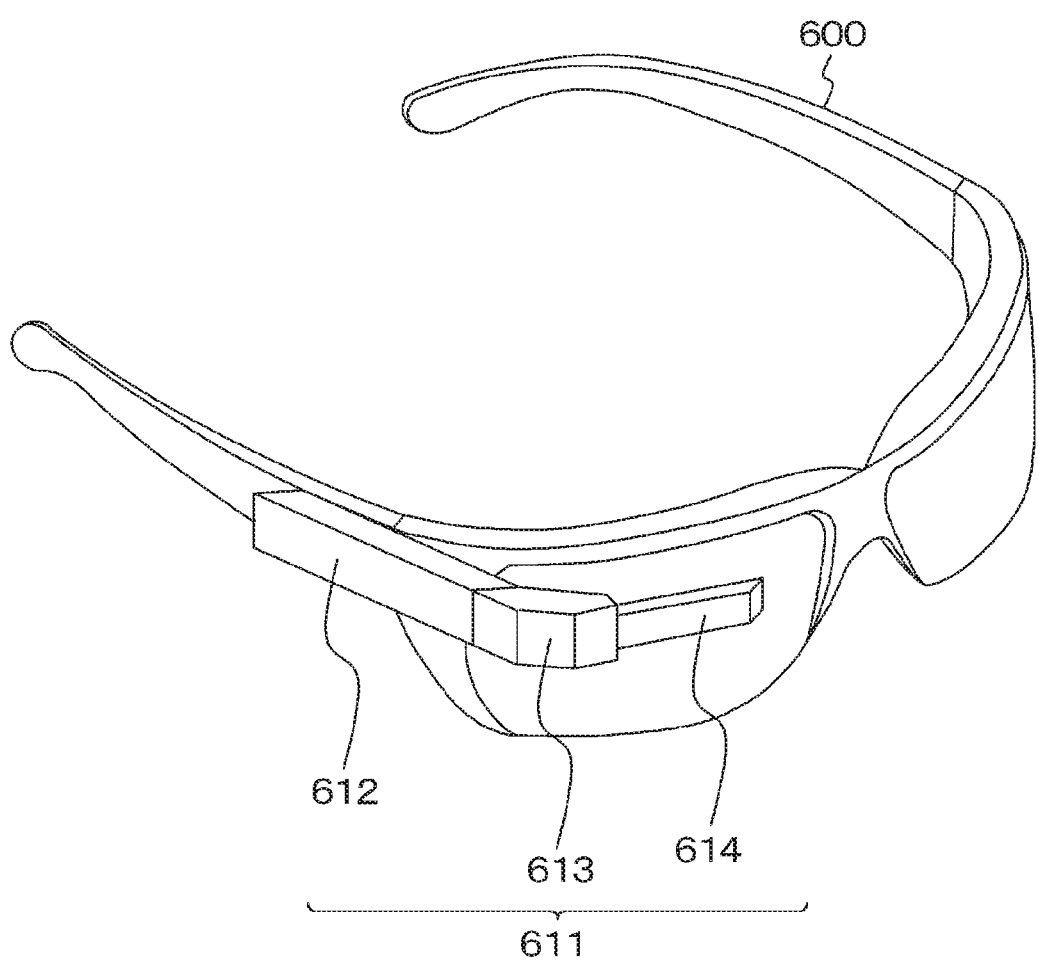
FIG. 38 is an external view of a see-through head-mounted display.

FIG. 38 is an external view of a see-through head-mounted display. The see-through head-mounted display 611 includes a main body 612, an arm 613, and a lens barrel 614.

The main body 612 is connected to the arm 613 and to eyeglasses 600. Specifically, an end of the main body 612 with respect to the long side direction is connected to the arm 613, and one of the side surfaces of the main body 612 is connected to the eyeglasses 600 via a connection member. Note that the main body 612 may be directly attached on the head of a human body.

The main body 612 contains a control board for controlling operations of the see-through head-mounted display 611 and also contains a display unit. The arm 613 connects the main body 612 and the lens barrel 614 and supports the lens barrel 614. Specifically, the arm 613 is coupled to an end of the main body 612 and to an end of the lens barrel 614 to fix the lens barrel 614. Furthermore, the arm 613 contains a signal line for exchanging data regarding an image provided by the main body 612 to the lens barrel 614.

The lens barrel 614 projects, through an eyepiece, the image light provided by the main body 612 via the arm 613 onto the eyes of the user wearing the see-through head-mounted display 611. In the see-through head-mounted display 611, the display device of the present disclosure can be used as the display unit in the main body 612.

Others

Note that the technology of the present disclosure may have the following configurations.

A1

A display device in which more than one pixel is arranged in a two-dimensional matrix on a circuit board, the pixel including a light emission unit including a first electrode, an organic layer, and a second electrode that are stacked, in which the first electrode is disposed for each light emission unit, and a partition is formed between the first electrode and an adjacent first electrode, the organic layer and the second electrode are stacked on an entire surface including the first electrode and the partition, the first electrode is formed on an interlayer insulation film, and a reflection film is formed below the first electrode, the reflection film including a light reflecting surface disposed to be flush with a boundary plane on which different insulation materials are in contact with each other in the interlayer insulation film.

A2

The display device according to [A1], in which
the interlayer insulation film includes different types of a plurality of insulation materials stacked to be in contact with each other.

A3

The display device according to [A2], in which
the interlayer insulation film includes at least two types of layers selected from a layer of silicon oxide, a layer of silicon nitride, and a layer of silicon oxynitride.

A4

The display device according to [A3], in which
the interlayer insulation film is formed with two types of layers stacked alternately.

A5

The display device according to any one of [A2] to [A4], in which
the number of layers in the interlayer insulation film located between the reflection film and the first electrode differs depending on a display color of the pixel.

A6

The display device according to any one of [A2] to [A5], in which
a film thickness of the interlayer insulation film located between the reflection film and the first. electrode is set to be an optical distance in accordance with a display color of the pixel.

A7

The display device according to [A6], in which
the optical distance satisfies a condition:

$$2L/\lambda + \Phi/2\pi = m \text{ (m is an integer)}$$

where symbol $\Phi$ represents a phase shift of reflected light generated in the first electrode and the reflection film, symbol I represents the optical distance between the first electrode and the reflection film, and symbol $\lambda$ represents a peak wavelength of a spectrum of light taken from the pixel.

A8

The display device according to any one of [A1] to [A7], in which
the reflection film is embedded in an opening provided in the interlayer insulation film.

A9

The display device according to any one of [A1] to [A8], in which
the reflection film includes a metal material.

A10

The display device according to [A9], in which.
the reflection film includes silver or a silver alloy.

A11

The display device according to [A9], in which
the reflection film includes an upper layer portion and a lower layer portion, the upper layer portion including silver or a silver alloy, and the lower layer portion including copper or a copper alloy.

A12

The display device according to any one of [A1] to [A11], in which
the circuit board includes a drive circuit intended for driving the pixel, and
the first electrode and the drive circuit are electrically connected.

A13

The display device according to [A12], in which
the first electrode and the drive circuit are electrically connected via the reflection film.

B1

A method for manufacturing a display device in which more than one pixel is arranged in a two-dimensional matrix on a circuit board, the pixel including a light emission unit including a first electrode, an organic layer, and a second electrode that are stacked, the method including steps of:
forming, on a substrate, an interlayer insulation film in which layers of different types of insulation materials are stacked to be in contact with each other;
forming as opening in a region of the interlayer insulation film, the region corresponding to the first electrode, in such a way that a plane flush with a boundary plane on which different insulation materials are in contact with each other in the interlayer insulation film is exposed to a bottom;
embedding a reflection film in the opening;
joining a surface of the embedded reflection film with the circuit board, and then removing the substrate; and
forming, on the interlayer insulation film, a light emission unit including the first electrode, the organic layer, and the second electrode that are stacked.

B2

The method for manufacturing the display device according to [B1], in which
the interlayer insulation film includes different types of a plurality of insulation materials stacked to be in contact with each other.

B3

The method for manufacturing the display device according to [B2], in which
the interlayer insulation film includes at least two types of layers selected from a layer of silicon oxide, a layer of silicon nitride, and a layer of silicon oxynitride.

B4

The method for manufacturing the display device according to [B3], in which
the interlayer insulation film is formed with two types of layers stacked alternately.

B5

The method for manufacturing the display device according to any one of [B2] to [B4], in which
the number of layers in the interlayer insulation film located between the reflection film and the first electrode differs depending on a display color of the pixel.

B6

The method for manufacturing the display device according to any one of [B2] to [B5], in which
a film thickness of the interlayer insulation film located between the reflection film and the first electrode is set to be an optical distance in accordance with a display color of the pixel.

B7

The method for manufacturing the display device according to [B6], in which
the optical distance L satisfies a condition:

$$2L/\lambda + \Phi/2\pi = m \text{ (m is an integer)}$$

where symbol $\Phi$ represents a phase shift of reflected light generated in the first electrode and the reflection film, symbol L represents the optical distance between the first electrode and the reflection film, and symbol $\lambda$ represents a peak wavelength of a spectrum of light taken from the pixel.

B8

The method for manufacturing the display device according to any one of [B1] to [B7], in which
the reflection film is embedded in an opening provided in the interlayer insulation film.

B9

The method for manufacturing the display device according to any one of [B1] to [B8], in which
the reflection film includes a metal material.

B10

The method for manufacturing the display device according to [B9], in which
the reflection film includes silver or a silver alloy.

B11

The method for manufacturing the display device according to [B9], in which
the reflection film includes an upper layer portion and a lower layer portion, the upper layer portion including silver or a silver alloy, ant the lower layer portion including copper or a copper alloy.

B12

The method for manufacturing the display device according to any one of [B1] to [B11], in which
the circuit board includes a drive circuit intended for driving the pixel, and
the first electrode and the drive circuit are electrically connected.

B13

The method for manufacturing the display device according to [B12], in which
the first electrode and the drive circuit are electrically connected via the reflection film.

C1

An electronic apparatus including a display device in which more than one pixel is arranged in a two-dimensional matrix on a circuit board, the pixel including a light emission unit including a first electrode, an organic layer, and a second electrode that are stacked, in which
in the display device,
the first electrode is disposed for each light emission unit, and a partition is formed between the first electrode and an adjacent first electrode,
the organic layer and the second electrode are stacked on an entire surface including the first electrode and the partition,
the first electrode is formed on an interlayer insulation film, and
a reflection film is formed below the first electrode, the reflection film including a light reflecting surface disposed to be flush with a boundary plane on which different insulation materials are in contact with each other in the interlayer insulation film.

C2

The electronic apparatus according to [C1], in which
the interlayer insulation film includes different types of a plurality of insulation materials stacked to be in contact with each other.

C3

The electronic apparatus according to [C2], in which
the interlayer insulation film includes at least two types of layers selected from a layer of silicon oxide, a layer of silicon nitride, and a layer of silicon oxynitride.

C4

The electronic apparatus according to [C3], in which
the interlayer insulation film is formed with two types of layers stacked alternately.

C5

The electronic apparatus according to any one of [C2] to [C4], in which
the number of layers in the interlayer insulation film located between the reflection film and the first electrode differs depending on a display color of the pixel.

C6

The electronic apparatus according to any one of [C2] to [C5], in which
a film thickness of the interlayer insulation film located between the reflection film and the first electrode is set to be an optical distance in accordance with a display color of the pixel.

C7

The electronic apparatus according to [C6], in which
the optical distance L satisfies a condition:

$$2L/\lambda + \Phi/2\pi = m \text{ (m is an integer)}$$

where symbol $\Phi$ represents a phase shift of reflected light generated in the first electrode and the reflection film, symbol L represents the optical distance between the first electrode and the reflection film, and symbol $\lambda$ represents a peak wavelength of a spectrum of light taken from the pixel.

C8

The electronic apparatus according to any one of [C1] to [C7], in which
the reflection film is embedded in an opening provided in the interlayer insulation film.

C9

The electronic apparatus according to any one of [C1] to [C8], in which
the reflection film includes a metal material.

C10

The electronic apparatus according to [C9], in which
the reflection film includes silver or a silver alloy.

C11

The electronic apparatus according to [C9], in which
the reflection film includes an upper layer portion and a lower layer portion, the upper layer portion including silver or a silver alloy, and the lower layer portion including copper or a copper alloy.

C12

The electronic apparatus according to any one of [C1] to [C11], in which
the circuit board includes a drive circuit intended for driving the pixel, and
the first electrode and the drive circuit are electrically connected.

C13

The electronic apparatus according to [C12], in which
the first electrode and the drive circuit are electrically connected via the reflection film.

REFERENCE SIGNS LIST 1, 2, 3 Display device
10 Pixel
11 Display region
20, 220 Circuit board
21 Base material
22 Gate electrode
23 Gate insulation film
24 Semiconductor material layer
25 Planarization film
26 Source/drain electrode
27 Planarization film
28, 228 Contact plug
30, 330 Interlayer insulation film
30A First layer
30B Second layer
30C Third layer
330A First layer
330B Second layer 330C Third layer
320D Fourth layer
330E Fifth layer
31, 331, 331A, 331B, 331C Reflection film
32, 232 Filling member
33, 333 Conductive portion
39 Substrate (silicon wafer)
41 First electrode
51 Partition
60 Organic layer
70 Second electrode
80 Protection film
90 Color filter
91 Light shielding region
92 Filter region
100 Power supply unit
101 Scanning unit
102 Data driver
411 Camera main body
412 Photographing lens unit
413 Grip portion
414 Monitor
415 Viewfinder
511 Eyeglass-shaped display portion
512 Ear hook portion
600 Eyeglasses (eyewear)
611 See-through head-mounted display
612 Main body
613 Arm
614 Lens barrel

The invention claimed is:

1. A display device comprising:
a plurality of pixels arranged in a two-dimensional matrix on a circuit board, one of the plurality of pixels including
a light emission unit including a first electrode, an organic layer, and a second electrode that are stacked in a stacking direction, wherein
the first electrode is disposed for the light emission unit, and a partition is formed between the first electrode and an adjacent first electrode,
the organic layer and the second electrode are stacked on an entire surface including the first electrode and the partition,
the first electrode is formed on an interlayer insulation film, and
a reflection film is formed below the first electrode, the reflection film comprising a light reflecting surface disposed to be flush with a boundary plane on which different insulation materials are in contact with each other in the interlayer insulation film; and
a color filter layer including only a plurality of light shielding portions and a plurality of filter portions, one of the plurality of filter portions is interposed between and directly adjacent to two of the plurality of light shielding portions,
wherein the one of the plurality of filter portions is over the one of the plurality of pixels in the stacking direction,
wherein the color filter layer has a top surface that faces away from the plurality of pixels in the stacking direction,
wherein one of the plurality of light shielding portions has a light shielding top surface,
wherein one of the plurality of filter portions has a filter top surface,
wherein a first portion of the top surface is formed by the light shielding top surface and a second portion of the top surface is formed by the filter top surface,
wherein the color filter layer alternates between the plurality of light shielding portions and the plurality of filter portions,
wherein the interlayer insulation film comprises three or more layers that are distinct and separate from each other, and
wherein the interlayer insulation film comprises different types of a plurality of insulation materials that are stacked and in contact with each other and the reflection film.

2. The display device according to claim 1, wherein the interlayer insulation film comprises at least two types of layers selected from a layer of silicon oxide, a layer of silicon nitride, and a layer of silicon oxynitride.

3. The display device according to claim 1, wherein a number of layers in the interlayer insulation film located between the reflection film and the first electrode differs depending on a display color of the one of the plurality of pixels.

4. The display device according to claim 1, wherein a film thickness of the interlayer insulation film located between the reflection film and the first electrode is set to be an optical distance L in accordance with a display color of the one of the plurality of pixels.

5. The display device according to claim 4, wherein the optical distance L satisfies a condition:

$$2L/\lambda + \Phi/2\pi = m \text{ (m is an integer)}$$

where symbol $\Phi$ represents a phase shift of reflected light generated in the first electrode and the reflection film, symbol L represents the optical distance between the first electrode and the reflection film, and symbol $\lambda$ represents a peak wavelength of a spectrum of light taken from the one of the plurality of pixels.

6. The display device according to claim 1, wherein the reflection film is embedded in an opening provided in the interlayer insulation film.

7. The display device according to claim 1, wherein the reflection film comprises a metal material.

8. The display device according to claim 7, wherein the reflection film comprises silver or a silver alloy.

9. The display device according to claim 7, wherein the reflection film comprises an upper layer portion and a lower layer portion, the upper layer portion including silver or a silver alloy, and the lower layer portion including copper or a copper alloy.

10. The display device according to claim 1, wherein the circuit board comprises a drive circuit intended for driving the one of the plurality of pixels, and the first electrode and the drive circuit are electrically connected.

11. The display device according to claim 10, wherein the first electrode and the drive circuit are electrically connected via the reflection film.

12. A display device comprising:
a plurality of pixels arranged in a two-dimensional matrix on a circuit board, one of the plurality of pixels including
a light emission unit including a first electrode, an organic layer, and a second electrode that are stacked in a stacking direction, wherein
the first electrode is disposed for the light emission unit, and a partition is formed between the first electrode and an adjacent first electrode, the organic layer and the second electrode are stacked on an entire surface including the first electrode and the partition, the first electrode is formed on an interlayer insulation film, and a reflection film is formed below the first electrode, the reflection film comprising a light reflecting surface disposed to be flush with a boundary plane on which different insulation materials are in contact with each other in the interlayer insulation film; and a color filter layer including only a plurality of light shielding portions and a plurality of filter portions, one of the plurality of filter portions is interposed between and directly adjacent to two of the plurality of light shielding portions, wherein the one of the plurality of filter portions is over the one of the plurality of pixels in the stacking direction, wherein the color filter layer has a top surface that faces away from the plurality of pixels in the stacking direction, wherein one of the plurality of light shielding portions has a light shielding top surface, wherein one of the plurality of filter portions has a filter top surface, wherein a first portion of the top surface is formed by the light shielding top surface and a second portion of the top surface is formed by the filter top surface, wherein the color filter layer alternates between the plurality of light shielding portions and the plurality of filter portions, the interlayer insulation film comprises three or more layers that are distinct and separate from each other wherein the three or more layers includes a first layer formed of a first material, a second layer formed of a second material, and a third layer formed of the first material, wherein the first layer is stacked on the second layer and the reflection film, and wherein the second layer is stacked on the third layer.

13. A method for manufacturing a display device in which a plurality of pixels is arranged in a two-dimensional matrix on a circuit board, the plurality of pixels including a pixel comprising a light emission unit including a first electrode, an organic layer, and a second electrode that are stacked, the method comprising steps of:

forming, on a substrate, an interlayer insulation film in which layers of different types of insulation materials that are stacked and in contact with each other in a stacking direction;

forming an opening in a region of the interlayer insulation film, the region corresponding to the first electrode, in such a way that a plane flush with a boundary plane on which different insulation materials are in contact with each other in the interlayer insulation film is exposed to a bottom;

embedding a reflection film in the opening;

joining a surface of the embedded reflection film with the circuit board, and then removing the substrate;

forming, on the interlayer insulation film, a light emission unit including the first electrode, the organic layer, and the second electrode that are stacked;

forming, on the light emission unit, a planarization film; and forming, on the planarization film, a color filter layer including only a plurality of light shielding portions and a plurality of filter portions, one of the plurality of filter portions is interposed between and directly adjacent to two of the plurality of light shielding portions, wherein the one of the plurality of filter portions is over the one of the plurality of pixels in the stacking direction, wherein the color filter layer has a top surface that faces away from the plurality of pixels in the stacking direction, wherein one of the plurality of light shielding portions has a light shielding top surface, wherein one of the plurality of filter portions has a filter top surface, and wherein a first portion of the top surface is formed by the light shielding top surface and a second portion of the top surface is formed by the filter top surface, wherein the color filter layer alternates between the plurality of light shielding portions and the plurality of filter portions, wherein the interlayer insulation film comprises three or more layers that are distinct and separate from each other, and wherein the interlayer insulation film comprises different types of a plurality of insulation materials that are stacked and in contact with each other and the reflection film.

14. An electronic apparatus comprising:

a display device including a plurality of pixels arranged in a two-dimensional matrix on a circuit board, one of the plurality of pixels including a light emission unit including a first electrode, an organic layer, and a second electrode that are stacked, wherein the first electrode is disposed for the light emission unit, and a partition is formed between the first electrode and an adjacent first electrode, the organic layer and the second electrode are stacked in a stacking direction on an entire surface including the first electrode and the partition, the first electrode is formed on an interlayer insulation film, and a reflection film is formed below the first electrode, the reflection film including a light reflecting surface disposed to be flush with a boundary plane on which different insulation materials are in contact with each other in the interlayer insulation film; and a color filter layer including only a plurality of light shielding portions and a plurality of filter portions, one of the plurality of filter portions is interposed between and directly adjacent to two of the plurality of light shielding portions, wherein the one of the plurality of filter portions is over the one of the plurality of pixels in the stacking direction, wherein the color filter layer has a top surface that faces away from the plurality of pixels in the stacking direction, wherein one of the plurality of light shielding portions has a light shielding top surface, wherein one of the plurality of filter portions has a filter top surface, and wherein a first portion of the top surface is formed by the light shielding top surface and a second portion of the top surface is formed by the filter top surface, wherein the color filter layer alternates between the plurality of light shielding portions and the plurality of filter portions, wherein the interlayer insulation film comprises three or more layers that are distinct and separate from each other, and wherein the interlayer insulation film comprises different types of a plurality of insulation materials that are stacked and in contact with each other and the reflection film.

15. The electronic apparatus according to claim 14, wherein
the interlayer insulation film comprises at least two types of layers selected from a layer of silicon oxide, a layer of silicon nitride, and a layer of silicon oxynitride.

16. The electronic apparatus according to claim 14, wherein
a number of layers in the interlayer insulation film located between the reflection film and the first electrode differs depending on a display color of the one of the plurality of pixels.

17. The electronic apparatus according to claim 14, wherein
a film thickness of the interlayer insulation film located between the reflection film and the first electrode is set to be an optical distance in accordance with a display color of the one of the plurality of pixels.

18. An electronic apparatus comprising:
a display device including
a plurality of pixels arranged in a two-dimensional matrix on a circuit board, one of the plurality of pixels including
a light emission unit including a first electrode, an organic layer, and a second electrode that are stacked, wherein
the first electrode is disposed for the light emission unit, and a partition is formed between the first electrode and an adjacent first electrode,
the organic layer and the second electrode are stacked in a stacking direction on an entire surface including the first electrode and the partition,
the first electrode is formed on an interlayer insulation film, and
a reflection film is formed below the first electrode, the reflection film including a light reflecting surface disposed to be flush with a boundary plane on which different insulation materials are in contact with each other in the interlayer insulation film; and
a color filter layer including only a plurality of light shielding portions and a plurality of filter portions, one of the plurality of filter portions is interposed between and directly adjacent to two of the plurality of light shielding portions,
wherein the one of the plurality of filter portions is over the one of the plurality of pixels in the stacking direction,
wherein the color filter layer has a top surface that faces away from the plurality of pixels in the stacking direction,
wherein one of the plurality of light shielding portions has a light shielding top surface,
wherein one of the plurality of filter portions has a filter top surface, and
wherein a first portion of the top surface is formed by the light shielding top surface and a second portion of the top surface is formed by the filter top surface,
wherein the color filter layer alternates between the plurality of light shielding portions and the plurality of filter portions,
wherein the interlayer insulation film comprises three or more layers that are distinct and separate from each other
wherein the three or more layers include a first layer formed of a first material, a second layer formed of a second material, and a third layer formed of the first material,
wherein the first layer is stacked on the second layer and the reflection film, and
wherein the second layer is stacked on the third layer.

* * * * *